United States Patent [19]
Williams et al.

[11] Patent Number: 5,618,743
[45] Date of Patent: Apr. 8, 1997

[54] MOS TRANSISTOR HAVING ADJUSTED THRESHOLD VOLTAGE FORMED ALONG WITH OTHER TRANSISTORS

[75] Inventors: Richard K. Williams, Cupertino; Hamza Yilmaz, Saratoga; Michael E. Cornell, Campbell; Jun W. Chen, Saratoga, all of Calif.

[73] Assignee: Siliconix incorporated, Santa Clara, Calif.

[21] Appl. No.: 463,417

[22] Filed: Jun. 5, 1995

Related U.S. Application Data

[60] Division of Ser. No. 323,950, Oct. 17, 1994, Pat. No. 5,559,044, which is a continuation-in-part of Ser. No. 226,419, Apr. 11, 1994, Pat. No. 5,426,328, which is a continuation of Ser. No. 948,276, Sep. 21, 1992, abandoned.

[51] Int. Cl.$^6$ .................................................. H01L 21/265
[52] U.S. Cl. ........................ 438/276; 438/209; 438/203; 438/217
[58] Field of Search ............................ 437/45, 34, 46, 437/48, 58, 59

[56] References Cited

U.S. PATENT DOCUMENTS

| | | | |
|---|---|---|---|
| 4,119,440 | 10/1978 | Hile | 148/DIG. 10 |
| 4,356,042 | 10/1982 | Gedaly et al. | 437/45 |
| 4,403,395 | 9/1993 | Curran | 29/571 |
| 4,481,706 | 11/1984 | Roche | 437/33 |
| 4,590,664 | 5/1986 | Prentice et al. | 437/54 |
| 4,601,760 | 7/1986 | Hemmah et al. | 437/54 |
| 4,628,341 | 12/1986 | Thomas | 148/DIG. 85 |
| 4,649,629 | 3/1987 | Miller et al. | 437/45 |
| 4,795,716 | 1/1989 | Yilmaz et al. | 437/56 |
| 4,826,780 | 5/1989 | Takemoto et al. | 437/59 |
| 4,845,047 | 7/1989 | Holloway et al. | 437/45 |
| 4,855,244 | 8/1989 | Hutter et al. | 437/31 |
| 4,887,142 | 12/1989 | Bertotti et al. | 257/338 |
| 4,889,820 | 12/1989 | Mori | 437/29 |
| 5,081,052 | 1/1992 | Kobayashi et al. | 437/45 |
| 5,091,328 | 2/1992 | Miller | 437/52 |
| 5,091,760 | 2/1992 | Maeda et al. | 257/370 |
| 5,156,989 | 10/1992 | Williams et al. | 437/57 |
| 5,171,699 | 12/1992 | Hutter et al. | 437/41 |
| 5,179,432 | 1/1993 | Husher | 257/593 |
| 5,243,214 | 9/1993 | Sin et al. | 257/372 |
| 5,248,627 | 9/1993 | Williams | 437/45 |
| 5,260,228 | 11/1993 | Taguchi | 437/59 |
| 5,262,345 | 11/1993 | Nasser | 437/59 |
| 5,270,237 | 12/1993 | Sang et al. | 437/45 |

FOREIGN PATENT DOCUMENTS

| | | | |
|---|---|---|---|
| 2-30187 | 1/1990 | Japan | 257/335 |
| 3-203377 | 9/1991 | Japan | 257/337 |

OTHER PUBLICATIONS

T. Kikkawa et al., "A New Complementary Transistor Structure For Analog Integrated Circuits", IEEE 1980, CH1616-2/80-0000-065, pp. 65-68.

O. Schade, Jr., et al., "CMOS IIE: A Deep Drain-Extension Implant Technology for Analog/Digital ICs", RCA Review, vol. 47, Sep. 1986, pp. 398-428.

(List continued on next page.)

*Primary Examiner*—Tuan H. Nguyen
*Attorney, Agent, or Firm*—Skjerven, Morrill, MacPherson, Franklin & Friel; Brian D. Ogonowsky

[57] ABSTRACT

A process is disclosed (hereafter referred to as the "BiCD-MOS Process") which simultaneously forms bipolar transistors, relatively high voltage CMOS transistors, relatively low voltage CMOS transistors, DMOS transistors, zener diodes, and thin-film resistors, or any desired combination of these, all on the same integrated circuit chip. The process uses a small number of masking steps, forms high performance transistor structures, and results in a high yield of functioning die. Isolation structures, bipolar transistor structures, CMOS transistor structures, DMOS transistor structures, zener diode structures, and thin-film resistor structures are also disclosed.

2 Claims, 50 Drawing Sheets

OTHER PUBLICATIONS

M. Nanba et al., "An Analytical and Experimental Investigation of the Cutoff Frequency $f_T$ of High–Speed Bipolar Transistors", IEEE Transactions on Electron Devices, vol. 35, No. 7, Jul. 1988, pp. 1021–1028.

K. Nakazato et al., "A 3GHz Lateral PNP Transistor", IEDM Conference Proceedings, 1986, pp. 416–419.

T. Ikeda et al., "Advanced BiCMOS Technology for High Speed VLSI", IEDM Conference Proceedings, 1986, pp. 408–411.

T. Matsushita et al., "Intelligent Power Device Having Large Immunity From Transients In Automotive Applications", Proceedings of 1990 International Symposium on Power Semiconductor Devices & ICs, pp. 79–80.

J. Sanchez et al., "Drain–Engineered Hot–Electron–Resistant Device Structures: A Review", IEEE Transactions on Electron Devices, vol. 36, No. 6, Jun. 1989, pp. 1125–1132.

H. Iwai et al., "0.8 μm Bi–CMOS Technology With High $f_T$ Ion–Implanted Emitter Bipolar Transistor", IEDM Conference Proceedings, 1987, pp. 28–31.

I. Evans et al., "Optimization of Polysilicon Emitters for BiCMOS Transistor Design", IEEE Transactions on Electron Devices, vol. 37, No. 11, Nov. 1990, pp. 2343–2348.

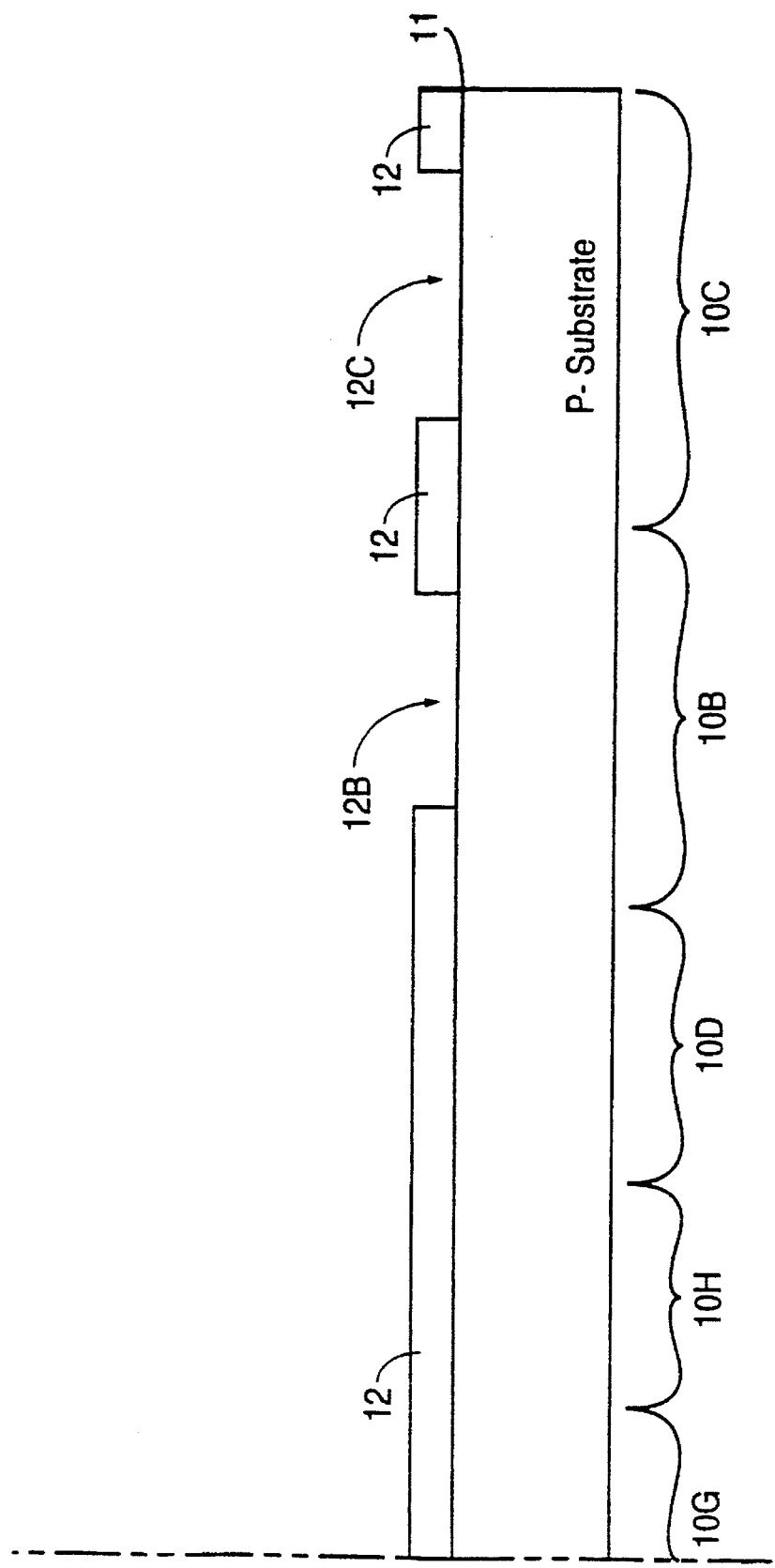

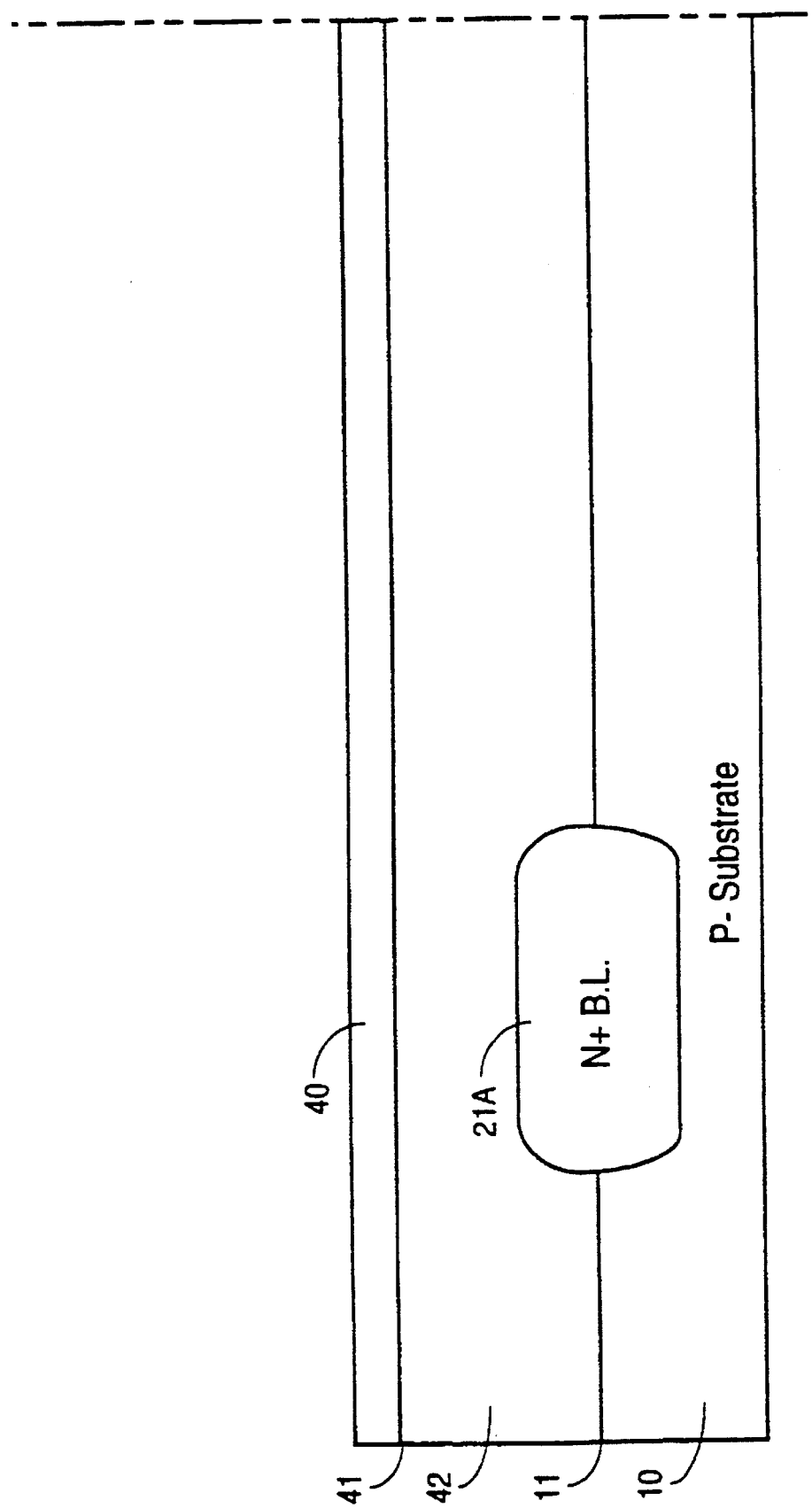

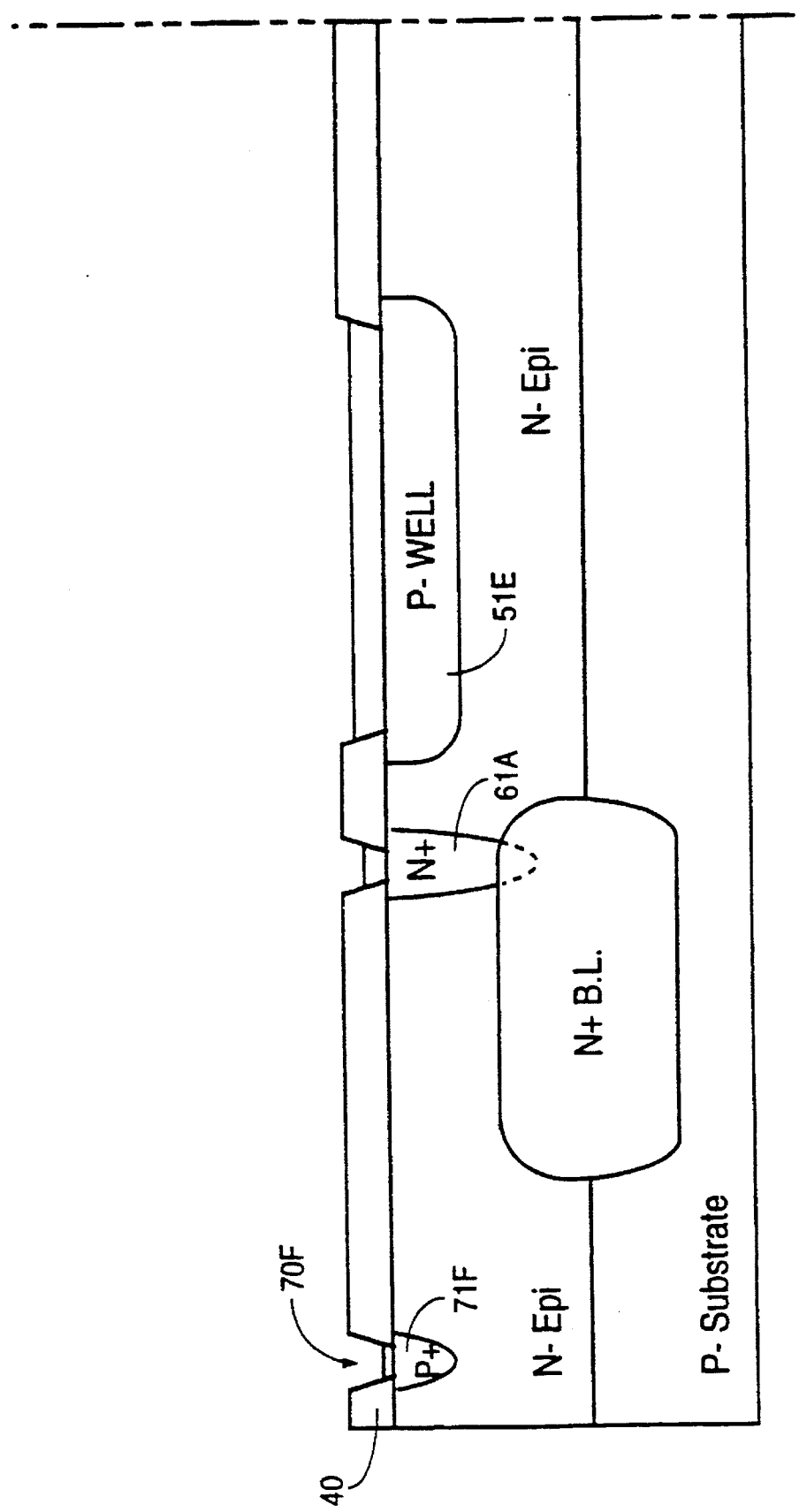

MOS TRANSISTOR HAVING ADJUSTED THRESHOLD VOLTAGE FORMED ALONG WITH OTHER TRANSISTORS

CROSS-REFERENCE TO RELATED APPLICATIONS

This application is a division of application Ser. No. 08/323,950, filed Oct. 17, 1994, now U.S. Pat. No. 5,559,044, which is a CIP of application Ser. No. 08/226,419, filed Apr. 11, 1994, now U.S. Pat. No. 5,426,328, which is a continuation of application Ser. No. 07/948,276, filed Sep. 21, 1992, now abandoned.

FIELD OF THE INVENTION

This invention relates to a process which can be used to produce complementary bipolar transistors, CMOS (complementary metal oxide silicon) transistors, DMOS (doubly diffused metal oxide silicon) power transistors, buried zener diodes, and associated structures simultaneously on a single wafer. More particularly, this invention relates to transistor structures and associated isolation structures which may be made using the process.

BACKGROUND INFORMATION

In numerous industries, including the telecommunications industry, the automotive industry, and the computer industry, applications exist which require high power digital switching, analog amplification, and digital logic circuitry. In many such applications, placing all the required circuitry onto a single integrated circuit chip would result in improved performance and miniaturization if an adequately reliable and adequately inexpensive single chip could be produced.

In the disk drive industry today, for example, disk drive controllers are often realized in multiple chip implementations. Problems associated with integrating the power transistors and the digital logic transistors of the disk drive controller result in the DMOS power circuitry being placed on one chip whereas the CMOS digital logic circuitry is placed on another chip. Similarly, the analog amplification circuitry of the disk drive controller may be placed on yet a third chip due to the difficulty of producing a single circuit die which incorporates both high quality bipolar analog amplifiers and also high performance CMOS digital logic and/or DMOS power transistors. Accordingly, a process is sought which allows DMOS power circuitry, CMOS digital logic circuitry, and complementary bipolar analog circuitry all to be realized on a single integrated circuit chip.

SUMMARY OF THE INVENTION

A process is disclosed (hereafter referred to as the "BiCDMOS Process") which simultaneously forms bipolar transistors, relatively high voltage CMOS transistors, relatively low voltage CMOS transistors, DMOS transistors, zener diodes, and thin-film resistors, or any desired combination of these, all on the same integrated circuit chip. The process uses a small number of masking steps, forms high performance transistor structures, and results in a high yield of functioning die. Isolation structures, bipolar transistor structures, CMOS transistor structures, DMOS transistor structures, zener diode structures, and thin-film resistor structures are also disclosed.

BRIEF DESCRIPTION OF THE DRAWINGS

FIGS. 1A–16A and 1B–16B are cross-sectional views of a section of a wafer processed according to an embodiment of the BiCDMOS process in accordance with the present invention. FIGS. 1A and 1B comprise a cross-sectional view of the wafer at a first illustrative stage in the process, FIGS. 2A and 2B comprise a cross-sectional view of the wafer at a second illustrative stage in the process, FIGS. 3A and 3B comprise a cross-sectional view of the wafer at a third illustrative stage in the process, and so forth.

DETAILED DESCRIPTION OF PREFERRED EMBODIMENTS

Figure 1A:
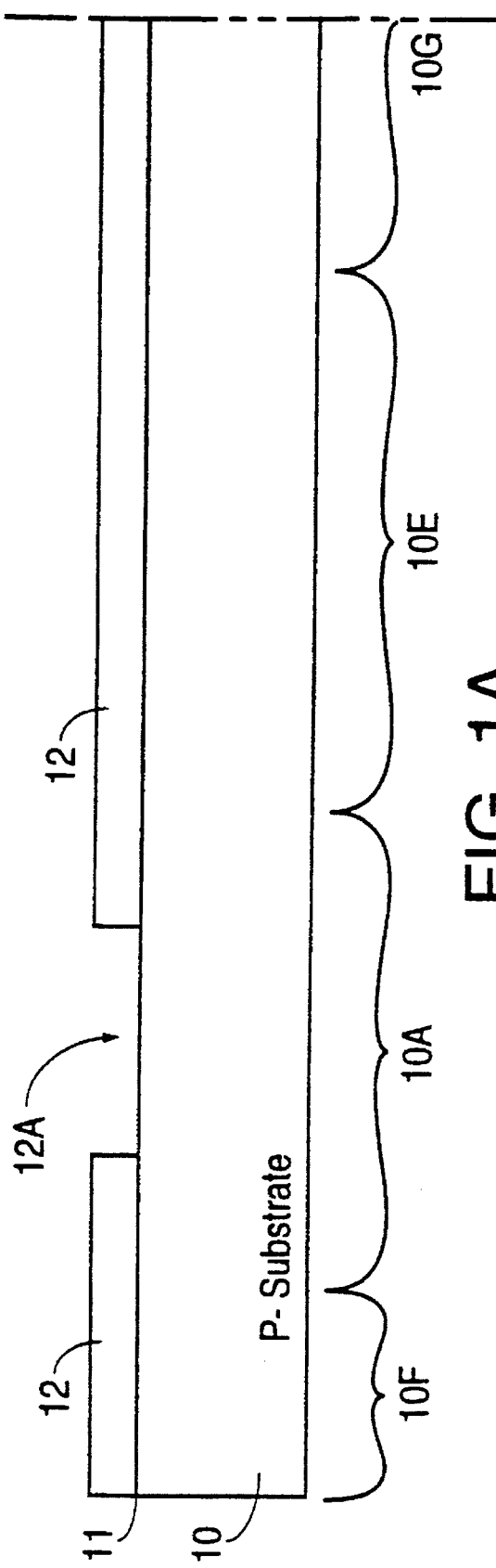

The present invention now will be described more fully hereinafter with reference to the accompanying figures, in which preferred embodiments of the invention are shown. This invention may, however, be embodied in many different forms and should not be construed as limited to the embodiments set forth herein. Rather, applicants provide a detailed description of preferred embodiments so that this disclosure will be thorough and complete, and will fully convey the scope of the invention to those skilled in the art. For ease of illustration, the thickness of various layers in the figures has been exaggerated. Like numbers refer to like elements throughout the specification and figures.

BiCDMOS PROCESS

Multiple processing steps of a BiCDMOS process are set forth below in Table 1.

TABLE 1

| | |
|---|---|
| 1. | P– Substrate |
| 2. | Initial Oxidation |
| 3. | N+ Buried Layer Mask |
| 4. | N+ Buried Layer Implant |
| 5. | N+ Buried Layer Diffusion |
| 6. | P+ Buried Layer Mask |
| 7. | P+ Buried Layer Implant |
| 8. | Resist Strip |
| 9. | Oxide Strip |
| 10. | Epi Growth |
| 11. | Epi Reoxidation |
| 12. | P– Well Mask |
| 13. | P– Well Implant |
| 14. | P– Well Diffusion |
| 15. | P+ ISO Mask |
| 16. | P+ ISO Impant |
| 17. | P+ ISO Diffusion |
| 18. | N+ Sinker Mask |
| 19. | N+ Sinker POCl$_3$ Predeposition |
| 20. | N+ Sinker Diffusion |
| 21. | P+ Buried Zener Mask |
| 22. | P+ Buried Zener Implant |
| 23. | P+ Buried Zener Diffusion |
| 24. | Oxide Strip |
| 25. | Base Oxidation |
| 26. | Nitride Deposition |
| 27. | LTO Deposition |
| 28. | Active Area Mask |
| 29. | N– Field Implant |
| 30. | P– Field Mask |
| 31. | P– Field Implant |
| 32. | Resist Strip |
| 33. | LTO Etch |
| 34. | Field Oxidation |
| 35. | Thin Oxide Etch/Nitride Strip |
| 36. | N– Base Mask |
| 37. | N– Base Implant |
| 38. | Resist Strip |
| 39. | Base Oxide Etch |
| 40. | Sacrificial Oxidation |
| 41. | Sacrificial Oxidation Etch |
| 42. | Gate Oxidation |
| 43. | Poly Deposition |
| 44. | Photoresist Coat/Bake |
| 45. | Poly Backside Etch |
| 46. | Backside Oxide Etch |
| 47. | Resist Strip |
| 48. | Poly POCl$_3$ Predeposition |
| 49. | Poly Mask |

TABLE 1-continued

| | |
|---|---|
| 50. | DMOS P– Body Mask |
| 51. | DMOS P– Body Implant |
| 52. | Resist Strip |
| 53. | DMOS P– Body Diffusion |
| 54. | N– LDD Implant |
| 55. | P– Base Mask |
| 56. | P– Base Implant |
| 57. | Resist Strip |
| 58. | N+ S/D & NPN Emitter Mask |
| 59. | N+ S/D & NPN Emitter Implant |
| 60. | Resist Strip |
| 61. | Poly Reoxidation |
| 62. | P+ S/D & PNP Emitter Mask |
| 63. | P+ S/D & PNP Emitter Implant |
| 64. | BPSG Deposition |
| 65. | BPSG Flow |
| 66. | Deposition and Etch |
| 67. | Contact Mask |
| 68. | Metal 1 Deposition |
| 69. | Metal 1 Mask |
| 70. | TEOS Oxide Deposition |
| 71. | Planarization (Resist Etchback) |
| 72. | TEOS Oxide Cap |
| 73. | Via Mask |
| 74. | Metal 2 Deposition |
| 75. | Metal 2 Mask |
| 76. | Passivation Nitride Deposition |
| 77. | Passivation Mask |
| 78. | Alloy |

Although the various processing steps listed above in Table 1 are numbered for the reader's convenience, it is to be understood that various of these processing steps can be eliminated in some embodiments, that the order of various of the processing steps may be reversed in some embodiments, and that various of the processing steps may be combined into a single step in certain other embodiments. Accordingly, the numbering of processing steps in Table 1 is provided only to aid the reader in understanding the embodiments of the BiCDMOS process illustrated in the Figures and described below in the text. Individual processing steps listed in Table 1 are indicated below in the text by the step number enclosed by parentheses.

FIGS. 1A and 1B show a first illustrative stage in the BiCDMOS processing method. A substrate (Step 1) 10 is shown having an upper surface 11. This substrate may, for example, be a P– doped, polysilicon backside-coated substrate having a resistivity of 1. to 5. ohm-cm. Substrate 11 may be considered to be comprised of a series of laterally disposed regions: a buried zener region 10F, a DMOS region 10A, a relatively high voltage NMOS region 10E, a relatively high voltage PMOS region 10G, a relatively low voltage PMOS region 10H, a relatively low voltage NMOS region 10D, a vertical PNP bipolar region 10B, and a vertical NPN bipolar region 10C.

An initial oxidation step (Step 2) is then performed to form an initial oxide layer 12 on the upper surface of the substrate. This initial oxide may, for example, be thermally grown to have a thickness of approximately 300 Angstroms.

An N+ buried layer mask (Step 3) step is then formed from photoresist. This mask is used to form openings 12A, 12B and 12C through the initial oxide layer down to the upper surface 11 of the substrate 10. The initial oxide 12 may be, for example, etched using dry or wet etching. After openings 12A, 12B and 12C are formed, the photoresist mask is stripped away.

Figure 2A:
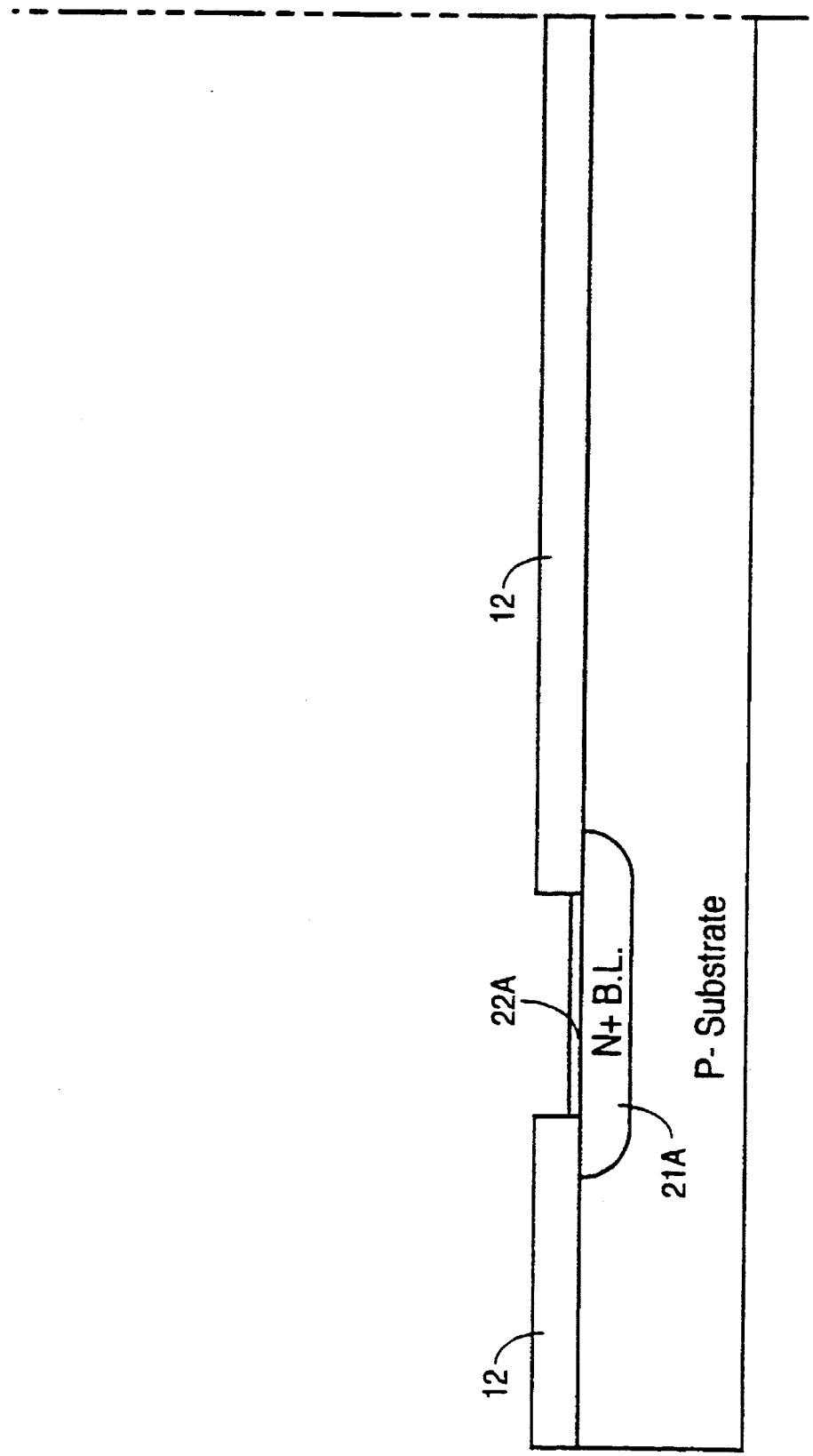
Figure 2B:
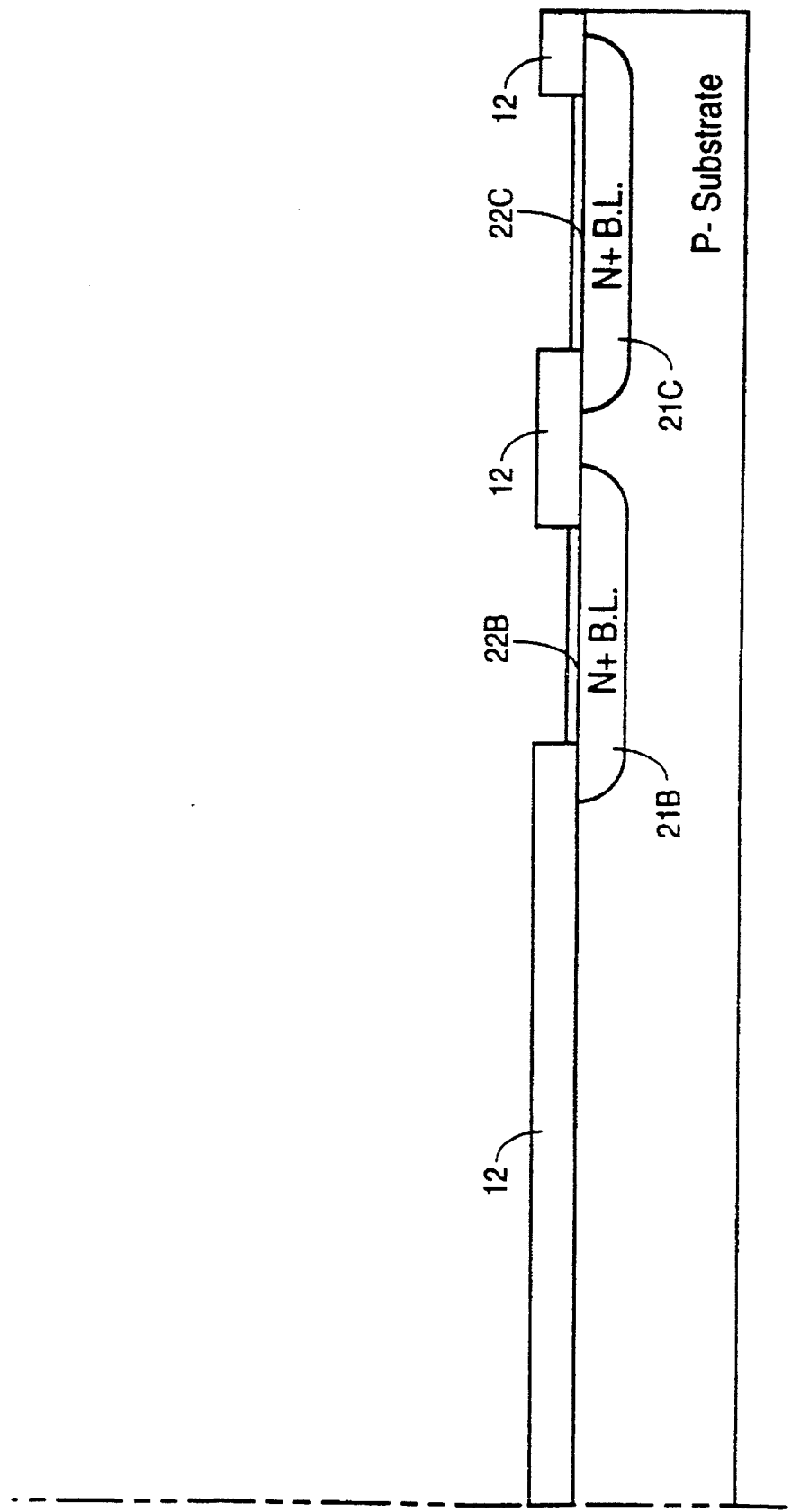

FIGS. 2A and 2B show a subsequent illustrative stage in the BiCDMOS processing method. An N+ buried layer ion implantation step (Step 4) is performed using oxide layer 12 as an implant mask to form buried layer regions 21A, 21B and 21C at openings 12A, 12B and 12C, respectively. Antimony ions, for example, may be implanted into the upper surface 11 of the substrate at 80 KeV with a dosage of 1-2E15 cm$^2$.

An N+ buried layer drive-in diffusion step (Step 5) is then performed. During this diffusion step, a thin oxide layer 22A grows in opening 12A, a thin oxide layer 22B grows in opening 12B, and a thin oxide layer 12C grows in opening 12C. The thickness of these thin oxides 22A–22C may, for example, be approximately 4000 Angstroms. N+ buried layer regions 21A, 21B and 21C may, for example, extend vertically into the substrate to a depth of 3.5 to 4.0 μm.

Figure 3A:
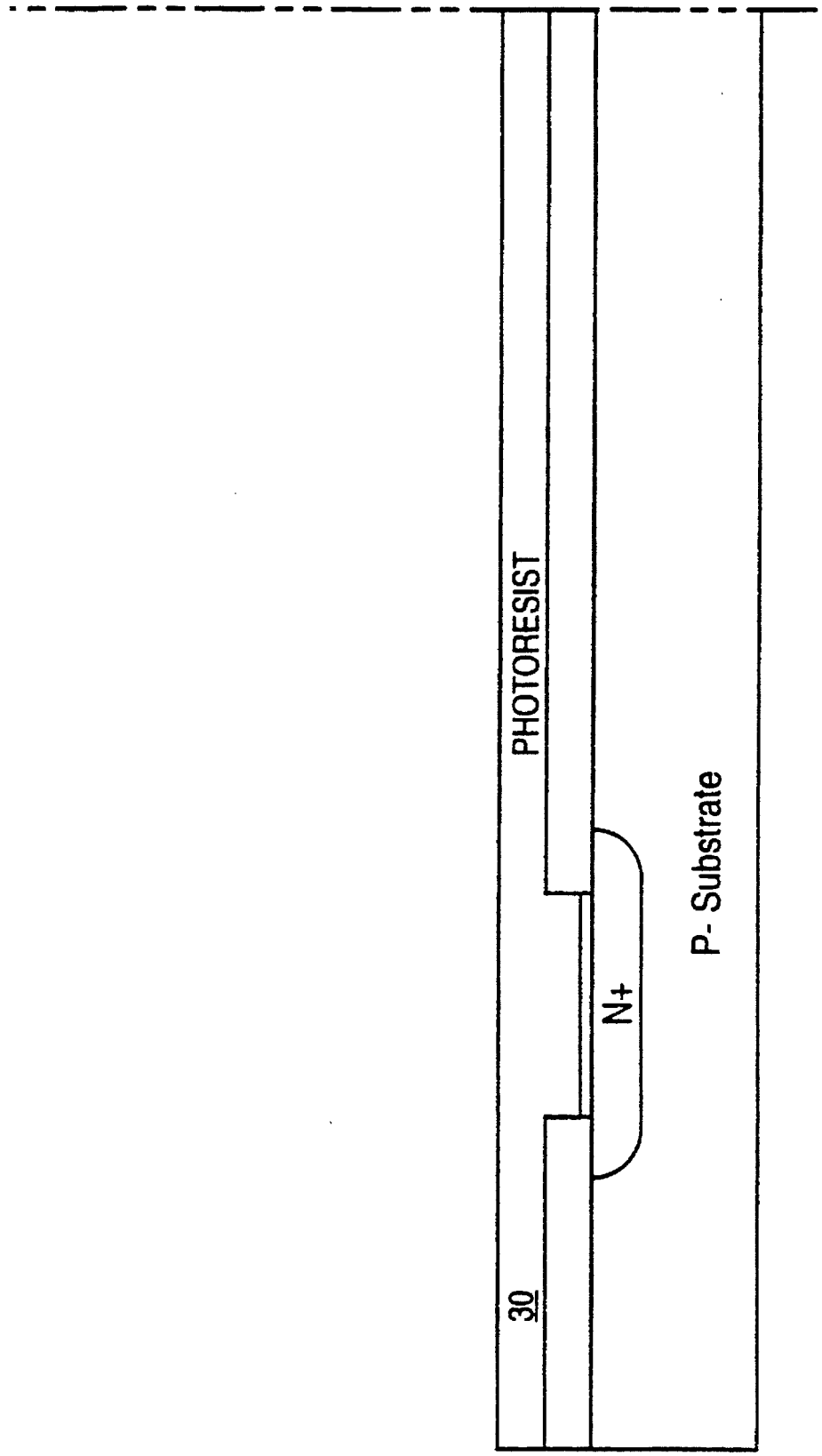
Figure 3B:
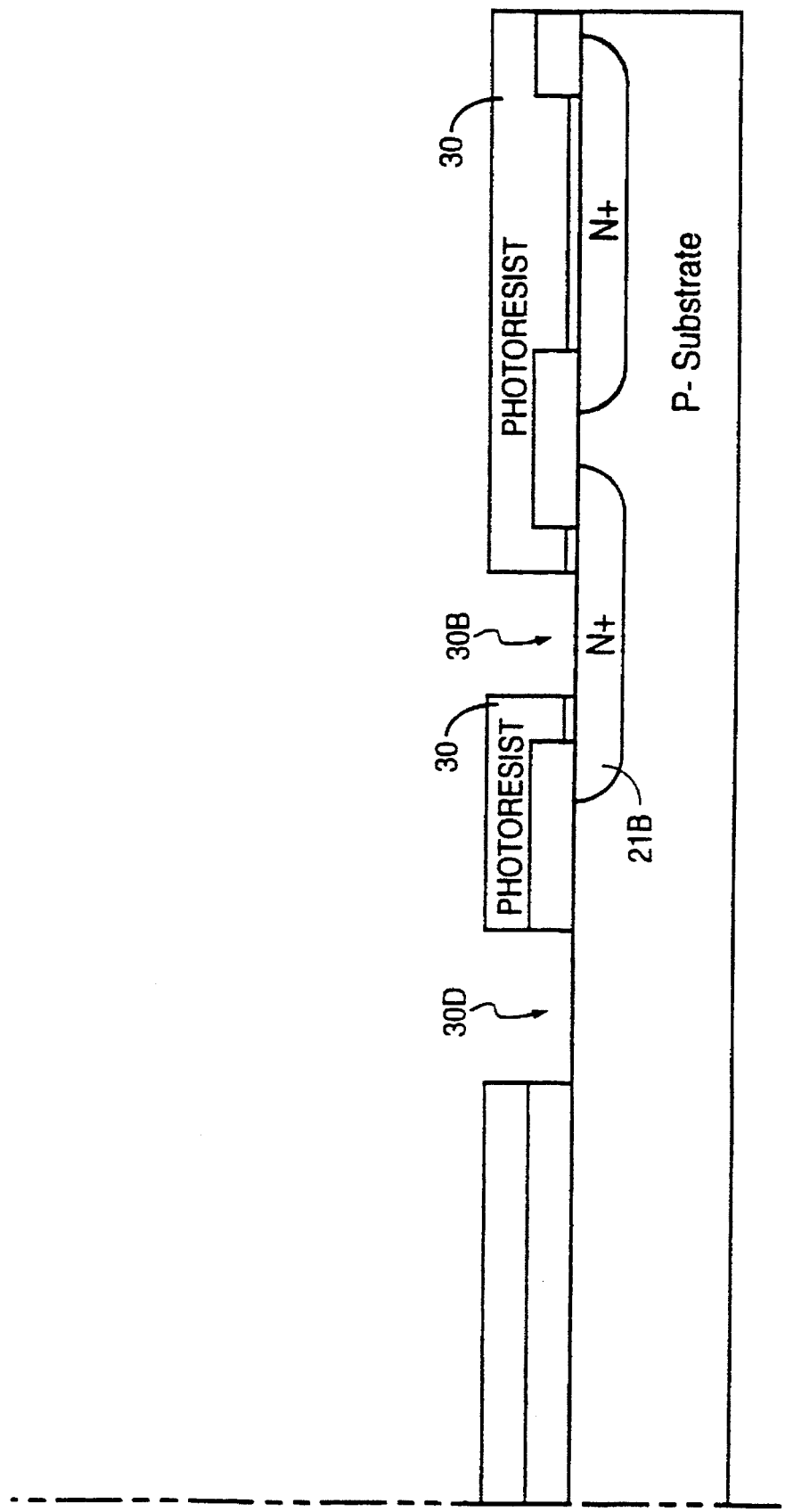

FIGS. 3A and 3B show a subsequent illustrative stage in the BiCDMOS processing method. A layer of photoresist 30 is formed into a P+ buried layer mask (Step 6) so that openings 30D and 30B are formed down to the upper surface 11 of the substrate. Opening 30B is made to be smaller than opening 12B so that the peripheral boundary of opening 30B lies within the peripheral boundary of opening 12B. An oxide etch is then performed to remove the portion of oxide 22B which is exposed by opening 30B. This oxide etch also removes the portion of initial oxidation layer 12 which was exposed at opening 30D. Once all oxide has been removed in openings 30B and 30D, the photoresist masking layer is stripped away. An implant oxidation layer (not shown in FIGS. 3A and 3B) is then thermally grown in openings 30B and 30D to have, for example, a thickness of approximately 10,000 Angstroms.

A P+ buried layer ion implantation step (Step 7) is then performed so that a portion of N+ buried layer region 21B receives a concentration of P+ ions from the P+ ion implantation. Similarly, P+ ions are implanted into the upper surface of the substrate 10 at opening 30D. This P+ ion implantation may, for example, be a Boron implant at 140 KeV with a dose of 1E14 cm$^2$.

After the photoresist mask is stripped away (Step 8), a drive-in diffusion step is performed to drive the P+ implanted Boron ions vertically and laterally into the substrate 10. This drive-in step may be performed until an oxide having a thickness of 6500 Angstroms forms over the exposed silicon substrate surface in openings 30D and 30B. An oxide strip (step 9) is then performed to remove all oxide from the upper surface 11 of substrate 10 including initial oxide layer 12 and the oxide which grew in openings 30D and 30B.

Figure 4B:
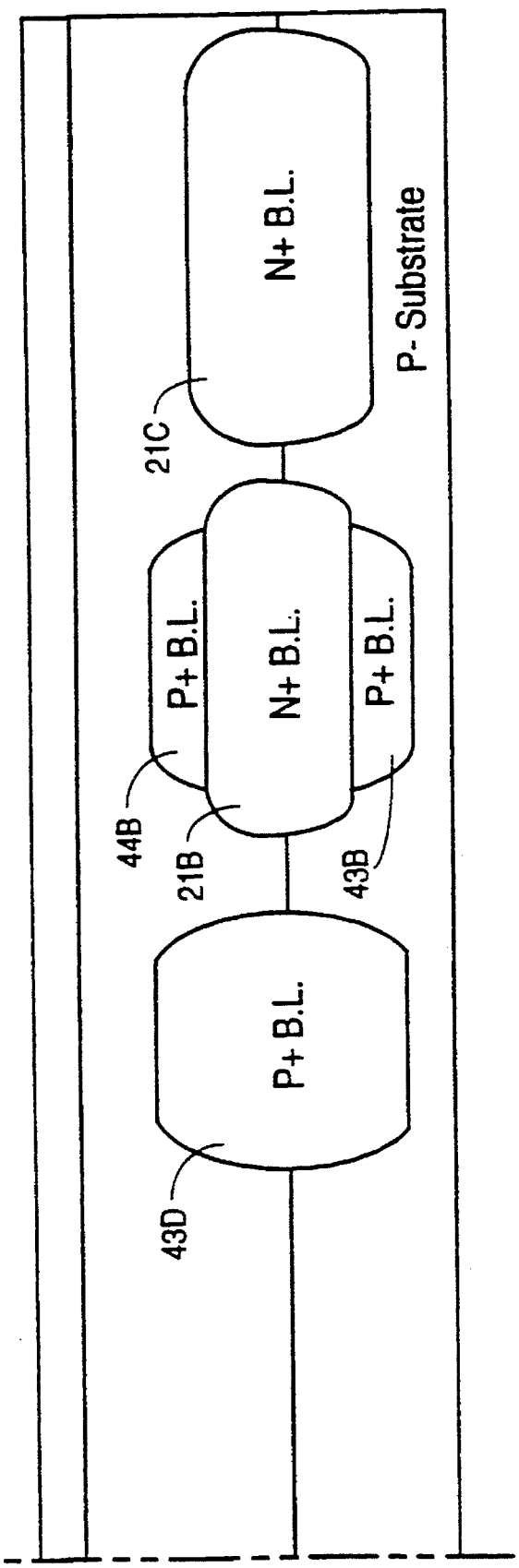

FIGS. 4A and 4B show a subsequent illustrative stage in the BiCDMOS processing method. An epitaxial layer 42 of silicon is grown (Step 10) over the upper surface 11 of the substrate 10. In a 60 volt embodiment of the present invention, this epitaxial layer may, for example, be N- doped silicon having a thickness of approximately 10.2 μm plus or minus 0.9 μm with a doping concentration within the approximate range of 5E15 to 1E16 cm$^3$. In a 20 volt embodiment of the present invention, this epitaxial layer may, for example, be N- doped silicon having a thickness of approximately 8.0 μm plus or minus 0.7 μm with a doping concentration within the approximate range of 5E15 to 2E16 cm$^3$.

An epitaxial reoxidation step (Step 11) is then performed to form an epitaxial reoxidation layer 40 over an upper surface 41 of the epitaxial layer 42. Three N+ buried layer regions 21A, 21B and 21C therefore are present in the structure. These N+ buried layers extend downward into the substrate layer 10 from the substrate/epitaxial layer boundary 11 and also extend upward into the epitaxial layer 42 from the substrate/epitaxial layer boundary. The N+ buried layer regions diffuse upward during the growing of the epitaxial layer. Similarly, a P+ buried layer region 43D is present in the structure. P+ buried layer region 43D extends downward into the substrate layer from the substrate/epitaxial layer boundary and also extends upward into the epitaxial layer from the substrate/epitaxial layer boundary.

There are, however, two P+ regions 43B and 44B which form from the single P+ ion implantation performed into the upper surface of N+ buried layer region 21B. Because P type ions diffuse faster than N type ions, the P+ dopants of the P+ ion implantation step diffuse upward and downward faster than do the N+ dopants of buried layer region 21B. Where the P+ ions diffuse beyond the boundaries of the more heavily doped N+ region 21B, the P+ ions form P+ regions. Because the opening 30B used to do the P+ implant is adequately smaller than and adequately within the opening 12B used to do the N+ implanting of N+ region 21B, the implanted P+ ions do not diffuse laterally far enough to exceed the lateral extent of N+ region 21B. These implanted P+ ions do, however, diffuse vertically far enough to exceed the vertical extend of N+ region 21B. As a result, two P+ regions 43B and 44B are formed which are separated from each other by the N+ region 21B.

Figure 5A:
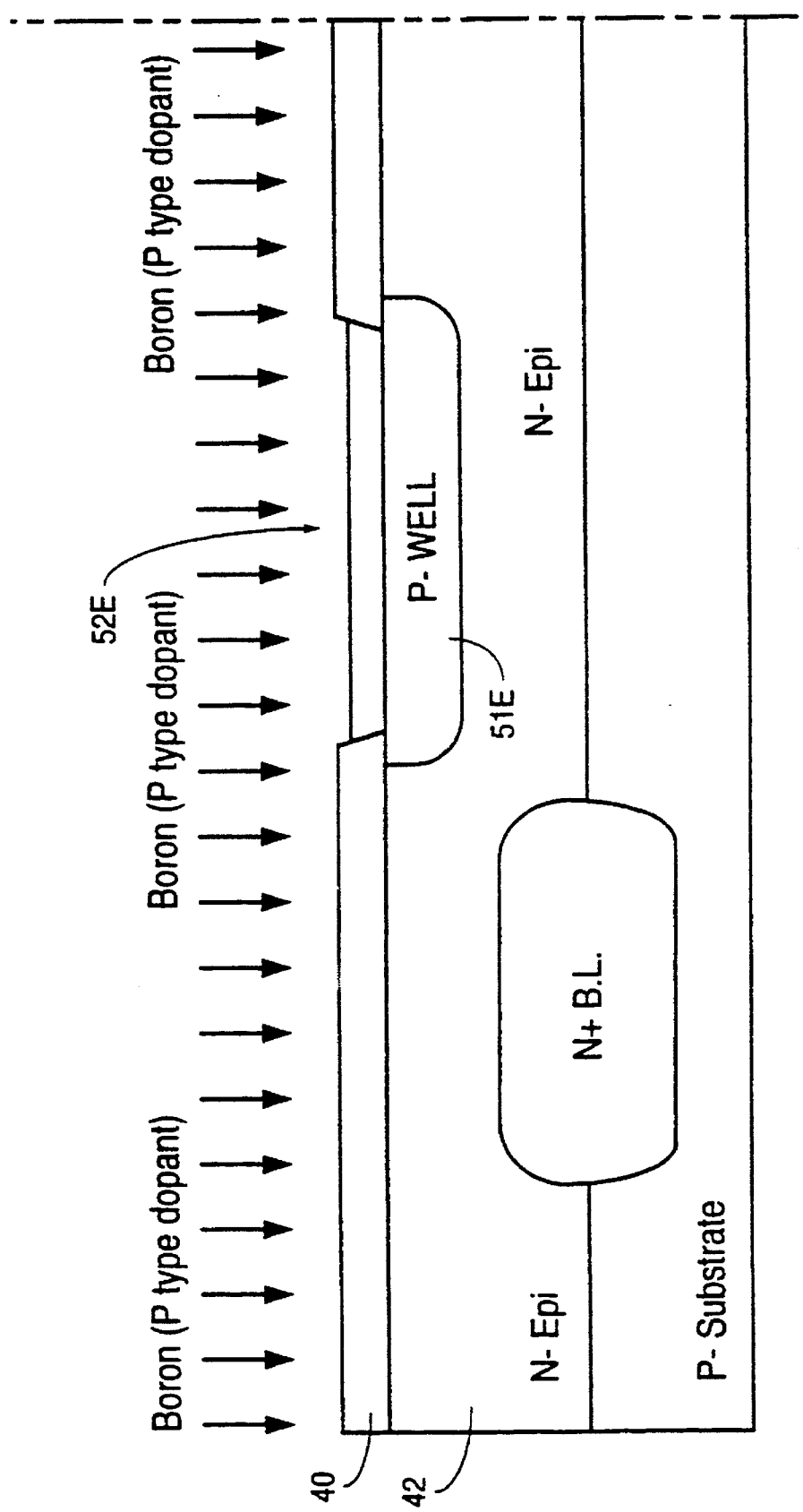
Figure 5B:
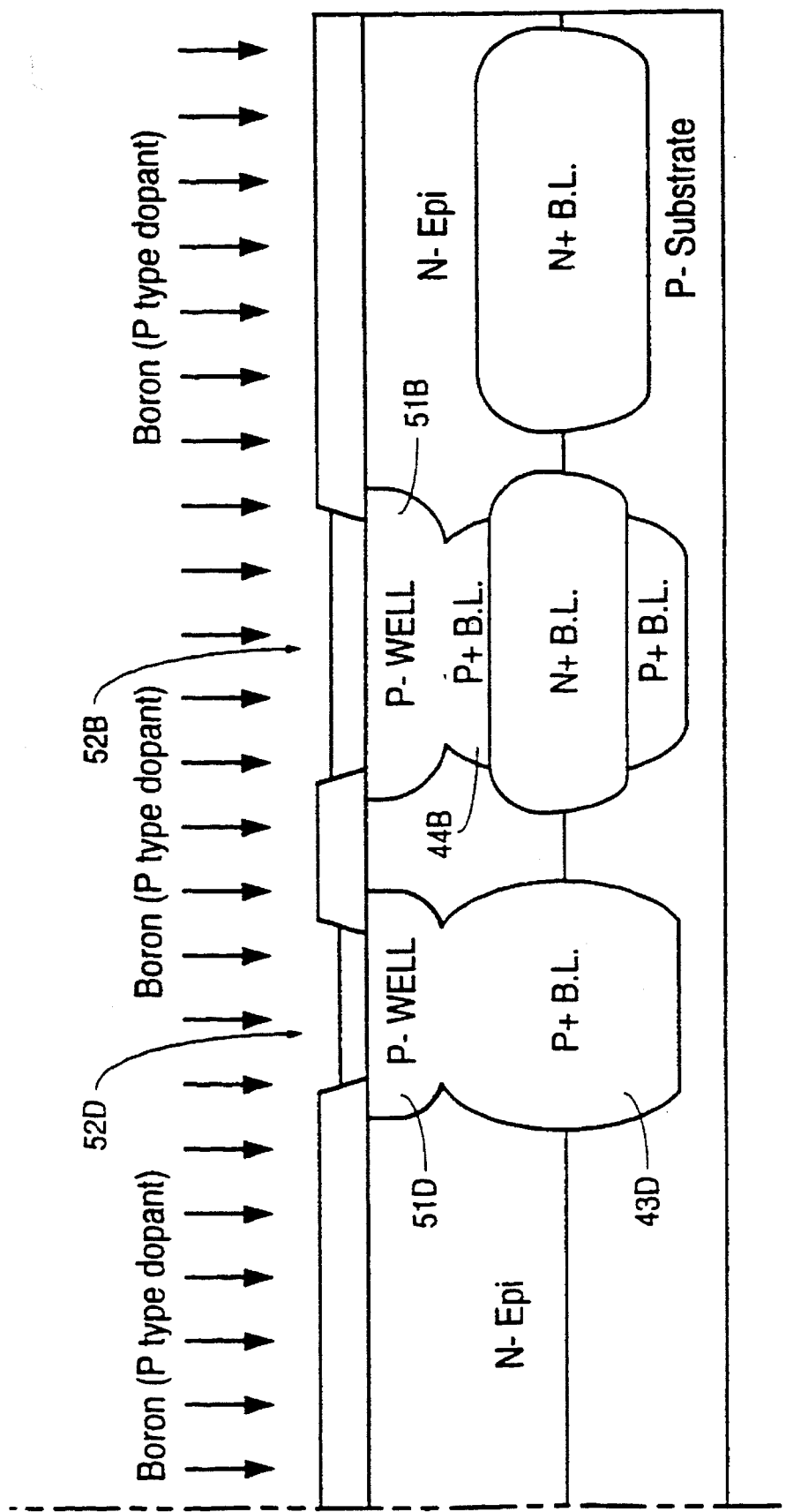

FIGS. 5A and 5B show a subsequent illustrative stage in the BiCDMOS processing method. A layer of photoresist (not shown) is formed over the epitaxial reoxidation layer 40 to form a P– well masking layer (Step 12) (not shown) having three openings. One of these openings is above the high voltage NMOS region 10E. A second of these openings is above the low voltage NMOS region 10D. A third of these openings is located above P+ buried layer region 44B in the vertical PNP region 10B. An oxide etch is then performed to etch selectively the underlying epitaxial reoxidation layer 40 so that three openings 52E, 52D and 52B are formed in the epitaxial reoxidation layer 40 down to the upper surface of the epitaxial layer 42. The photoresist is then stripped away and a thin implant oxide layer (not shown) is grown in the exposed three openings 52E, 52D and 52B. This thin implant oxide may, for example, have a thickness of 300 Angstroms.

A P– well ion implantation step (Step 13) is then performed through the thin implant oxide layer in openings 52E, 52D and 52B to form P– well regions 51E, 51D and 51B. The remaining unetched portions of the epitaxial reoxidation layer 40 serve as an implant mask. This ion implantation step may, for example, be a Boron implant at 100 KeV with a dose of 1-2E13 cm$^2$.

A P– well drive-in diffusion step (Step 14) is then performed to diffuse P– well region 51D down from the upper surface of the epitaxial layer to contact P+ buried layer region 43D. Similarly, the P– well diffusion step diffuses the P– well 51B down into the epitaxial layer until it contacts the top of P+ buried layer region 44B. This P– well drive-in diffusion step may be performed until an oxide having a thickness of approximately 4000 Angstroms forms in the openings 52E, 52D and 52B through which the ions are implanted.

A P+ isolation mask (Step 15), implant (Step 16), and drive-in diffusion (Step 17) may then be performed to form isolation P+ regions (not shown) down into the epitaxial layer laterally around selected transistor regions of the epitaxial layer. These isolation structures have been omitted from FIGS. 1A–16A and 1B–16B to simplify the illustration.

Figure 6A:
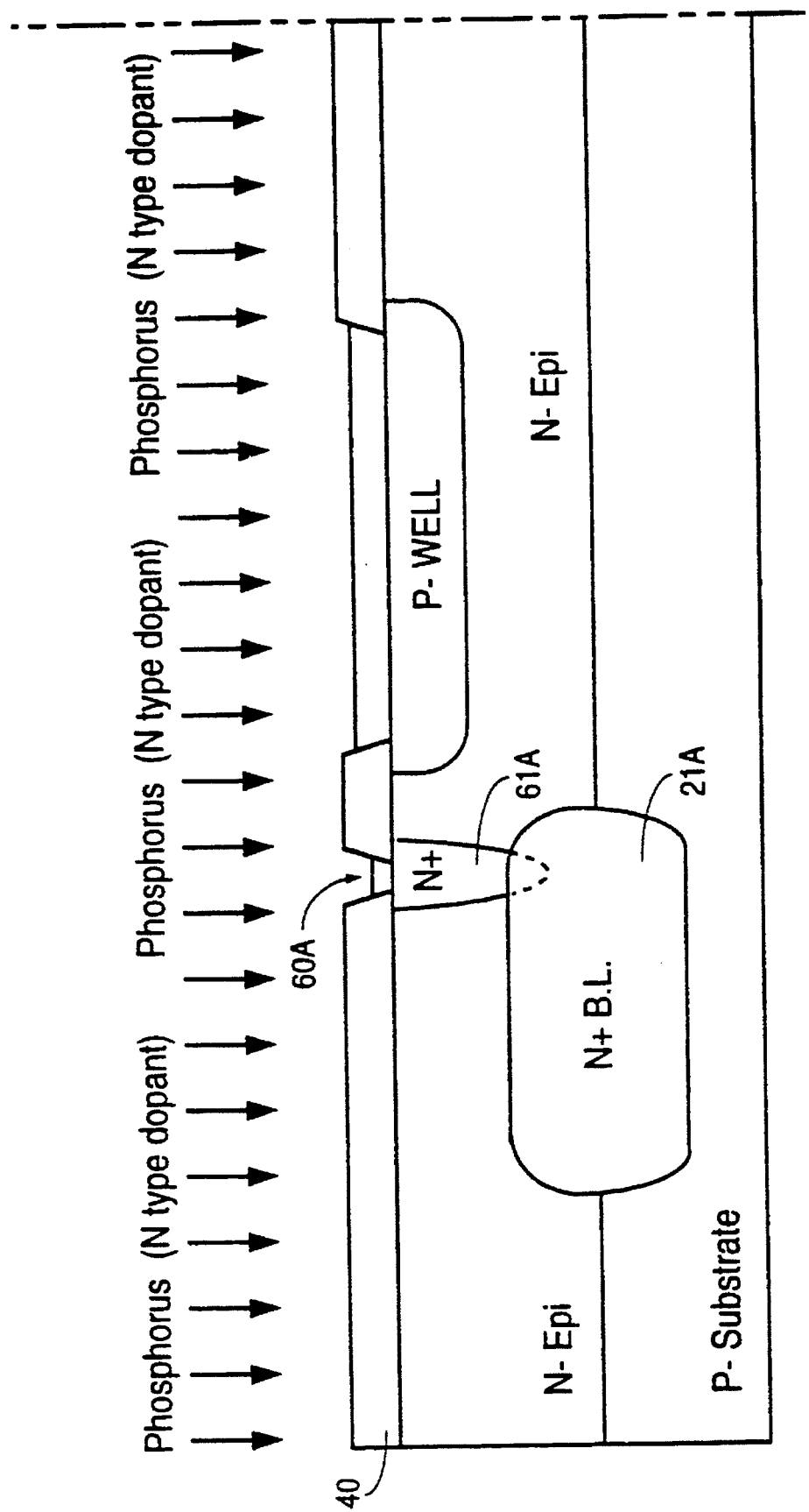
Figure 6B:
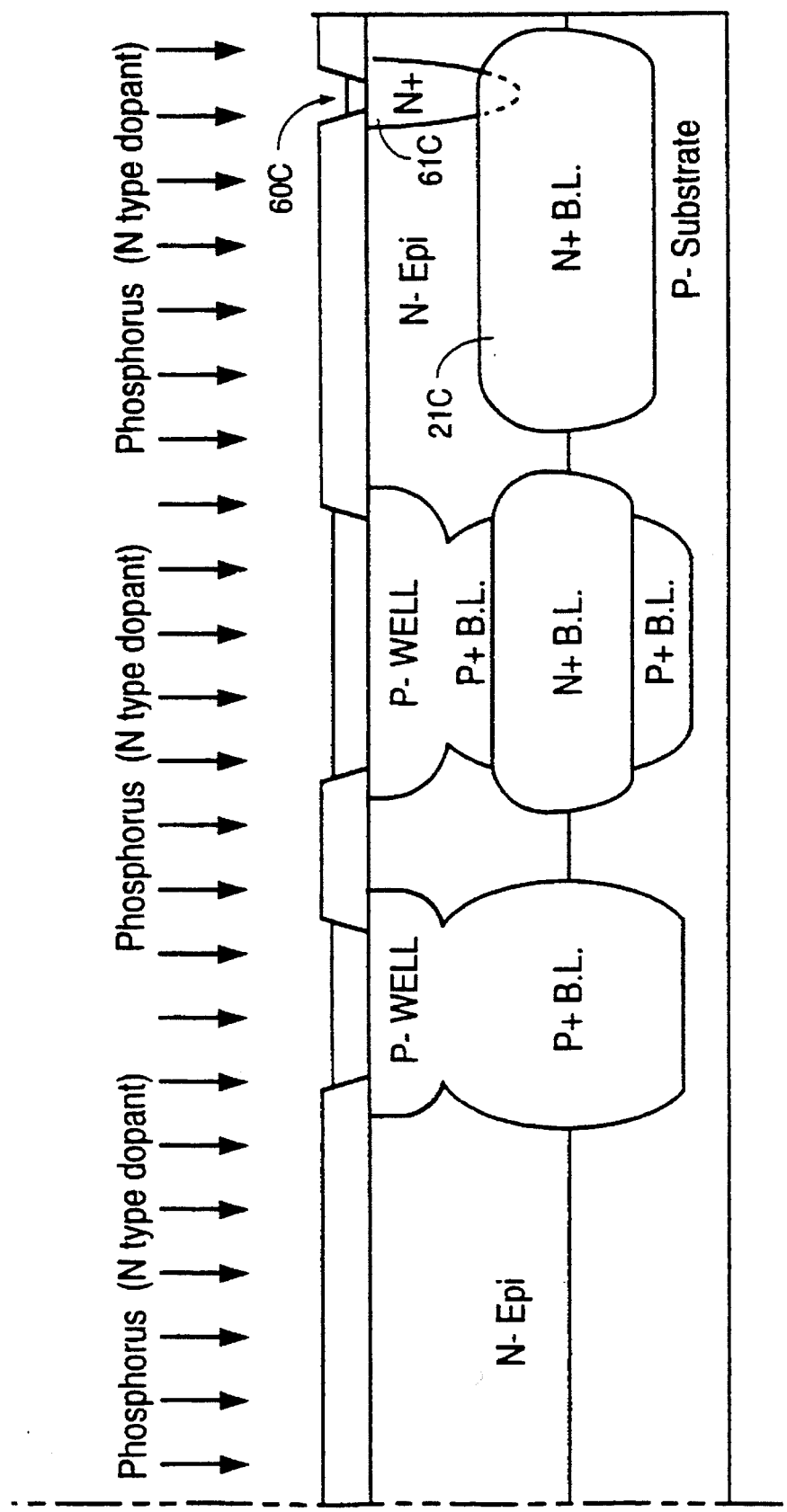

FIGS. 6A and 6B show a subsequent illustrative stage in the BiCDMOS processing method. A layer of photoresist (not shown) is formed over the epitaxial reoxidation layer 40 to form a N+ sinker masking layer (Step 18) (not shown) having two openings. One of these openings is located over DMOS region 10A and the other is located over vertical NPN region 10C. An oxide etch is then performed to remove selected portions of the epitaxial reoxidation layer 40 exposed by the N+ sinker masking layer. Two openings 60A and 60C are therefore formed into the epitaxial reoxidation layer 40. The photoresist covering P− wells 51E, 51D and 51B is not removed so that the thinner oxide layer covering P− wells 51E, 51D and 51B remains protected and is not etched. After the etching step is completed, the photoresist mask is stripped away leaving the oxidation layer 40 with two openings.

The N+ sinker regions 61A and 61C are then formed at openings 60A and 60C, respectively. These N+ sinker regions may, for example, be formed by redepositing $POCl_3$ (Step 19) into openings 60A and 60C using a HF dip. Phosphorous from the $POCl_3$ may then be diffused from the $POCl_3$ layer down into the upper surface of the epitaxial layer at approximately 950° C. until the upper surface of the epitaxial layer at openings 60A and 60C has a conductivity of approximately 2.1 ohms per square.

An N+ sinker drive-in diffusion step (Step 20) may then be performed to diffuse the phosphorous dopant downward from the upper surface of the epitaxial layer. N+ sinker region 61A is formed over N+ buried layer region 21A so that the bottom of N+ sinker region 61A contacts N+ buried layer region 21A as shown in the cross-sectional view of FIGS. 6A and 6B. Similarly, N+ sinker region 61C is formed over N+ buried layer region 21C so that the bottom of N+ sinker region 61C contacts N+ buried layer region 21C. During this N+ sinker region drive-in diffusion, an oxide layer is grown on the exposed upper surface of the epitaxial layer in openings 60A and 60C. This oxide may, for example, reach a thickness of approximately 5000 Angstroms.

Figure 7B:
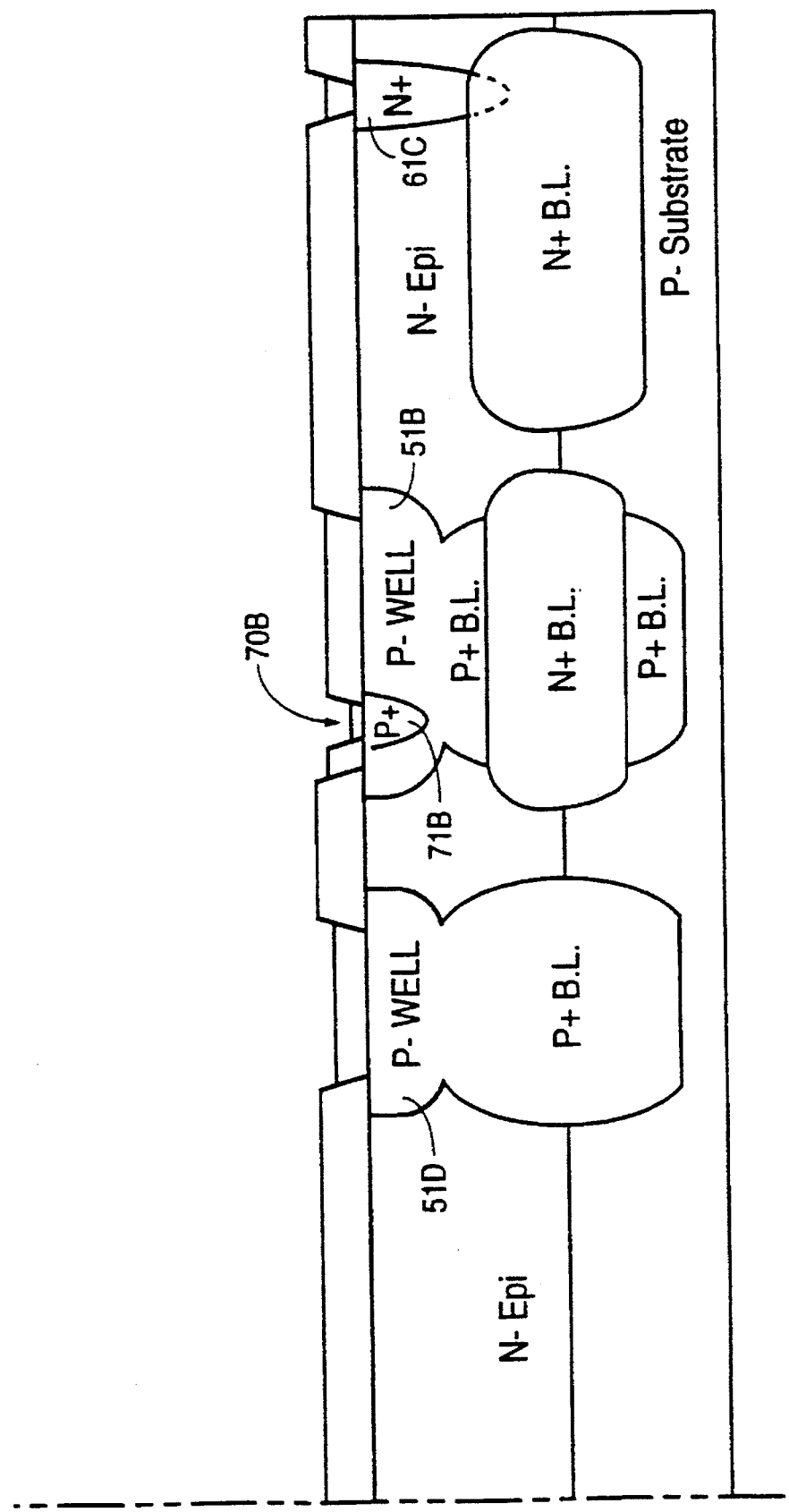

FIGS. 7A and 7B show a subsequent illustrative stage in the BiCDMOS processing method. A layer of photoresist (not shown) is formed over the epitaxial reoxidation layer 40 to form a P+ buried zener masking layer (Step 21) (not shown) having two openings. One of the openings is located over buried zener region 70F whereas the second of the openings is located over vertical PNP region 70B. An oxide etch is then performed to remove those portions of the reoxidation layer 40 left exposed by the P+ buried zener masking layer. Two openings 70F and 70B are therefore formed into the reoxidation layer 40. The photoresist covering sinker 61A, P− well 51E, P− well 51D, and sinker region 61C is not removed so that the oxide layer covering these regions remains protected and is not etched.

After the etching step is completed, the photoresist mask is not, however, stripped away. Also, no thin implant oxide need be formed over the exposed portions of the upper surface of the epitaxial layer. A P+ buried zener ion implantation step (Step 22) is then performed. This step may, for example, be performed at 80 KeV with Boron to a dose of 1-3E15 $cm^2$. After the buried zener implant step, the buried zener photoresist mask is removed.

A P+ buried zener drive-in diffusion step (Step 23) is then performed to diffuse the P+ ions implanted in the P+ buried zener implant step downward into the epitaxial layer to form P+ buried zener anode region 71F and P+ collector contact region 71B. This drive-in step may be performed at until an oxide of approximately 500 Angstroms forms over region 71F in opening 70F and over region 71B in opening 70B.

Figure 8A:
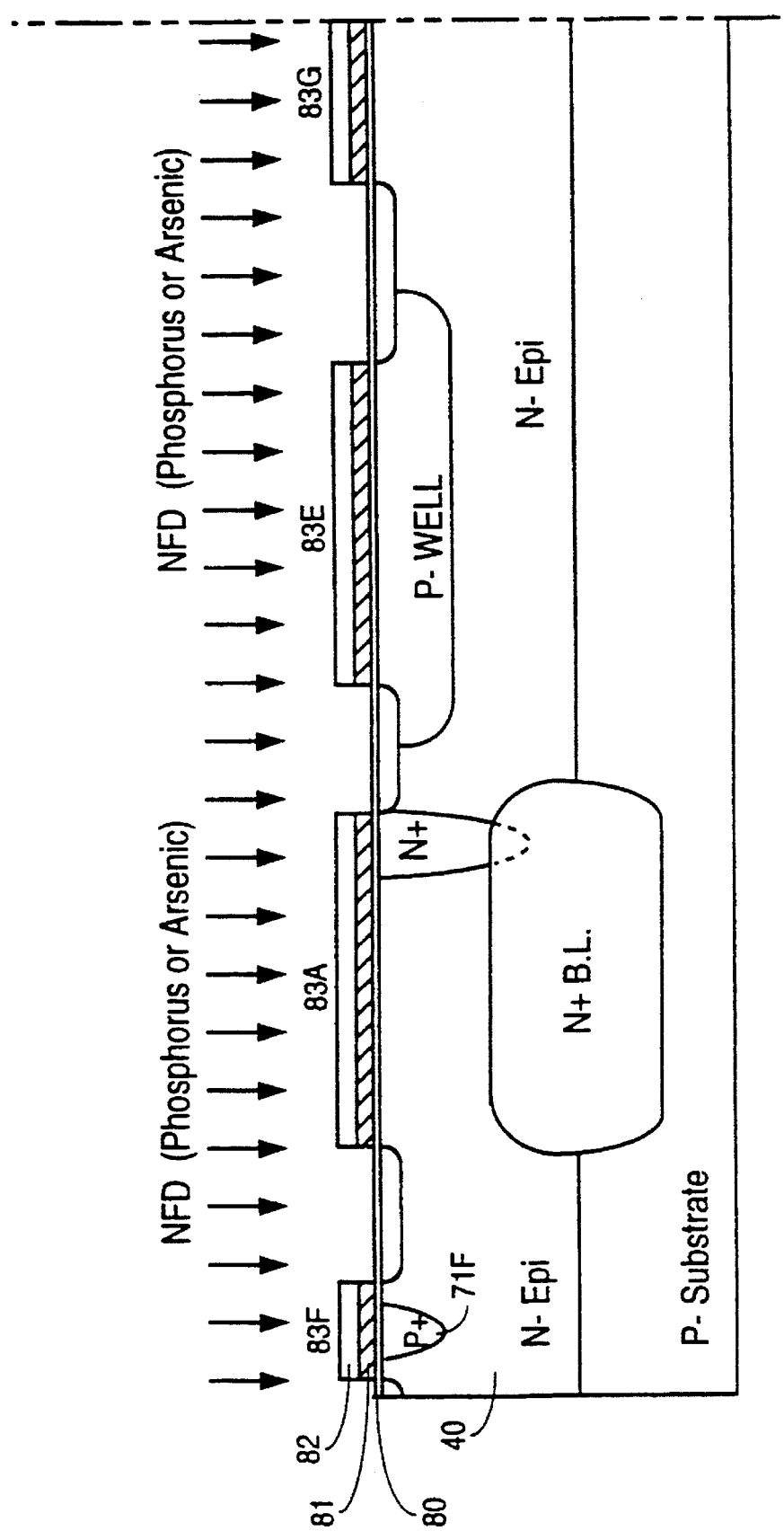
Figure 8B:
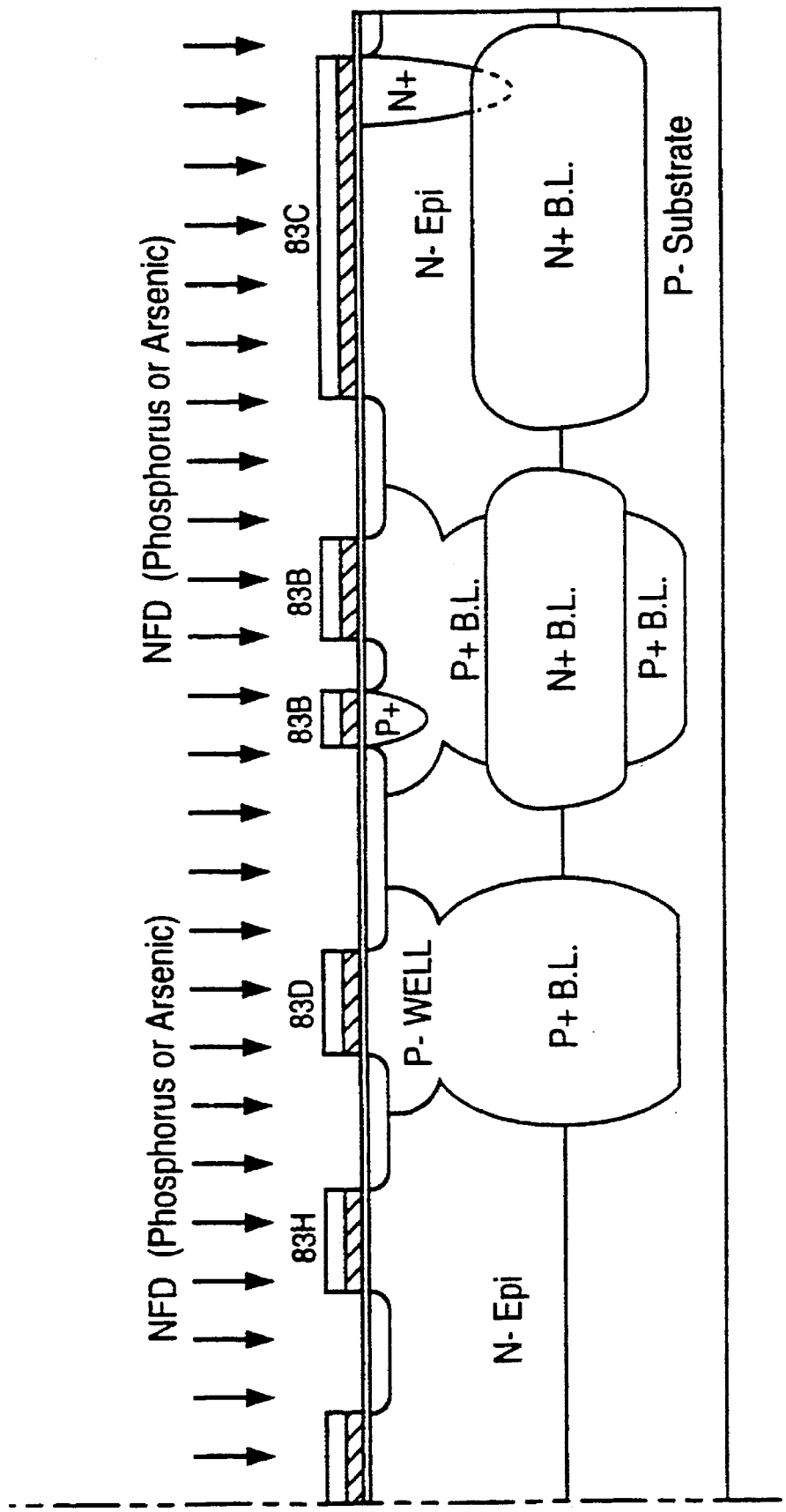

FIGS. 8A and 8B show a subsequent illustrative stage in the BiCDMOS processing method. All oxide overlying the upper surface of the epitaxial layer is removed (Step 24) including reoxidation layer 40. A base oxidation step (Step 25) is then performed to form a base oxide layer 80 over the upper surface of the epitaxial layer 40. This base oxidation layer 80 may, for example, be a thermal oxide grown at 950° C. for approximately 125 minutes until it reaches approximately 500 Angstroms. A silicon nitride layer 81 is then deposited (Step 26) over the base oxide layer 80. This silicon nitride layer 81 may, for example, have a thickness of approximately 1000 Angstroms. A low temperature oxide (LTO) layer 82 may then be deposited (Step 27) over the nitride layer 81. This LTO layer may, for example, have a thickness of approximately 1000 Angstroms.

After the base oxide, nitride, and LTO layers have been formed, a photoresist layer is patterned into an active area mask (Step 28) over the upper surface of the LTO layer. An LTO etch is then performed to remove the exposed portions of the LTO layer. A nitride etch is then performed to remove the exposed portions of the nitride layer. After the photoresist mask is removed, a plurality of active area mask regions 83A–83H are left disposed over the surface of the base oxide layer 80. Each of these active area mask regions comprises a nitride layer and an overlying LTO layer.

An N field ion implantation step (Step 29) is then performed through those portions of the base oxide layer 80 which are located between the active area mask regions 83A–83H. This N field implantation step may, for example, be an implant of phosphorous at 60 KeV with a dose of 1.7E12 $cm^2$.

Figure 9A:
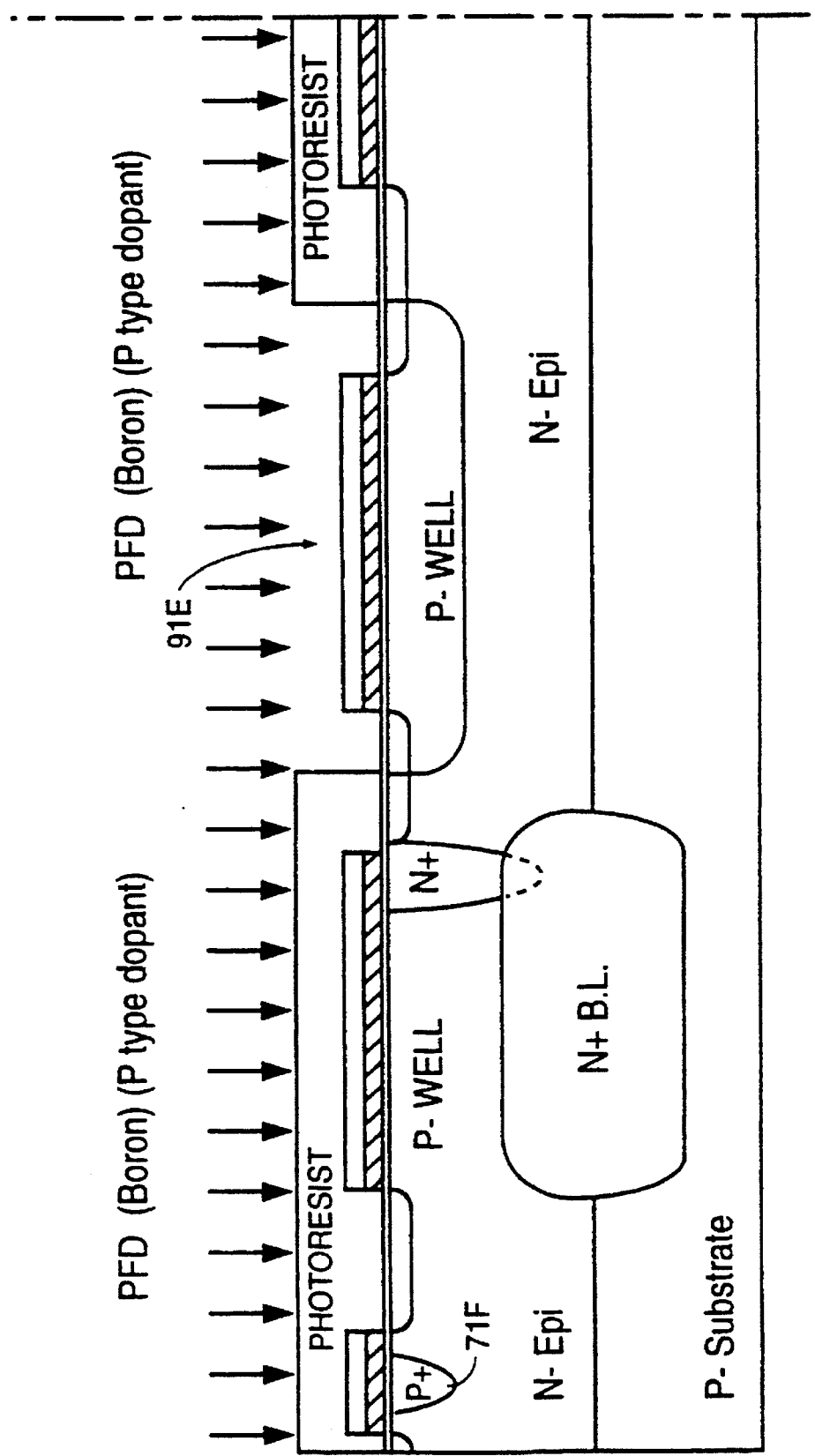
Figure 9B:
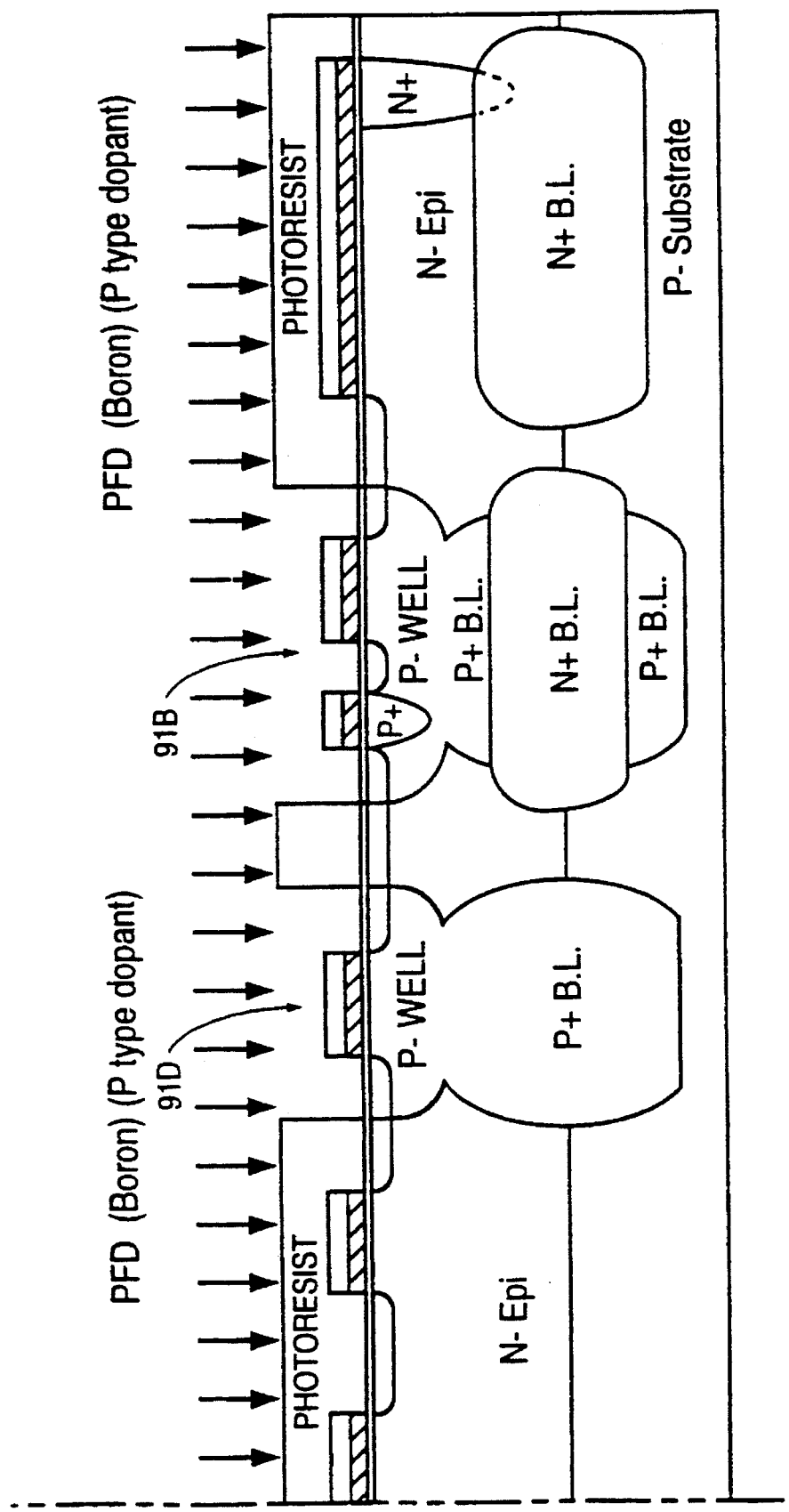

FIGS. 9A and 9B show a subsequent illustrative stage in the BiCDMOS processing method. A layer of photoresist 90 is formed over the upper surface of the structure of FIGS. 8A and 8B to form a P field implant mask (Step 30). In the structure shown in FIGS. 9A and 9B, this P field implant mask has three openings 91E, 91D and 91B.

A P field ion implantation step (Step 31) is then performed. In some embodiments, the P field oxide photoresist implant mask is not removed before the P field ion implantation step. Regions 83E, 83D and 83B serve as an implant mask for the implanting of P type ions through openings 91E, 91D and 91B, respectively. The P field implant may, for example, be a Boron implant at 40 KeV with a dose of 8E13 $cm^2$. The photoresist may be stripped away after the P field implantation step (Step 32).

Figure 10A:
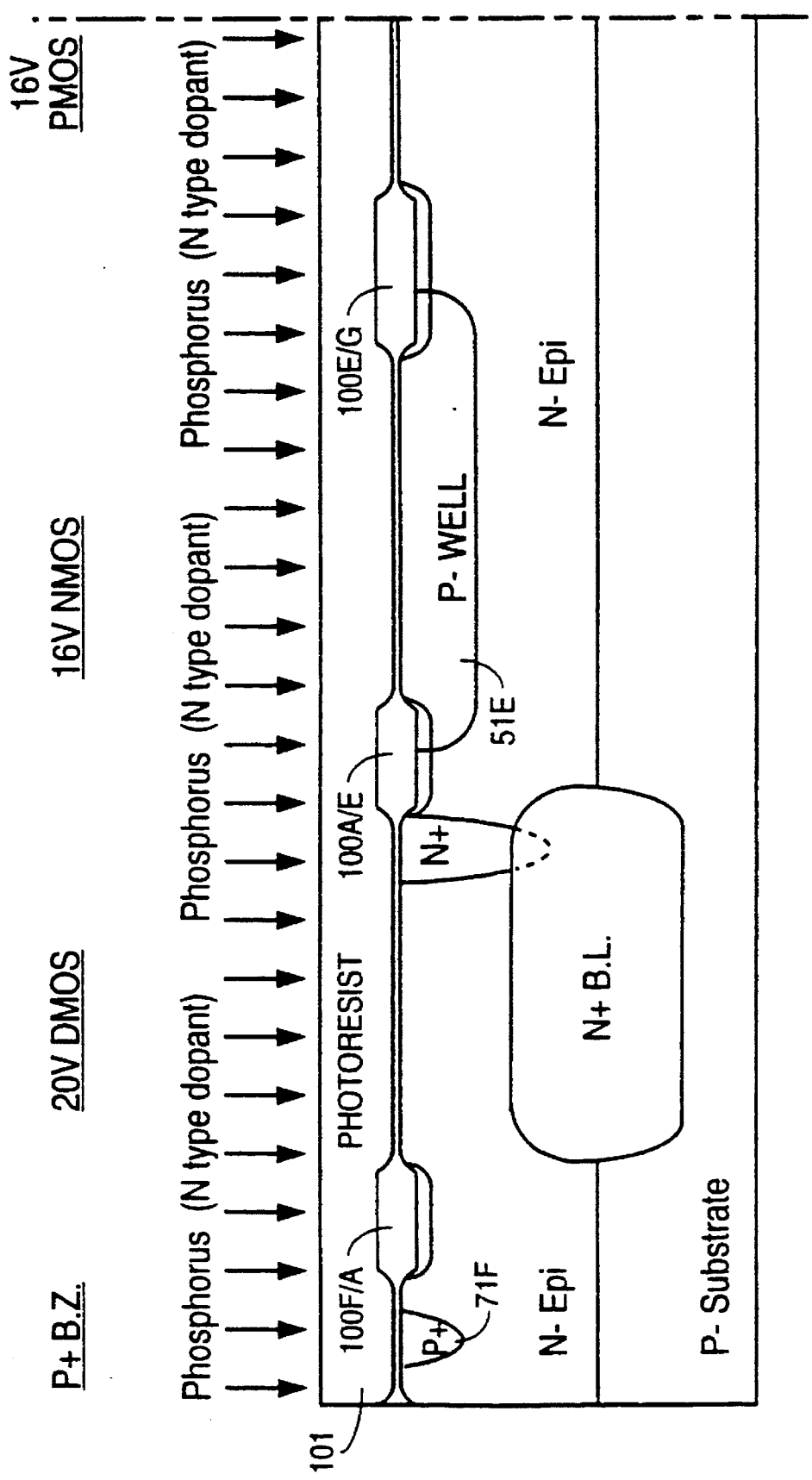
Figure 10B:
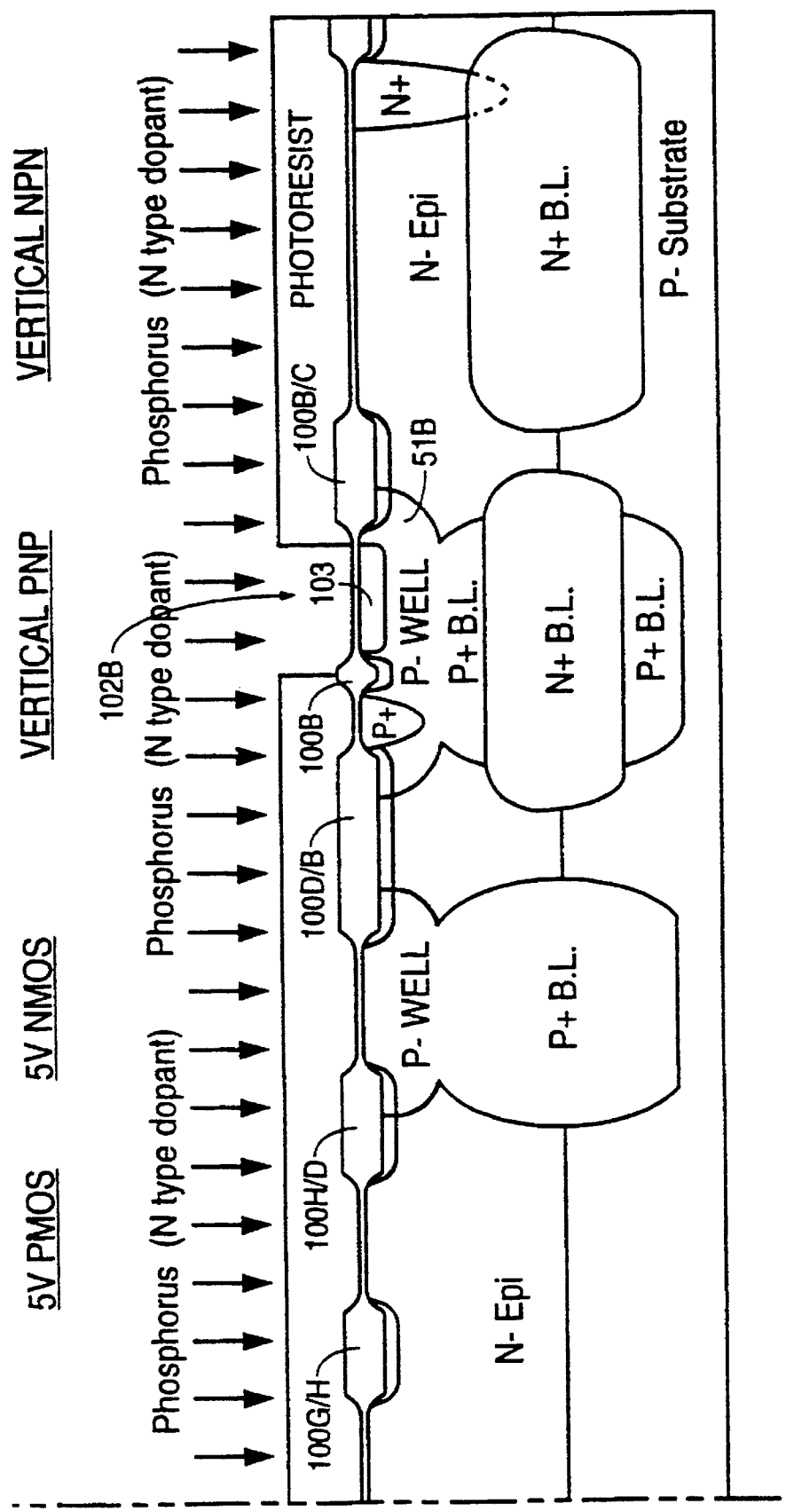

FIGS. 10A and 10B show a subsequent illustrative stage in the BiCDMOS processing method. Each of the active area mask regions 83A–83H is now exposed so the LTO layer of each of the active area mask regions 83A–83H can be removed by an LTO etch (Step 33). Accordingly, each of the active area mask regions 83A–83H comprises only a thin layer of nitride 81 overlying a base oxide layer.

A field oxidation step (Step 34) is then performed to form a field oxide layer over the field regions of the epitaxial layer which are not protected from oxidation by the nitride 81. This method of forming the field oxidation layer 100F/A, 100A/E, 100E/G, 100G/H, 100H/D, 100D/B, 100B, and 100B/C is also described in the copending application entitled "Low Temperature Oxide Layer Over Field Implant Mask", attorney docket number M-1864, filed Jun. 10, 1992 by Michael Chang, David Grasso and Jun-Wei Chen. The resulting field oxide layer has a self-aligned field implant region disposed underneath the field oxide due to the field implantation steps of FIGS. 8A and 8B and FIGS. 9A and 9B. In the P– well regions, such as region 51E, the field implant region underlying the field oxide is a P type silicon. In the other regions overlying N type silicon, such as the field oxide regions which overlie portions of the N– epitaxial layer, the field implant region is doped to be N type silicon. The step of growing the field oxidation layer over the field implanted regions may be performed until field oxidation layer 100 reaches a thickness of approximately 8000 Angstroms.

A thin oxide etching step (Step 35) is then performed to remove any oxide which may have grown on the upper surface of the nitride layer 81 during the field oxidation step. Approximately 500 Angstroms plus or minus 100 Angstroms of the field oxide may also be etched away in this step. A subsequent nitride etching step (Step 35) is then performed to remove all portions of nitride layer 81 without removing more oxide.

A layer of photoresist 101 is then formed over the upper surface of the structure after the nitride strip to form an N– base implant mask (Step 36). This N– base implant mask has one opening 102B formed over a portion of P– well 51B. This opening exposes a portion of the thin base oxide layer. An N– base ion implantation step (Step 37) is then performed through opening 102B to implant a base region 103 into P– well 51B. This implant step may, for example, be an implant of phosphorous at 100 KeV with a dose of 2-3E13 $cm^2$. After the N– base implant step is completed, the photoresist mask is stripped away (Step 38).

Figure 11A:
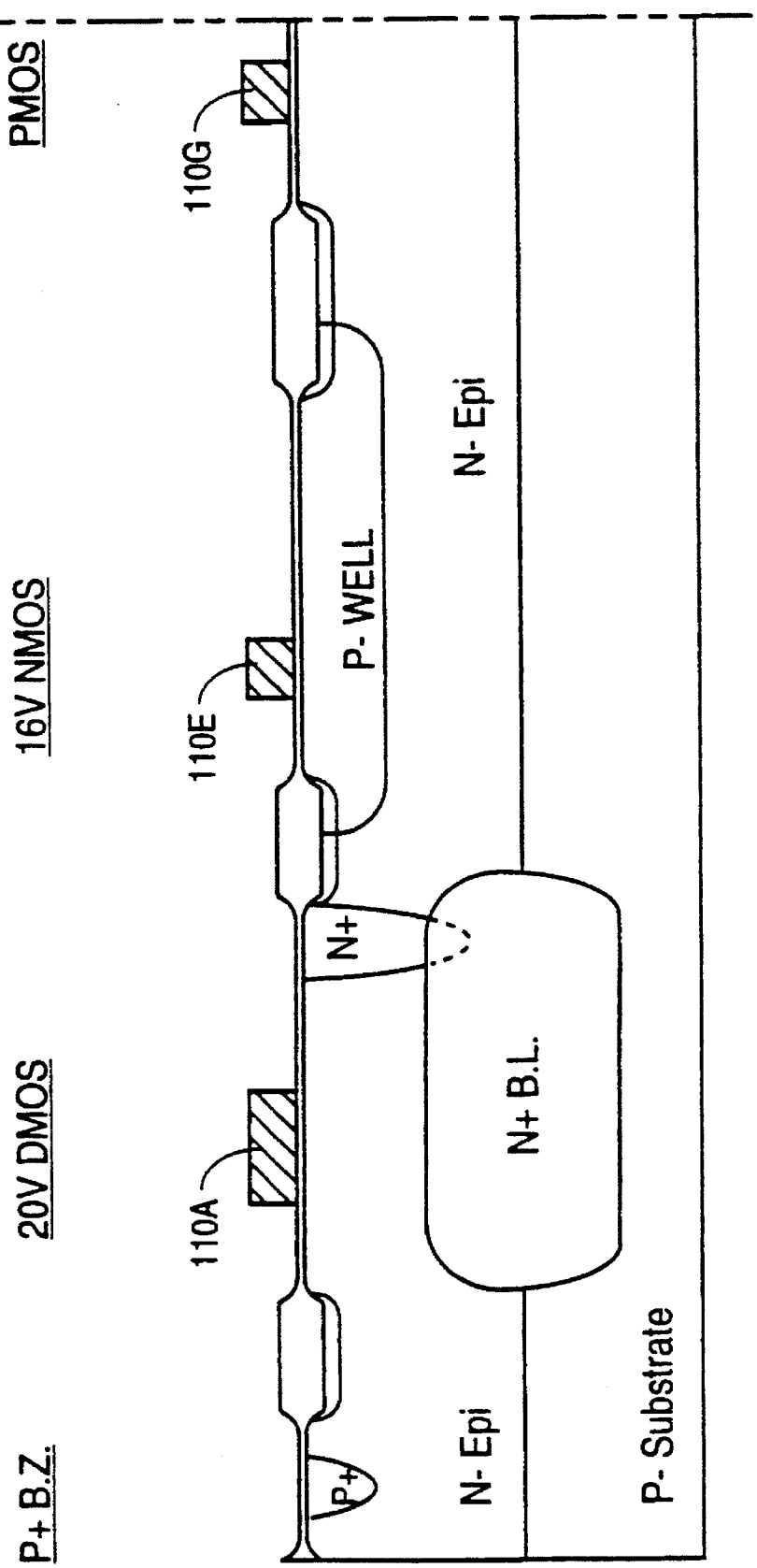
Figure 11B:
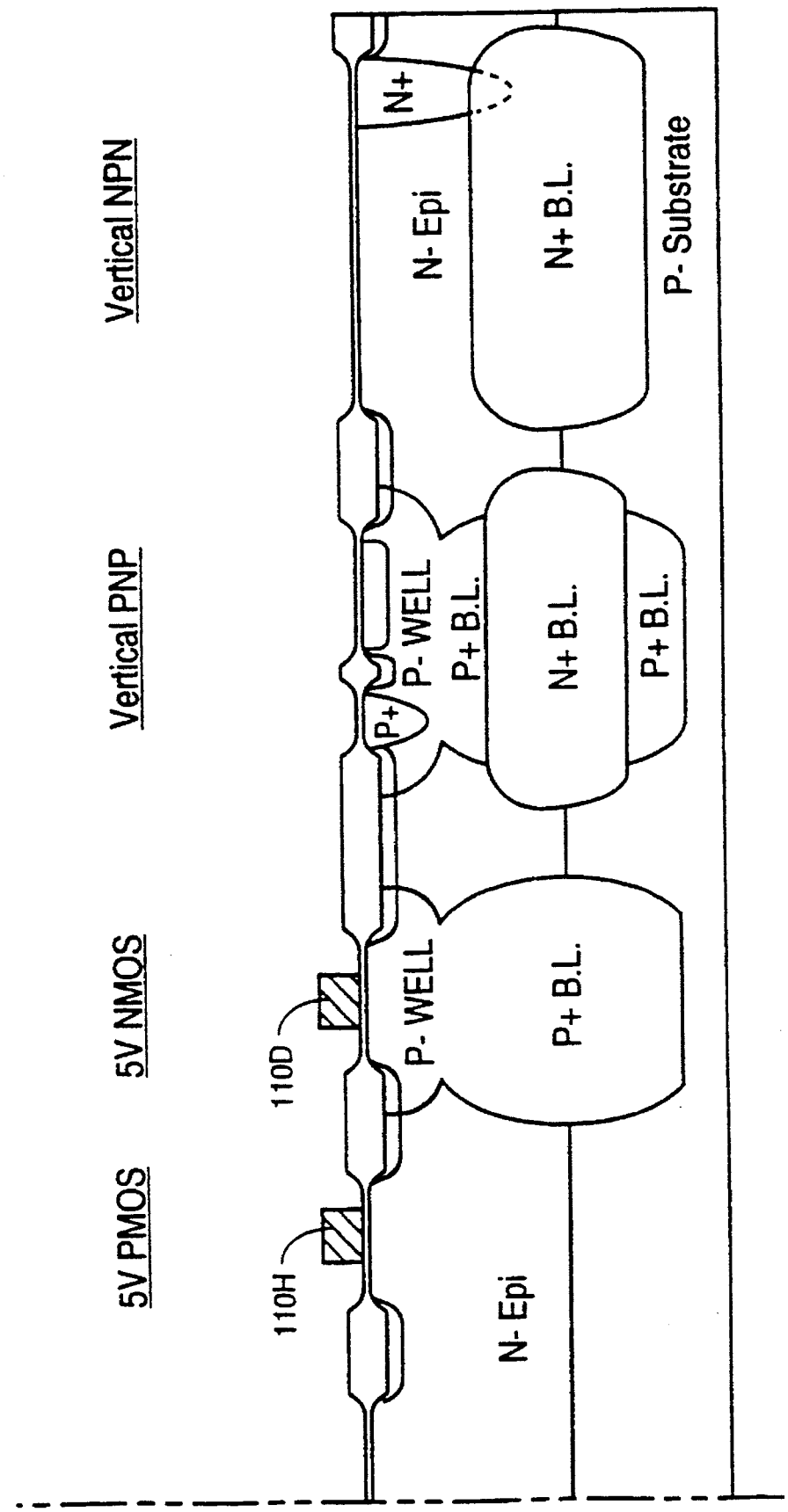

FIGS. 11A and 11B show a subsequent illustrative stage in the BiCDMOS processing method. A layer of polysilicon (not shown) is then deposited (Step 43) over the structure to have a thickness of approximately 4000 Angstroms. The polysilicon layer may then be doped. In some embodiments, a layer of $POCl_3$ may be predeposited (Step 48) and phosphorous from the $POCl_3$ diffused down into the polysilicon until the polysilicon has a conductivity of approximately 10-30 ohms per square. In other embodiments, an implant step may be used to implant Arsenic at 80 KeV at a dose of 5E15 $cm^2$ into the polysilicon.

A layer of photoresist (not shown) is then formed over the polysilicon layer and the photoresist formed into a polysilicon mask (Step 49). A polysilicon etch then forms polysilicon gates 110A, 110E, 110G, 110H and 110D. Polysilicon gate 110A is a gate of a DMOS transistor, polysilicon gate 110E is a gate of a relatively high voltage NMOS transistor, polysilicon gate 110G is a gate of a relatively high voltage PMOS transistor, polysilicon gate 110H is a gate of a relatively low voltage PMOS transistor, and polysilicon gate 110D is a gate of a relatively low voltage NMOS transistor. After the formation of the polysilicon gates, the photoresist mask is stripped away.

Figure 12A:
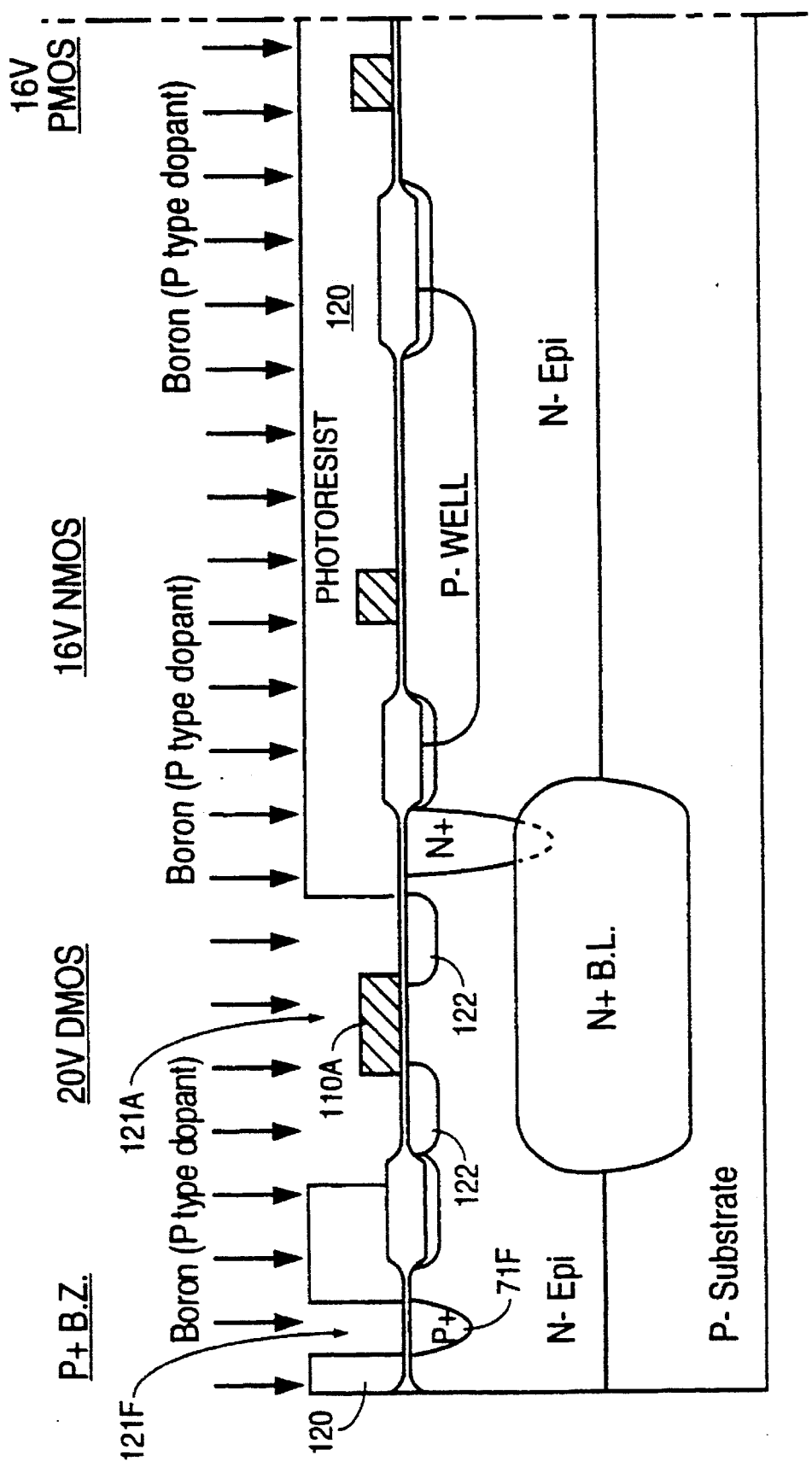
Figure 12B:
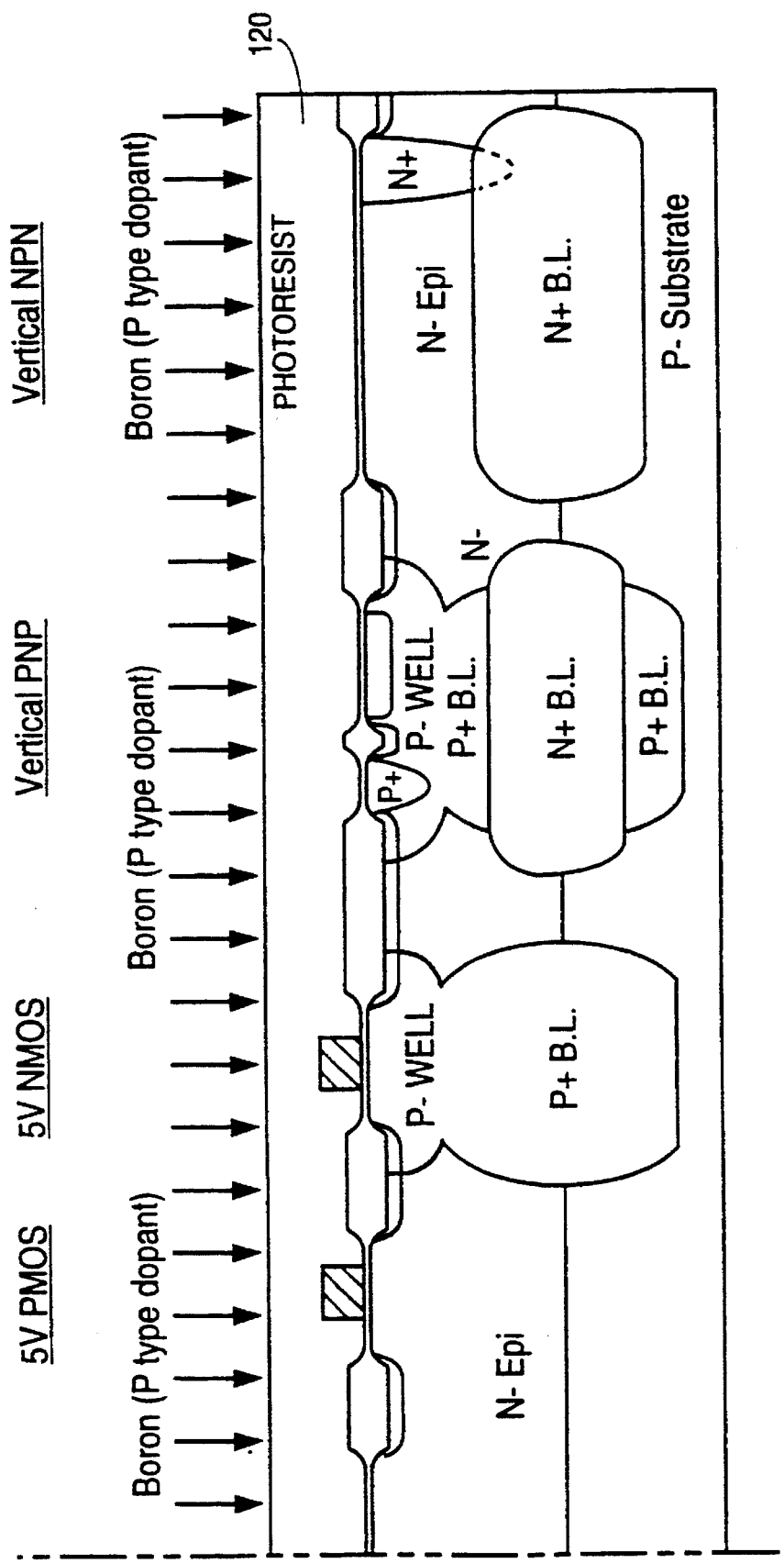

FIGS. 12A and 12B show a subsequent illustrative stage in the BiCDMOS processing method. A layer of photoresist 120 is then formed over the polysilicon gates and the photoresist 120 is formed into a DMOS P– body implant mask (Step 50). The DMOS P– body implant mask has an opening 121A which exposes the polysilicon gate 110A of the DMOS transistor. This mask also exposes a surface area on the upper surface of the epitaxial layer on either side of the polysilicon gate 110A. This mask also has an opening 121F which exposes a portion of the buried zener anode region 70F.

A DMOS P– body ion implantation step (Step 51) is then performed to form a P– body region 122 which is self-aligned with the polysilicon gate 110A of the DMOS transistor. This body region 122 may have an annular shape which surrounds an area of the epitaxial layer underneath polysilicon gate 110A. The outer boundary of this annular body region 122 may, in other embodiments, have other shapes such as polygonal shapes including a square-shape, a rectangular shape, a long strip-like shape, a pentagonal-shape, a hexagonal-shape, et cetera. This DMOS P– body implant step may, for example, be a Boron implant at 60 KeV with a dose of 0.5-1.5E14 $cm^2$. After the P– body region 122 of the DMOS transistor has been implanted, photoresist 120 is stripped (Step 52) and a DMOS P– body drive-in diffusion step (Step 53) is performed to diffuse the P– body region 122 vertically and laterally into the epitaxial layer.

Figure 13A:
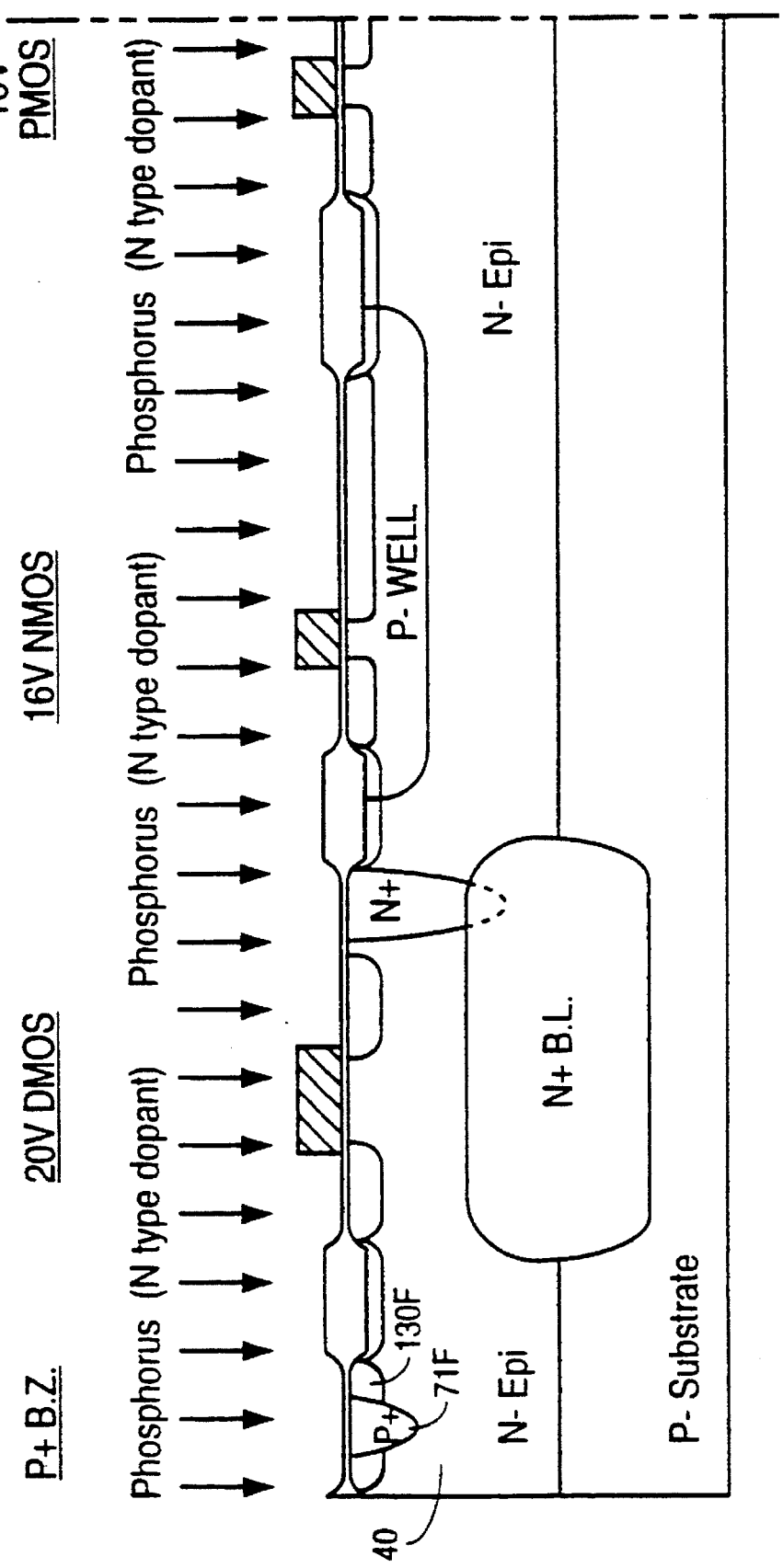
Figure 13B:
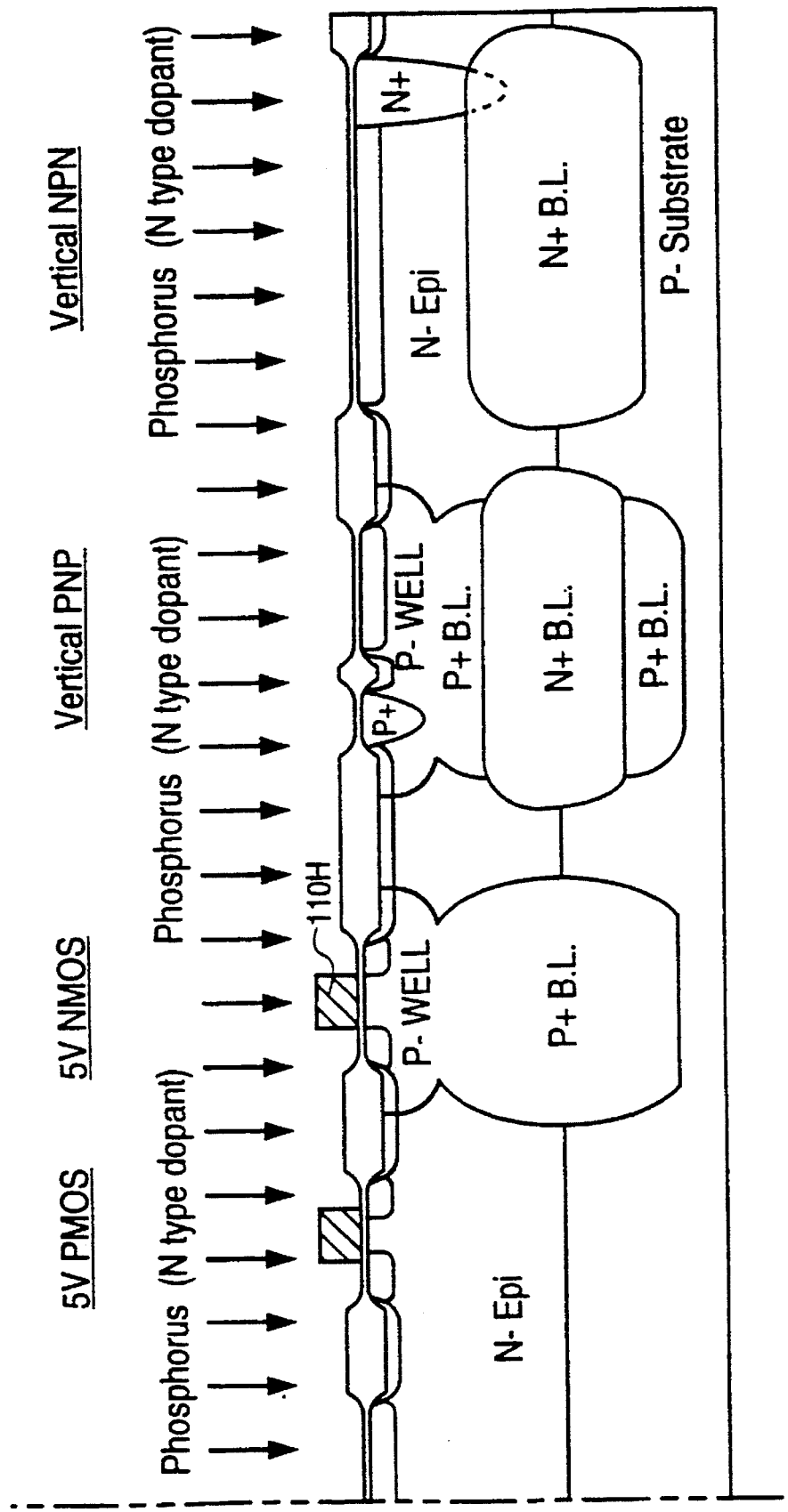

FIGS. 13A and 13B show a subsequent illustrative stage in the BiCDMOS processing method. After the P– body region 122 of the DMOS transistor has been diffused into the epitaxial layer, a blanket N– lightly doped drain ion implantation step (Step 54) is performed. Because no implant mask is used, all portions of the upper surface of the epitaxial layer which are not protected by field oxide layer or a polysilicon gate receive an implant of N type dopants. This blanket N– lightly doped drain implant step may, for example, be a phosphorous implant at 120 KeV with a dose of 0.5–5E12 $cm^2$.

Figure 14A:
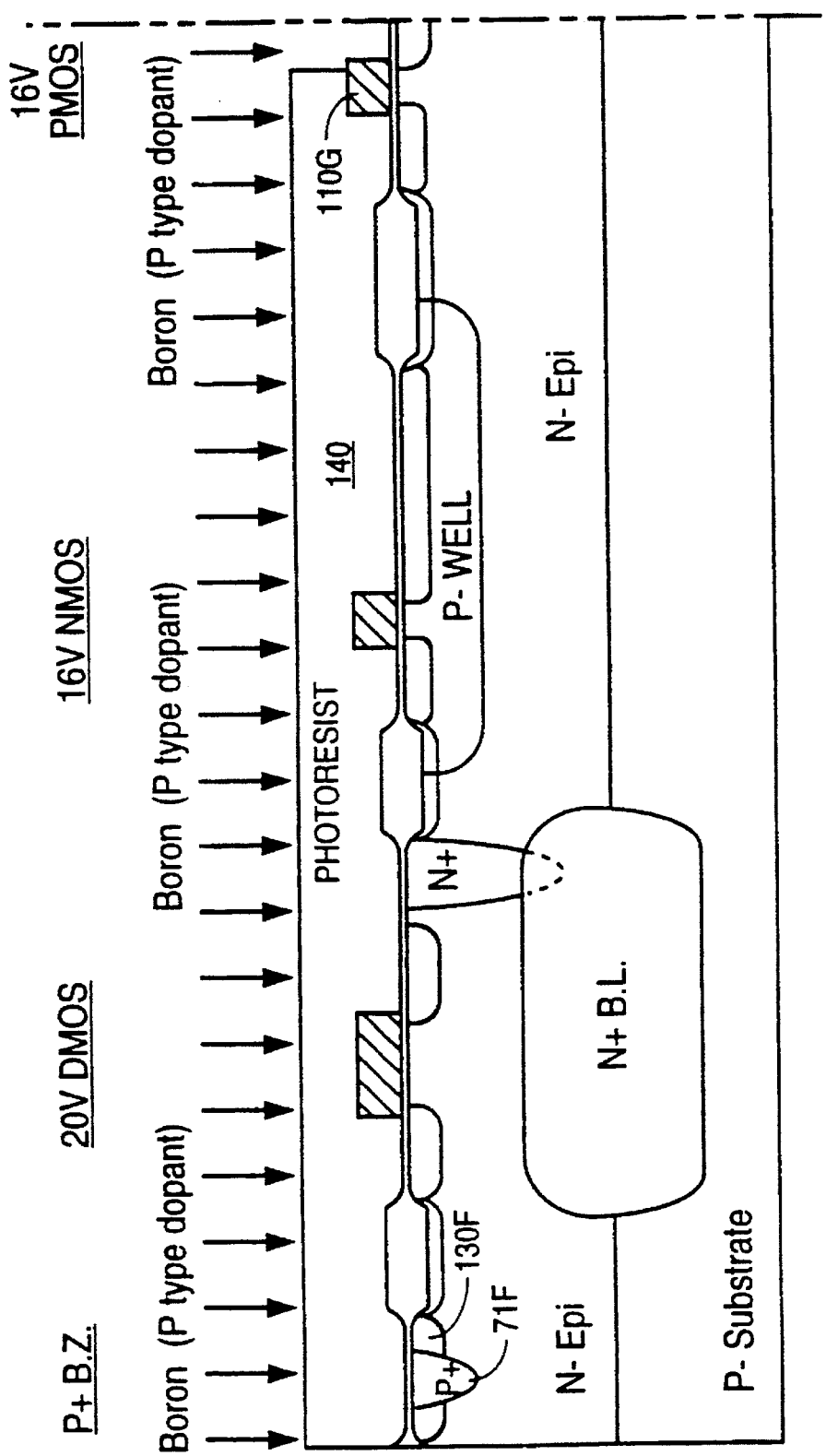
Figure 14B:
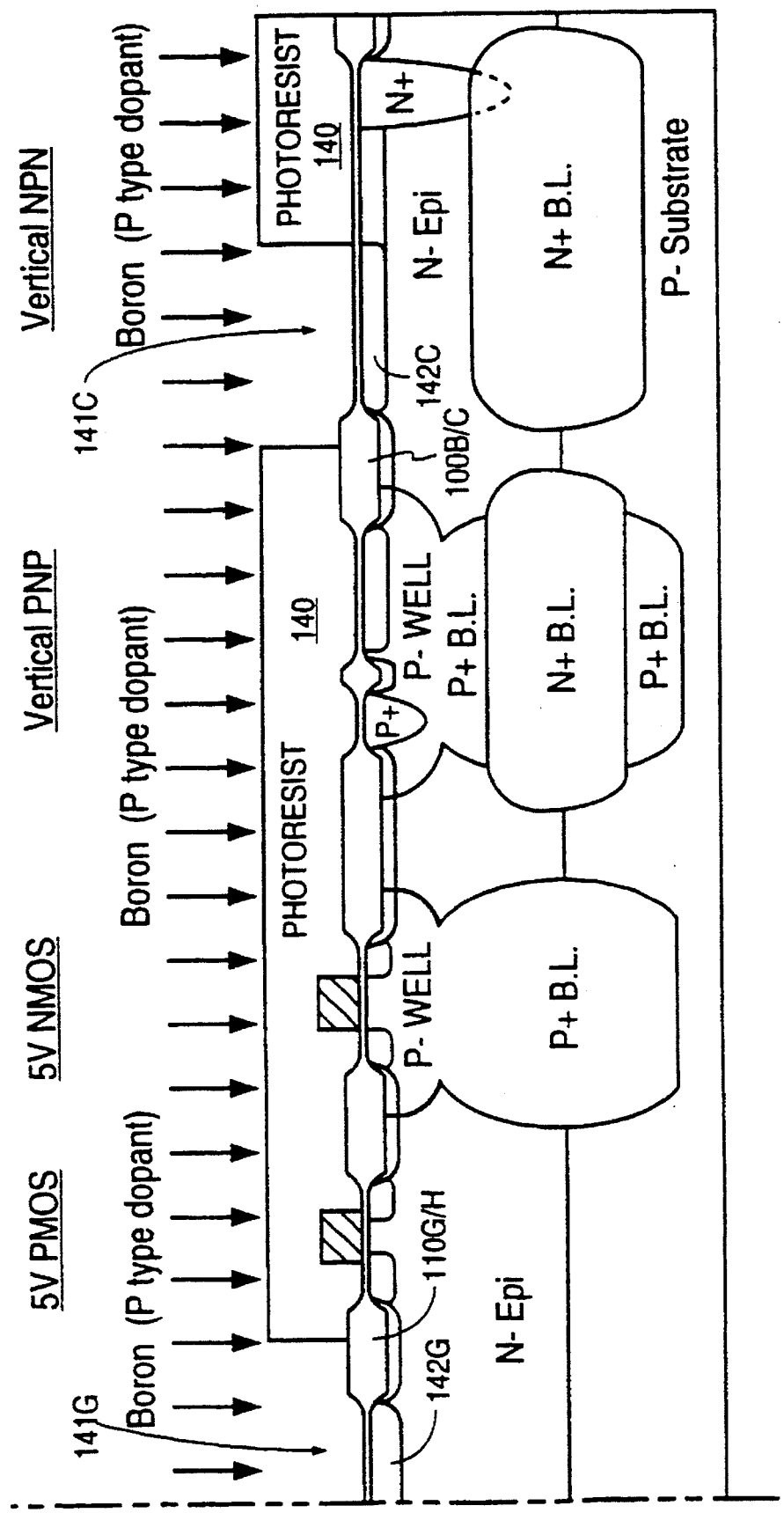

FIGS. 14A and 14B show a subsequent illustrative stage in the BiCDMOS processing method. A layer of photoresist 140 is disposed over the structure of FIGS. 13A and 13B and is then formed into a P– base implant mask (Step 55). In the embodiment shown in FIGS. 14A and 14B, this P– base implant mask has two openings 141G and 141C.

A P– base ion implantation step (Step 56) is then performed through openings 141G and 141C to form a self-aligned lightly doped drain region 142G for the high voltage PMOS transistor and to form a P– base region 142C for the vertical NPN bipolar transistor.

Figure 16A:
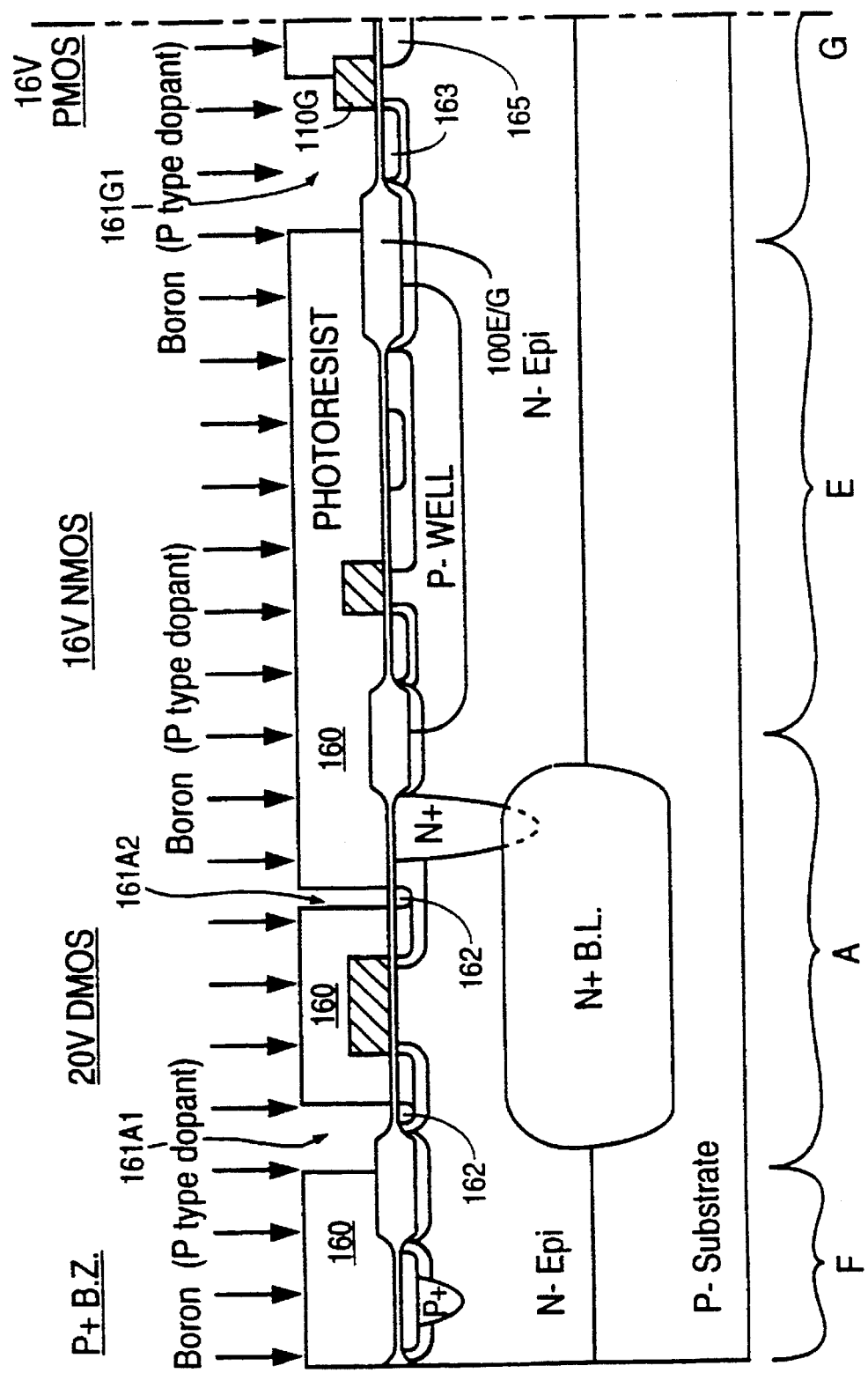

As shown in FIGS. 13A and 13B, this blanket N dopant implant counter-dopes the P-body of the DMOS transistor, counter-dopes the P-base of the NPN transistor, increases the doping concentration of the N-base of the PNP transistor, forms the lightly doped drain of the 16 volt NMOS transistor, and counter-dopes the source and drain of the 5 volt and 16 volt PMOS transistors. Since the dopant concentrations of the P body of the DMOS transistor and the bases of the NPN and PNP transistors are critical to performance, the effect of this blanket N-doping must be analyzed. More specifically, the blanket implant of N-dopants into the base of an NPN transistor raises the N base concentration thus degrading the gain of the NPN transistor and reducing its base resistance. In the case of the counter-doping of the DMOS body and the NPN transistor base, the P-body dopant implant for the DMOS transistor and the P-type base implant for the NPN transistor have to be selected to compensate for this N-dopant blanket implant. Thus, with proper selection of the doping levels of the regions of the various transistors, the N-doping of the blanket implant can be used to create an N-type drift region necessary to increase the breakdown voltage of the 16 volt NMOS transistor shown in FIG. 16A without degrading any of the other transistor operating characteristics. This N-lightly doped drain region of the 16 volt NMOS transistor in FIG. 16A is thus formed with no additional cost or mask count. Since the 5 volt NMOS transistor is formed without a drifted drain, the 5 volt NMOS transistor has a lower on-resistance than the 16 volt NMOS transistor shown in FIG. 16A. This drift region also has an advantage in reducing hot carrier/hot electron formation in the 16 volt NMOS transistor, thereby improving its reliability.

In another embodiment, the position of the 16 volt NMOS gate in FIG. 13A can be placed in a more centered position to enable the formation of both a lightly doped source and a lightly doped drain region. Consequently, in FIG. 15A, the N dopant mask would be formed to allow the N+ source and drain to be formed at a distance from the gate. The drifted source in combination with the drifted drain allows an increased voltage to be applied between the source and drain, as well as between the source and gate. The drifted source, however, causes the NMOS transistor to have a higher on-resistance.

A portion of polysilicon gate 110G and a portion of field oxide region 110G/H is exposed by opening 141G so that a boundary of the lightly doped drain region 142G is self-aligned with a boundary of the polysilicon gate 110G and so that another boundary of the lightly doped drain region 142G is self-aligned with a boundary of the field oxide region 110G/H. Similarly, opening 141C exposes a portion of field oxide region 110B/C so that a boundary of base region 142C is self-aligned with a boundary of the field oxide. This P– base implant step may, for example, be a Boron implant at 100–150 KeV with a dose of 5–9E12 cm$^2$. In other embodiments, the P– base implant step may include a second Boron implant at 40 KeV with a dose of 0.5–5E14 cm$^2$ in addition to the deeper higher energy implant. After the implant step is completed, the P– base implant photoresist mask is stripped away (Step 57).

Figure 15A:
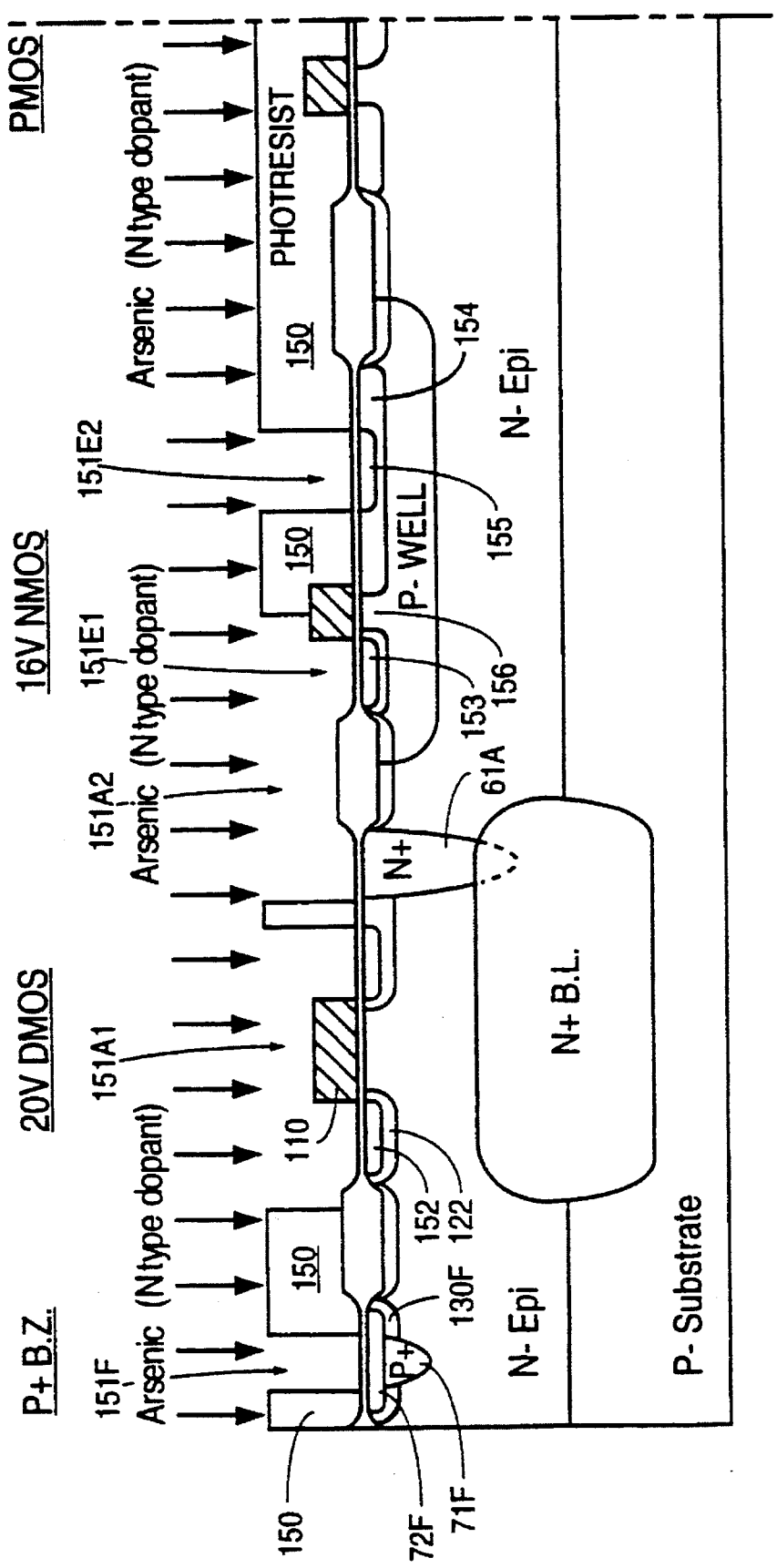
Figure 15B:
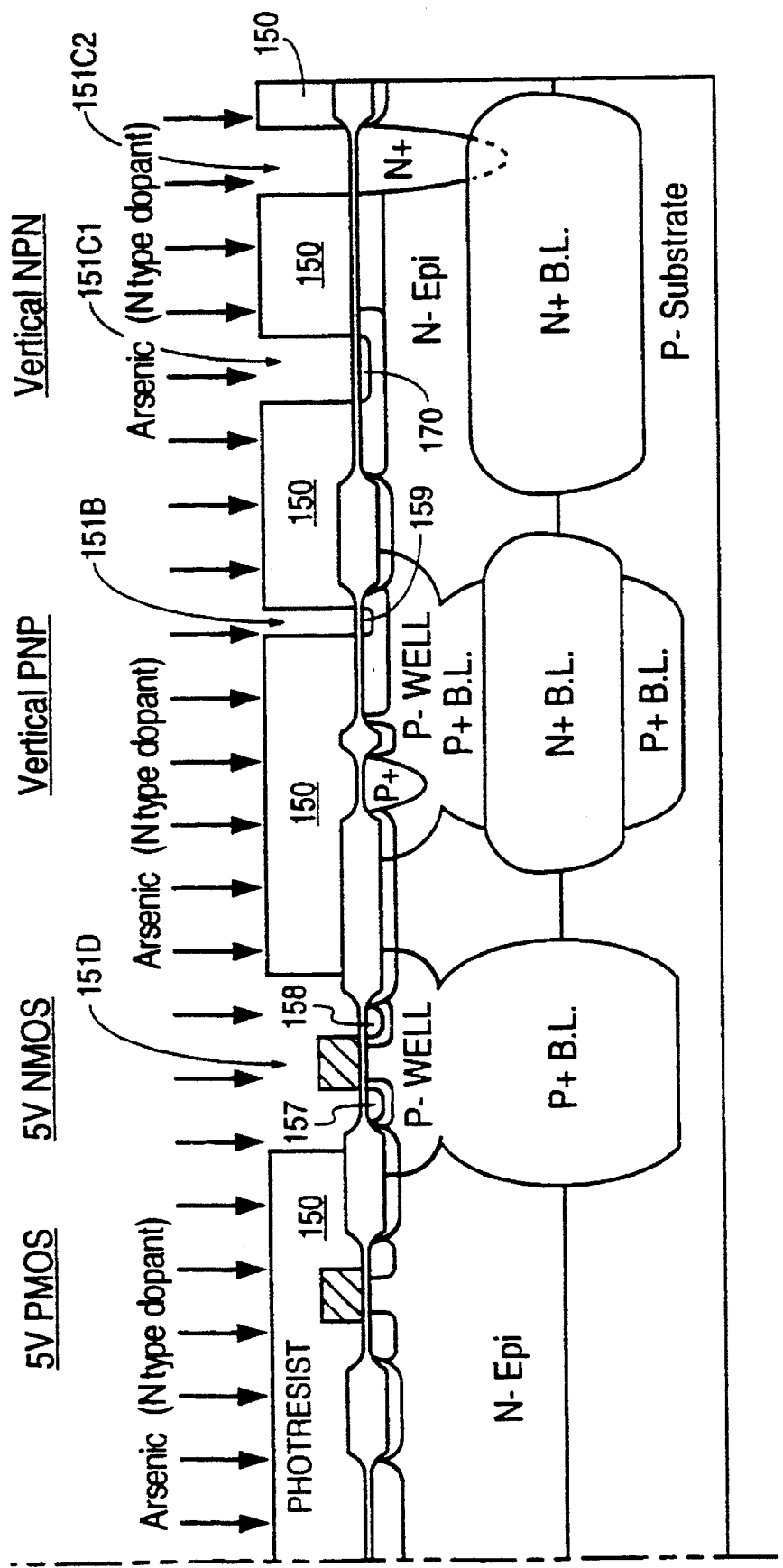

FIGS. 15A and 15B show a subsequent illustrative stage in the BiCDMOS processing method. A layer of photoresist 150 is disposed over the structure and is formed into a N+ source/drain and emitter implant mask (Step 58). In the embodiment shown in FIGS. 15A and 15B, this N+ source/drain and emitter implant mask has openings 151F, 151A1, 151A2, 151E1, 151E2, 151D, 151B, 151C1 and 151C2. Opening 151F is located over the P+ anode portion 71F of the buried zener diode so that a subsequent implantation of N+ dopants will form a buried diode junction with an overlying N+ cathode region 72F. Opening 151A1 is formed over region A of the epitaxial layer where the DMOS transistor is being formed. Opening 151A1 exposes the polysilicon gate 110A of the DMOS transistor as well as a portion of the P– body region 122 of the DMOS transistor. A subsequent N+ implant will therefor form an N+ source region 152 within P-body region 122. Opening 151A2 is located over the upper surface of N+ sinker 61A to increase the N doping of this region. Opening 151E1 exposes a source area on the upper surface of the epitaxial layer as well as a portion of the polysilicon gate 110E so that a subsequent N+ implant step will form a self-aligned source region 153 for the high voltage NMOS transistor. Opening 151E2 exposes a drain contact area on the upper surface of the previously lightly doped drain region 154 so that a drain contact region 155 can be formed laterally separated from a channel region 156 of the NMOS transistor. Opening 151D is located over a region D of the epitaxial layer where the relatively low voltage NMOS transistor is being formed. Opening 151D exposes polysilicon gate 110D as well as a source area and a drain area on the upper surface of the epitaxial layer so that a subsequent N+ implant can form a self-aligned source region 157 and a self-aligned drain region 158 for the low voltage NMOS transistor. Opening 151B is located over the region B of the epitaxial layer where the vertical PNP transistor is being formed. Opening 151B exposes a portion of the previously formed N– base region 103 so that a subsequent N+ implant will form a base contact region 159. Opening 151C1 is located over the region C of the epitaxial layer in which the vertical NPN transistor is being formed. Opening 151C1 exposes a portion of the previously formed P-base region 142C so that a subsequent N+ implant step will form an emitter region 170 for the NPN transistor.

An N+ source/drain and emitter ion implantation step (Step 59) is then performed through the openings in the N+ source/drain and emitter mask. This implant may, for example, be an Arsenic implant at 60 KeV with a dose of 5–8E15 cm$^2$. After the implantation of the N+ ions, the N+ source/drain and emitter mask photoresist is stripped away (Step 60).

Figure 16B:
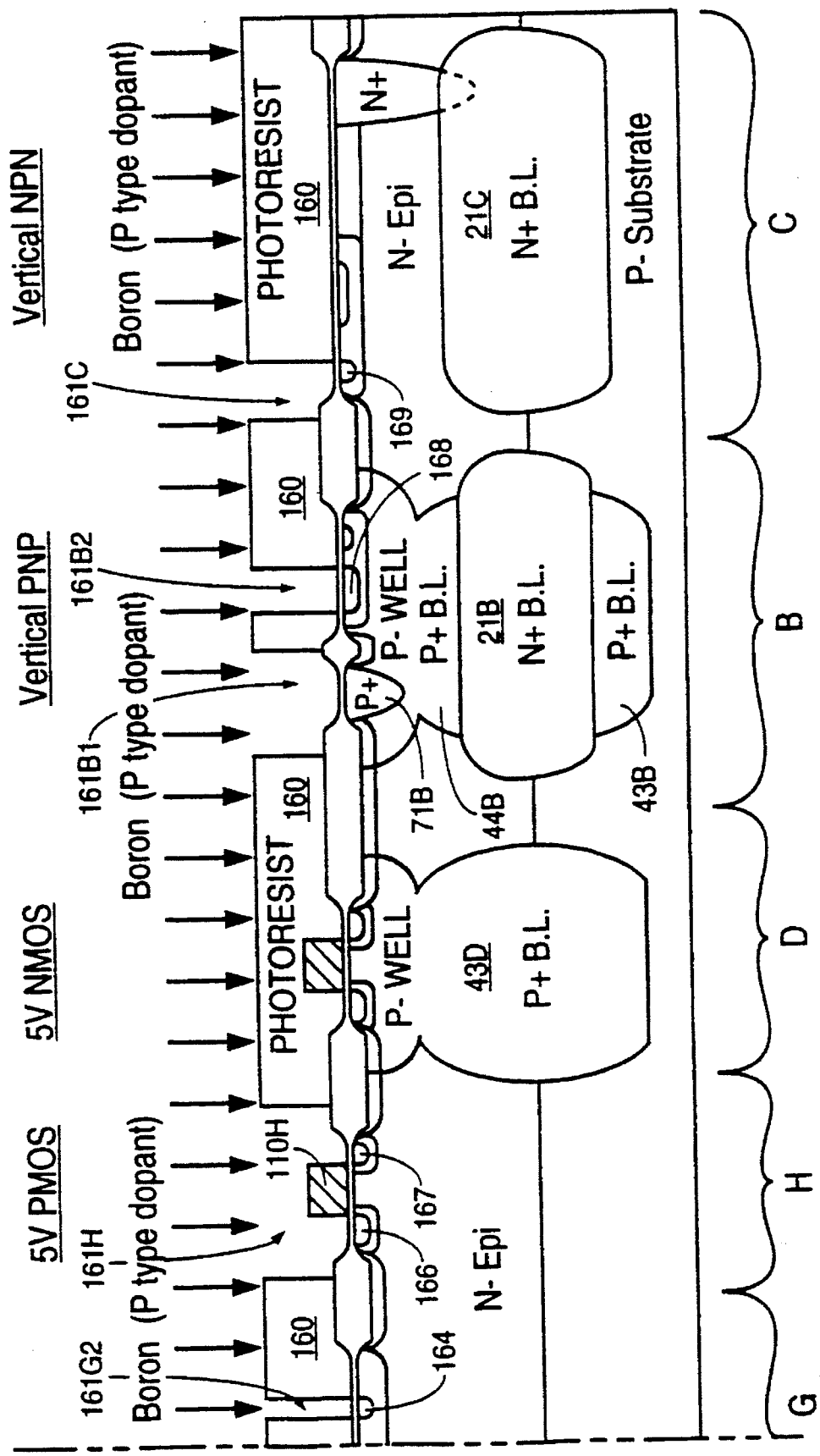

FIGS. 16A and 16B show a subsequent illustrative stage in the BiCDMOS processing method. After a poly reoxidation step (Step 61) is performed, a layer of photoresist 160 is deposited and fashioned into a P+ source/drain and emitter mask (Step 62). In the embodiment shown in FIGS. 16A and 16B, this mask has openings 16A1, 161A2, 161G1, 161G2, 161H, 161B1, 161B2, 161B2, and 161C. Openings 161A1 and 161A2 actually comprise two cross-sectional locations of a substantially annular-shaped opening for formation of an annular-shape P+ body contact region 162 disposed to be in contact with annular-shaped P-body region 122 of the DMOS transistor. Opening 161G1 exposes a portion of field oxide region 100E/G and a portion of polysilicon gate 110G so that a subsequent P+ implant will form a self-aligned source region 163. Opening 1G1G2 exposes an area of the upper surface of drain region 142G so that a subsequent P+ implant step will form a small drain contact region 164 which is laterally spaced from a lateral boundary of polysilicon gate 110G by a drift region 165. Opening 161H exposes polysilicon gate 110H as well as portions of the upper surface of the epitaxial layer between polysilicon gate 110H and field oxide regions 100G/H and 100H/D so that a subsequent P+ implant will form self-aligned source region 166 and drain region 167. Opening 161B1 extends from field oxide region 100D/B to field oxide region 100B so that a subsequent P+ implant step will add additional P type dopants to P+ collector contact region 71B. Opening 161B2 exposes a surface area of base region 103 so that a subsequent P+ implant will form an emitter region 168 which is formed within region base region 103 but is laterally spaced from base contact region 159. Opening 161C exposes a small surface area of base region 142C so that a subsequent P+ implant step will form a base contact region 169 within base region 142C but laterally spaced from emitter region 170.

A P+ source/drain and emitter ion-implantation step (Step 63) is then performed through these openings in mask 160. This implant may, for example, be a Boron implant at 60 KeV with a dose of 3E15 cm$^2$. After the implant, the photoresist mask 160 is stripped away.

Figure 17:
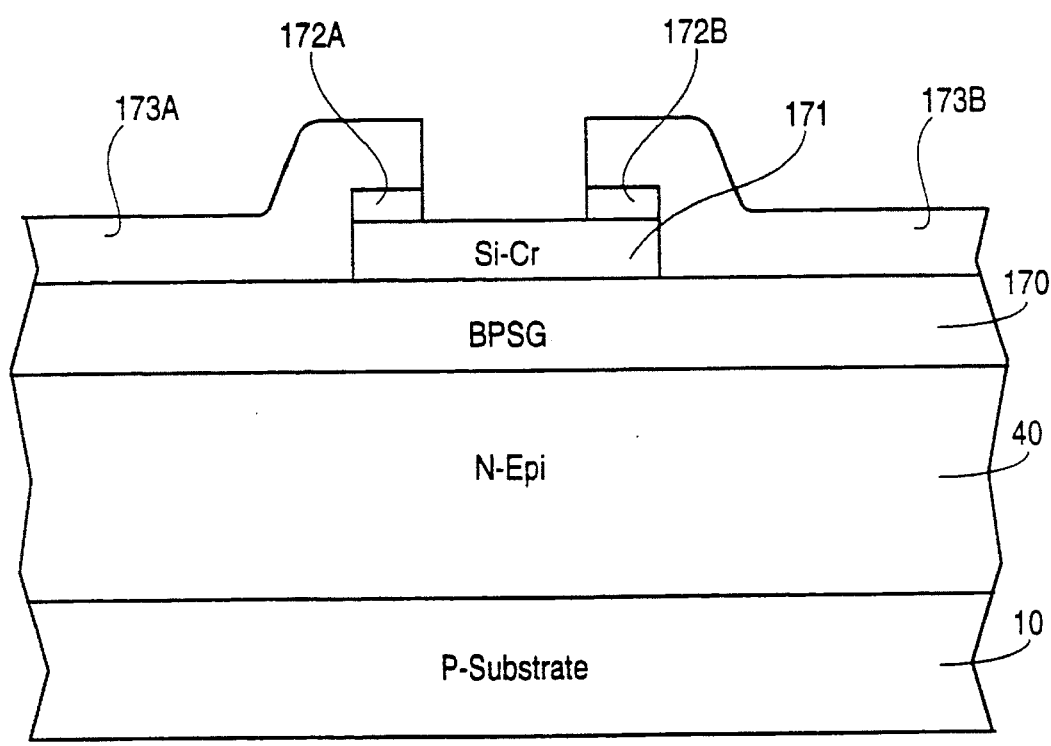
FIG. 17 is a cross-sectional view of one embodiment of a thin-film resistor structure according to the present invention.

FIG. 17 is a cross-sectional view of a thin film resistor structure which may be formed by the BiCDMOS process. In embodiments of the process in which such a resistor structure is formed, a layer of Boron-Phosphorous Silicon Glass (BPSG) 170 is deposited (Step 64) and reflowed (Step 65) at a temperature of 900°–950° C. over the epitaxial layer 40. A layer of Silicon-Chromium (Si-Cr) is then deposited (Step 66) over the BPSG layer. The BPSG layer may, for example, have a thickness of approximately 6500 Angstroms. The Si-Cr layer may, for example, have a thickness of approximately 200–300 Angstroms and have a resistivity of about 2 KOhms per square. A layer of Titanium-Tungsten (Ti-W) is then sputtered over the top of the Si-Cr layer. This Ti-W layer may, for example, have a thickness of approximately 1000 Angstroms. A photoresist layer (not shown) is then deposited over the top of the Ti-W and the photoresist is fashioned into a thin film mask which covers the resistor being formed. A etchant is then used to remove all portions of the Ti-W which are unprotected by the mask. A second etchant is used to remove all portions of the Si-Cr which is unprotected by the photoresist mask. The resulting structure (not shown) is a sandwich having an underlying resistor layer region of resistive Si-Cr and an overlying conductive layer of Ti-W. The photoresist mask is then stripped away.

A layer of interconnect metal such as aluminum is then deposited (Step 68) over the Ti-W layer of the structure. The interconnect metal layer may, for example, be a 0.8 μm thick layer of Aluminum doped with 1 percent Silicon and 0.5 percent copper. This deposition of interconnect metal is the same metallization step which deposits interconnect metal elsewhere on the die to interconnect various of the transistor and other structures formed in the above described steps.

A photoresist layer is then formed over the interconnect metal layer and the photoresist layer is fashioned into a metal mask (Step 69). This metal mask leaves a portion of the Ti-W unprotected between two protected portions of Ti-W. Accordingly, when a subsequent metal etch step is performed to form the metal interconnect lines and connection elsewhere on the chip, the metal etchant cuts through the exposed portion of the aluminum layer overlying the Ti-W and then also cuts through the Ti-W below. As a result, a portion of the underlying resistive Si-Cr does not have a conductive Ti-W layer covering it. One end of this portion of resistive Si-Cr region 171 is connected to a metallized aluminum interconnect 173A via a first portion of Ti-W 172A whereas a second end of the resistive Si-Cr region 171 is connected to a second metallized aluminum interconnect 173B via a second portion of Ti-W 172B.

An insulating oxide layer is then deposited over the metal interconnect in the thin film resistor region and elsewhere on the die. This insulating oxide may, for example, be a deposited TEOS oxide (Step 70) having a thickness of approximately 7000 Angstroms capped with a 600 Angstrom TEOS oxide. After a via masking step (Step 73) is performed to form openings through the insulating oxide layer down to various selected locations in the underlying structure, a second layer of interconnect metal may be sputtered (Step 74) onto the insulating oxide layer to be masked and formed (Step 75) into a second level of metal interconnect.

A passivation layer (Step 76) is then formed over the entire top surface of the structure. This passivation layer may, for example, be a 8000 Angstrom thick layer PSG, a sandwich of 2000 Angstroms of undoped PSG and a 6000 Angstrom 4 percent PSG, or a 8000 Angstrom thick layer of PE CVD nitride. The BiCDMOS process of one embodiment of the present invention is then completed after a pad masking and etch step (Step 77) forms openings in the passivation layer to expose metal bonding pads for wire bonding through the overlying passivation layer.

According to one aspect of the above-described BiCDMOS process, relatively deep body regions of DMOS transistors are diffused into the epitaxial layer at relatively high temperatures without causing dopants from the polysilicon gates of CMOS transistors to pass through their gate oxides and into the underlying epitaxial layer. As shown in FIGS. 12A and 12B, polysilicon gate 110A is used as an implant mask when body region 122 of the 20 volt DMOS transistor is implanted. A polysilicon gate 110H, which is formed at the same time that polysilicon gate 110A of the DMOS transistor is formed, is also used in the fabrication of the 5 volt PMOS transistor as an implant mask when the source and drain regions of the PMOS transistor are implanted as shown in FIGS. 16A and 16B. As a result of having the polysilicon gate doped heavily with phosphorous (or arsenic which prevents boron diffusing through the gate oxide and changing the threshold voltage of the 5 volt p-channel MOSFET), both the DMOS transistor and the CMOS transistor can be reliably made on the same wafer at the same time using a minimum number of processing steps, without dopants from the polysilicon gates of the CMOS transistors passing through the overlying gate oxide and reducing the yield of functioning parts.

According to another aspect of the BiCDMOS process, a blanket ion implantation step is used to dope a lightly doped drain of a high breakdown voltage CMOS transistor when the high breakdown voltage CMOS transistor is fabricated on the same wafer as a relatively low breakdown voltage CMOS transistor. As shown in FIGS. 13A and 13B, the polysilicon gate 110E of the 16 volt NMOS transistor and the polysilicon gate 110H and the 5 volt PMOS transistor are used as a mask in a N type dopant blanket ion implantation step of FIGS. 13A and 13B. Accordingly, a lightly doped drain region 154 of the high voltage NMOS transistor is formed. Subsequently, however, in the P type implant step shown in FIGS. 16A and 16B, the source region and the drain region 166 and 167 of the 5 volt PMOS transistor must be doped with P type dopants to overcome the N type dopants of both the blanket ion implant step of FIG. 13A and 13B and also the N type dopants of the epitaxial layer. To eliminate a process mask, the BiCDMOS process initially starts with an unusually lightly doped epitaxial layer having a N doping of approximately $5 \times 10^{15}$ ions/cm$^3$ to $1 \times 10^{16}$ ions/cm$^3$ so that a subsequent blanket ion implantation step can be used to form the lightly doped drain region 154 of the high voltage NMOS transistor. As a result, the N type blanket ion implantation step does not dope the source and drain regions of the low voltage PMOS transistor so heavily that the P type ion implant step of FIGS. 16A and 16B is inadequate to form the source and drain regions 166 and 167 of the low voltage PMOS transistor.

According to another aspect of the BiCDMOS process, a base region of a bipolar transistor is formed at the same time that a lightly doped drain of a relatively high voltage CMOS transistor is formed. As shown in FIGS. 14A and 14B, the P− base implant region 142C of the vertical NPN bipolar transistor is formed at the same time that the lightly doped drain region 142G of the relatively high breakdown voltage PMOS transistor is formed. Note that the same implant mask is used. The BiCDMOS process therefore allows both a bipolar and also a relatively high voltage CMOS transistor to be fabricated on the same wafer utilizing a small number of processing steps. Note that this sharing of steps also allows subsequent processing steps to be shared. The P type implant step shown in FIGS. 16A and 16B, for example, forms both the base contact region 169 of the vertical NPN bipolar transistor and also forms the drain contact region 164 of the relatively high breakdown voltage PMOS transistor.

According to another aspect of the BiCDMOS process, a buried zener diode is formed on a wafer at the same time that a relatively high breakdown voltage CMOS transistor is formed. As shown in FIGS. 13A and 13B, a blanket N type ion implant is performed to form both a lightly doped drain region 154 of the 16 volt NMOS transistor as well as an N lightly doped zener portion 130F over a P type anode region 71F of a zener diode. Then, in the subsequent N type implant step of FIGS. 15A and 15B, a highly doped N type zener cathode region 72F is formed at the same time that the N type drain contact region 155 and the N type source region 153 of the 16 volt NMOS transistor is formed. The BiCD-MOS process therefore efficiently provides a buried zener diode or alternatively a plurality of matched buried zener diodes on the same wafer as a high voltage CMOS transistor without requiring additional masking and processing steps.

According to another aspect of the BiCDMOS process, burned zener diodes are fabricated in a special way to reduce defects so that multiple zener diodes can be matched to one another. After implanting N type ions into P+ anode region 71F, silicon implant damage is annealed out with a thinner oxide being disposed over the buried zener region than over the other parts of the active region. The oxide thickness over the zener region should be less than 1,000 Angstroms such as, for example, 500 Angstroms. Moreover, the breakdown voltage of the boundary between the lightly doped region 130F and the underlying epitaxial layer is to be high and largely independent of the silicon surface. Dopants from the N+ implant of FIGS. 15A and 15B are therefore implanted approximately 0.4 to 0.5 microns beneath the silicon surface. The depth of P+ anode region 71F is to be 3 to 4 microns whereas the depth of P– body region 122 of the DMOS transistor is to be approximately 1.5 microns deep. The P+ anode region 71F is therefore more heavily doped and the P– body region 122 is more lightly doped so that the very same diffusion steps will cause each region to have its desired depth.

ADDITIONAL STRUCTURES

Figure 18:
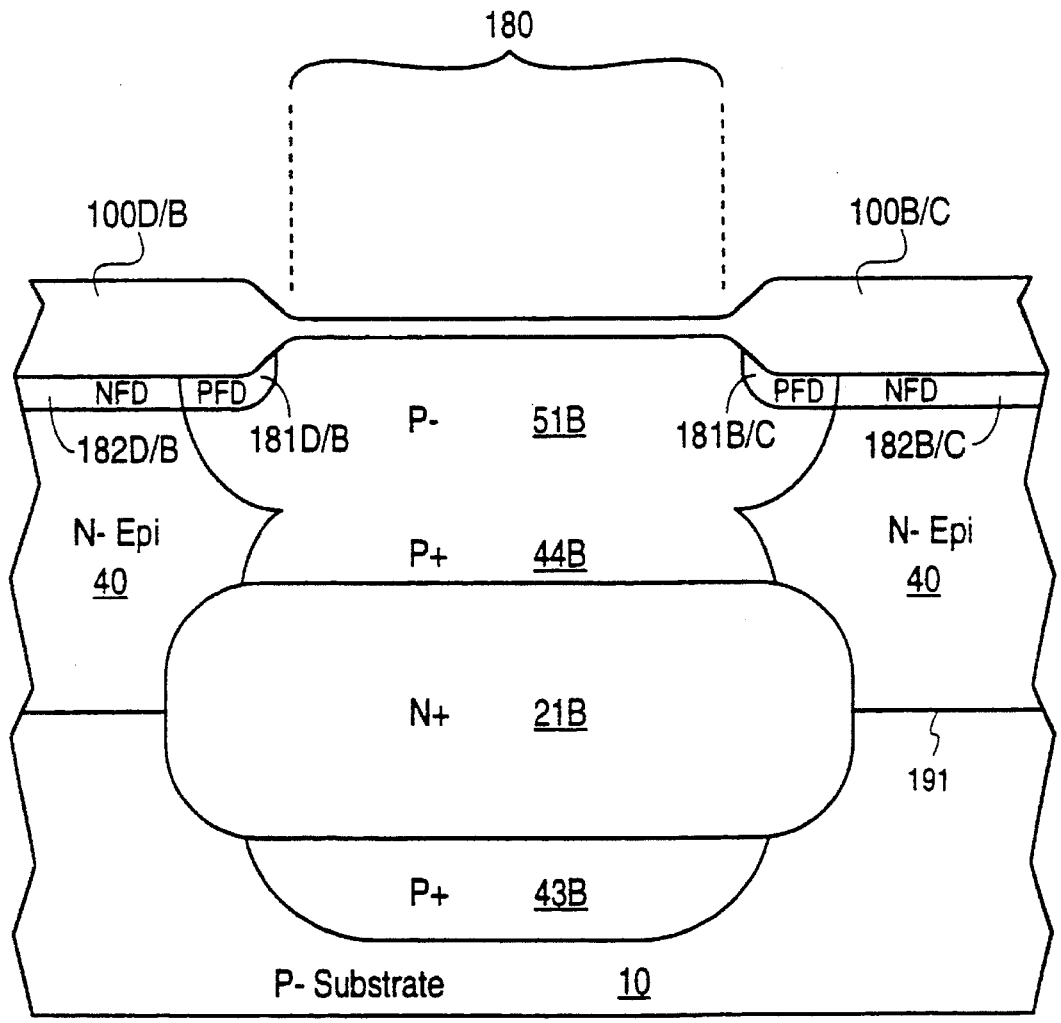
FIG. 18 is a cross-sectional view of one embodiment of an isolation structure according to the present invention.

FIG. 18 is a cross-sectional expanded view of one embodiment of an isolation structure. The vertical PNP bipolar transistor present in region B of FIG. 16B is shown disposed within the isolation structure in FIG. 18. A method for forming the isolation structure of FIG. 18 is therefore set forth in the description of the BiCDMOS process of FIGS. 1A–16A and 1B–16B.

The isolation structure of FIG. 18 comprises N+ buried layer region 21B, first P+ buried layer region 43B, second P+ buried layer region 44B, and P– well region 51B. N+ buried layer region 21B extends downward into substrate layer 10 from the substrate/epitaxial layer boundary 191 and also extends upward into the epitaxial layer 40. First P+ buried layer region 43B extends downward from a bottom surface of N+ buried layer region 21B and P+ buried layer 44B extends upward from an upper surface of N+ buried layer region 21B so that N+ buried layer 21B separates upper buried well region 44B from lower buried well region 43B. P– well region 51B extends downward from the upper surface of the epitaxial layer 40 into the epitaxial layer 40 and makes contact with P+ buried well region 44B. P+ buried layer region 44B is therefore called a buried well region.

A field oxide layer, indicated in FIG. 18 as field oxide layer 100D/B and 100B/C, may in some embodiments be provided over the upper surface of epitaxial layer 40. This field oxide layer may be disposed peripherally around the boundary of the P– well 51B at the upper surface of the epitaxial layer 40 to define an active area 180 on the upper surface of the P– well region. A P type field implant region 181D/B and 181B/C may be disposed underneath the field oxide layer 100D/B and 100B/C where the field oxide layer overlies the P– well region 51B. Similarly, an N type field implant region 182D/B and 182B/C may be disposed underneath the field oxide layer 100D/B and 100B/C where the field oxide layer overlies the N– epitaxial layer outside the P– well region.

P– well region 44B is therefore isolated from the underlying substrate 10 by N+ buried layer region 21B and N– epitaxial layer 40. The isolation structure therefore provides an active area on the surface of P– well region 51B where an electrical device such as a transistor may be formed when the semiconductor material in which the transistor sits is to be electrically isolated from other structures on a die. It is to be understood that an N type well may be provided on an N type substrate by changing all P type regions to N type and visa versa.

Figure 19:
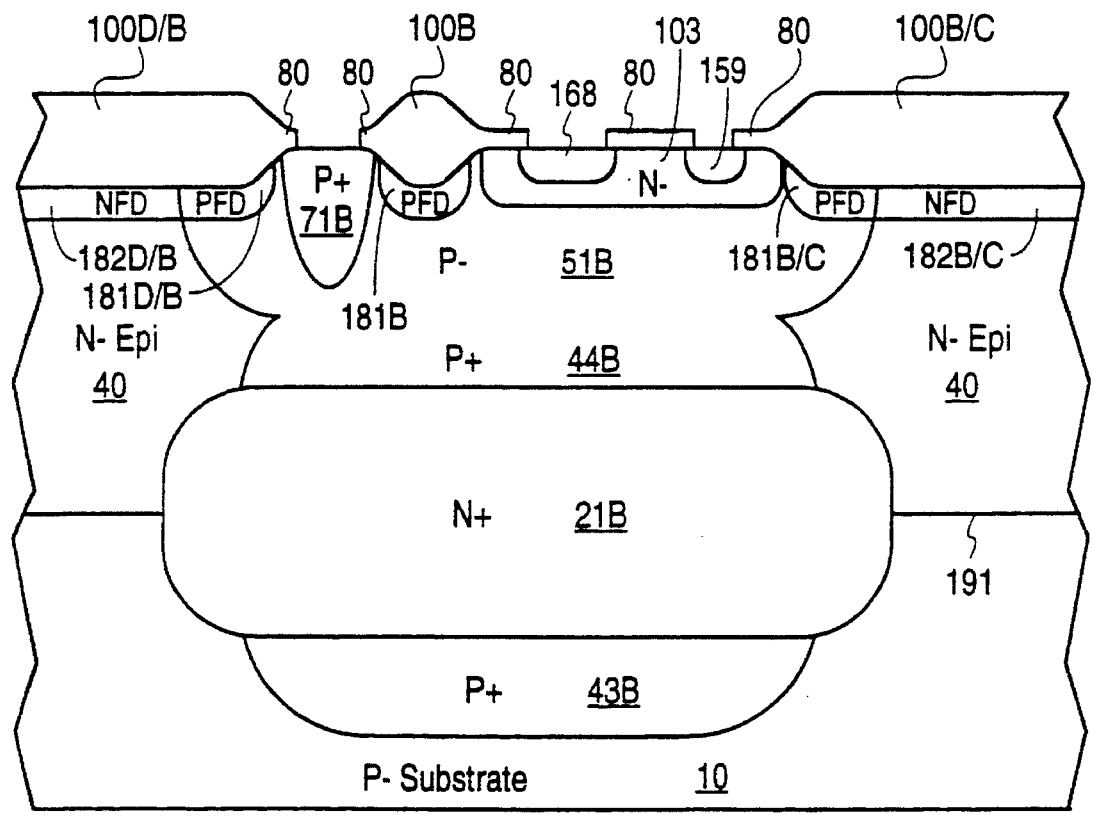
FIG. 19 is a cross-sectional view of one embodiment of a first vertical bipolar transistor structure according to the present invention.

FIG. 19 is a cross-sectional expanded view of the embodiment of a first vertical bipolar transistor structure shown in region B of FIGS. 1A–16A and 1B–16B. P type field implant regions 181D/B, 181B and 181B/C are disposed underneath the field oxide layer 100D/B, 100B and 100B/C, respectively, where the underlying silicon of P– well 51B has a P conductivity type. N type field implant region 182D/B and 182B/C is disposed underneath the field oxide layer 100D/B and 100B/C where the underlying silicon of N– epitaxial layer 40 has an N conductivity type. Collector contact region 71B extends from the upper surface of the epitaxial layer downward into the P– well region 51B. In the embodiment shown in FIG. 19, P+ collector contact region 71B extends deeper into the P– well region 51B than does the field implant region 181B. N– base region 103 extends from the upper surface of the epitaxial layer downward into the P– well 51B between field oxide 100B and field oxide 100B/C. An N+ base contact region 159 and an emitter region 168 extend down into base region 103 so that emitter region 168 is laterally spaced from base contact region 159. The metal electrodes which make contact with the emitter, base and collector regions of the structure of FIG. 19 have been omitted from the figure for clarity.

Figure 20:
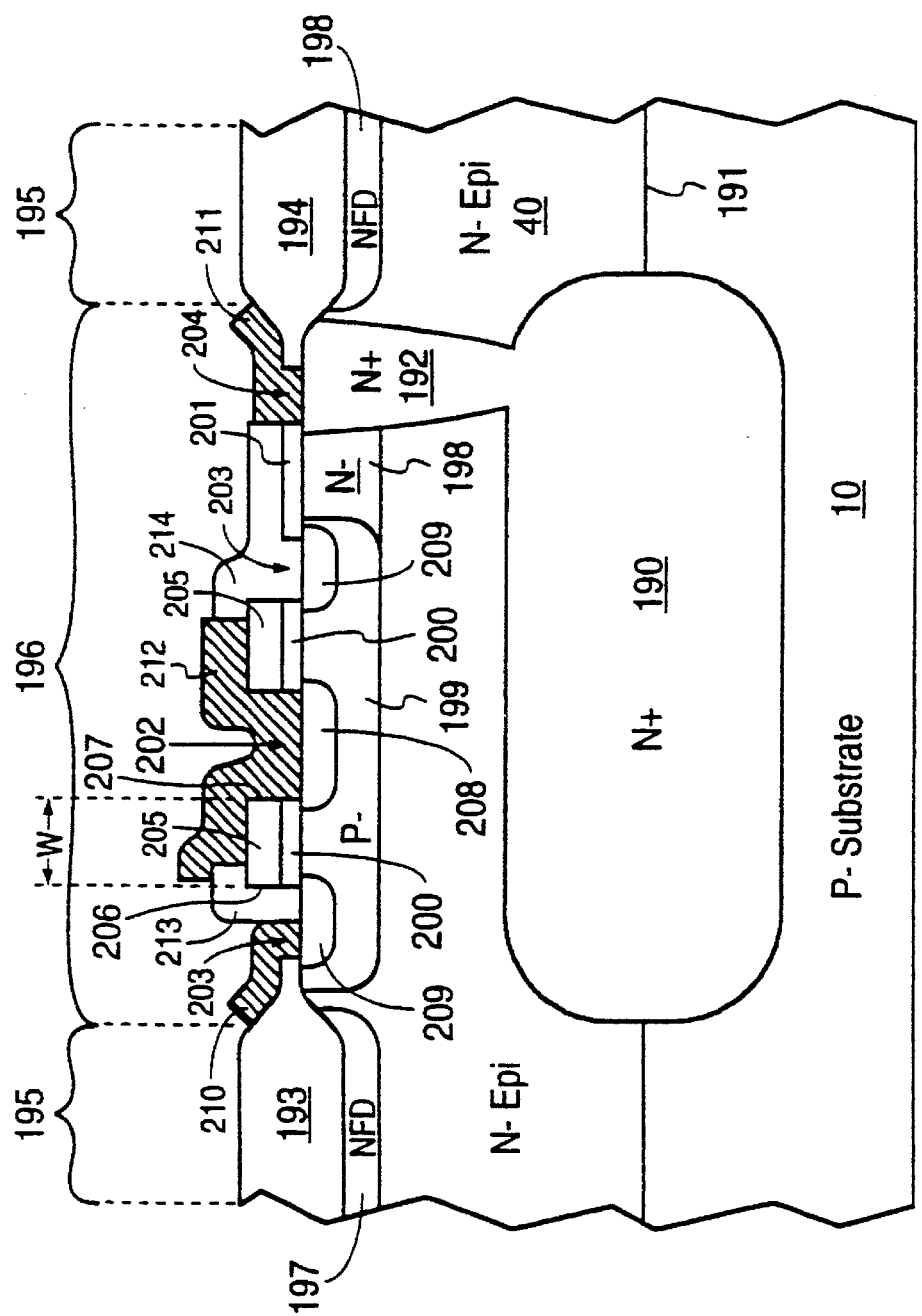
FIG. 20 is a cross-sectional view of one embodiment of a second vertical bipolar transistor structure according to the present invention.

FIG. 20 is a cross-sectional view of one embodiment of a second vertical bipolar transistor structure. An N+ buried layer region 190 similar to N+ buried layer 21C in FIGS. 1A–16A and 1B–16B extends from the substrate/epitaxial boundary 191 upward into the epitaxial layer 40 and downward into the substrate layer 10. An N+ sinker region 192 similar to N+ sinker region 61C extends from the upper surface of the epitaxial layer 40 downward into the epitaxial layer 40 to make contact with the N+ buried layer region 190. A thick field oxide layer 193 and 194 may be formed over a field area 195 of the epitaxial layer 40 to enclose an active area 196 of the epitaxial layer. An N type field implant region 197 and 198 is disposed underneath field oxide layer 193 and 194 between the field oxide and the N– epitaxial layer.

A P– base region 199 extends from the upper surface of the epitaxial layer 40 in the active area 196 downward into the epitaxial layer 40. This P– base region is formed at the same time that P– base region 142C is formed in the processing method of FIGS. 1A–16A and 1B–16B. An N– lightly doped region 198 may optionally be disposed at the upper surface of the epitaxial layer 40 between the N+ sinker region 192 and the lateral extent of P– base region 199. This lightly doped N– region 198 may, for example, be formed in the N– blanket doping step of the processing of FIGS. 1A–16A and 1B–16B.

A gate oxide layer is disposed on the upper surface of the epitaxial layer 40 in the active area 196. This gate oxide layer may be separated into a portion 200 and a portion 201. An emitter contact opening 202 is formed in gate oxide portion 200 so that gate oxide portion 200 surrounds the emitter contact opening 202. A base opening 203 surrounds gate oxide portion 200 so that in the cross-sectional view of FIG. 20, base opening 203 is disposed between gate oxide layer portion 200 and field oxide portion 193 on one side and between gate oxide layer portion 200 and gate oxide layer portion 201 on the other side. A collector contact opening 204 is formed between gate oxide layer portion 201 and field oxide portion 194.

A layer of polysilicon 205 which has the same approximate shape as the underlying gate oxide layer portion 200 is disposed over gate oxide layer portion 200 so that the polysilicon layer 205 and the gate oxide layer portion 200 together form a substantially vertical sidewall 206 and another substantially vertical sidewall 207 down to the upper surface of the epitaxial layer.

An N+ emitter region 208 extends from the upper surface of the epitaxial layer underneath emitter opening 202 downward into base region 199. This emitter region 208 also extends laterally a distance under gate oxide layer portion 200. A base contact region 209 extends from the upper surface of the epitaxial layer underneath base contact opening 203 downward into base region 199. This base contact region also extends laterally a distance under gate oxide layer portion 200. As indicated in FIG. 20, base region 209 may surround the emitter region 208 in a laterally oriented plane.

A base electrode 210 of a conductive material such as aluminum connects to the base contact region 209 through base contact opening 203. Similarly, a collector electrode 211 connects to the N+ sinker region 192 through collector contact opening 204. An emitter electrode 212 connects to the emitter region 208 through the emitter contact opening 202 by extending from a top surface of the polysilicon layer 205 down to the emitter region 208 at the upper surface of the epitaxial layer. An insulating layer 213 and 214 may be disposed at least partly between the polysilicon layer 205 and the base contact electrode 210 to isolate the base electrode 210 from the emitter electrode 212.

The structure of FIG. 20 may be made according to the process of FIGS. 1A–16A and 1B–16B, by forming polysilicon layer 205 at the same time that polysilicon gates 110A, 110E, 110G, 110H and 110D are formed. N+ dopants may be subsequently implanted into the base region 199 to form self-aligned base emitter region 208 and P+ dopants may be implanted into the base region to form self-aligned base contact region 209. Gate oxide 200 may or may not define part of a substantially vertical boundary of the implant mask which defines the boundaries of emitter region 208 and the boundaries of base contact region 209. If the gate oxide 200 is not part of the implant mask, the boundary implant mask may be formed by the boundary of patterned polysilicon layer 205 alone. This method of forming of FIG. 20 vertical bipolar transistor of FIG. 20 enables polysilicon layer 205 to have a minimum line width W for the process being used. Accordingly, the distance between self-aligned base contact region 209 and self-aligned emitter region 208 is minimized. By controlling the distance the base contact region and the emitter region diffuse in a lateral direction, the distance between the base contact region and the emitter region can be reduced still further from minimum line width W in a repeatable and controllable manner. Therefore, because the structure of FIG. 20 facilitates a repeatable and controllable small distance between the base contact region and the emitter region, the structure of FIG. 20 allows the base-to-emitter resistance and capacitance of the resulting bipolar transistor to be minimized. The result is a high frequency transistor with a high frequency cutoff.

Figure 21:
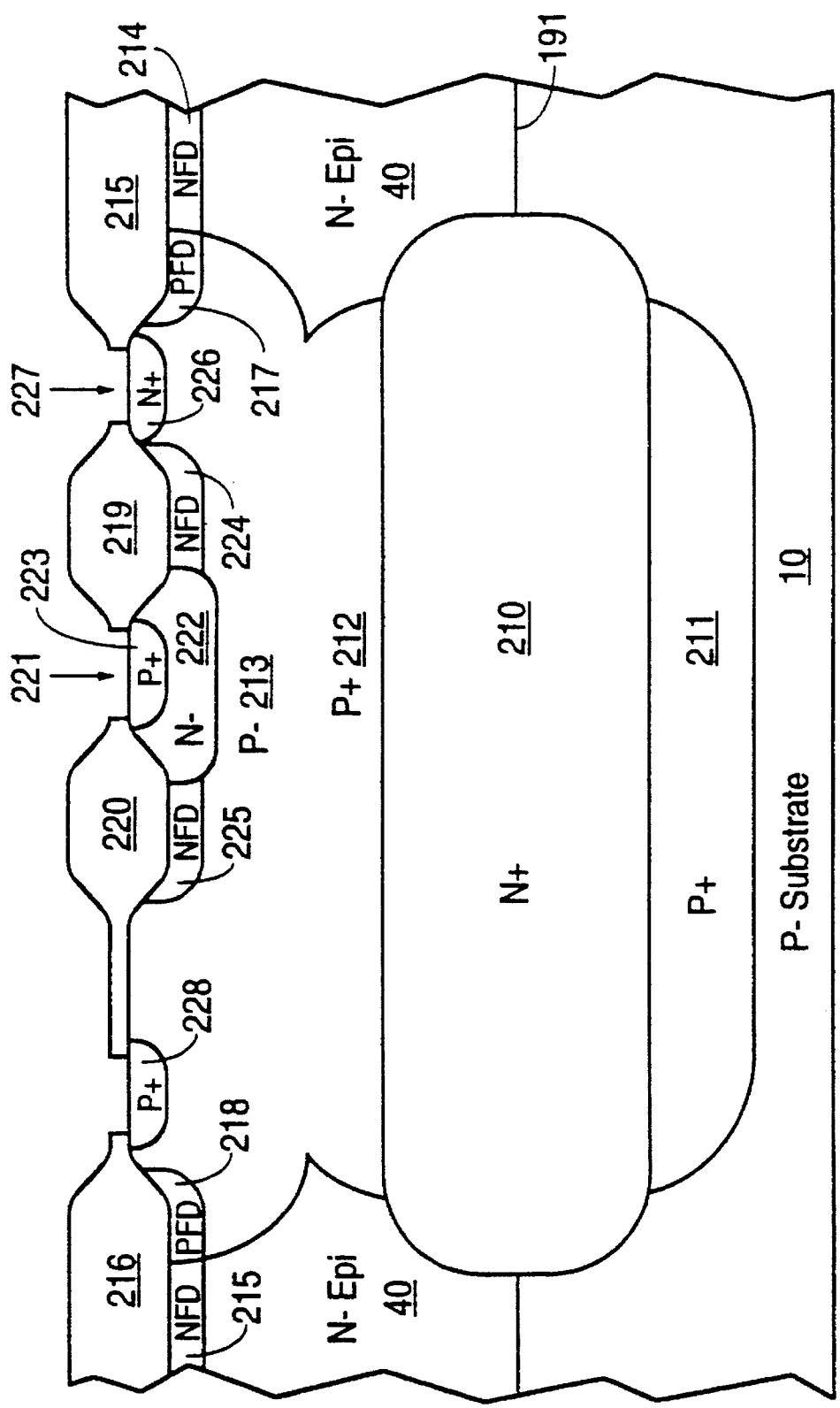
FIG. 21 is a cross-sectional view of one embodiment of a third vertical bipolar transistor structure according to the present invention.

FIG. 21 is a cross-sectional view of one embodiment of a third vertical bipolar transistor structure. An isolation structure similar to the isolation structure of FIG. 18 includes an N+ buried layer region 210 separating a P+ buried layer region 211 from a P+ buried well region 212. A P– well region 213 extends downward from an upper surface of epitaxial layer 40 to contact an upper surface of P+ buried well region 212. An N field implant region 214 and 215 underlies a field oxide layer 215 and 216 where N type semiconductor material of the N– epitaxial layer 40 underlies the field oxide. A P field implant region 217 and 218 underlies the field oxide layer 215 and 216 where the P type semiconductor material of the P– well region 213 underlies the field oxide. In the vertical bipolar transistor of FIG. 21, a field oxide layer 219 and 220 forms an emitter opening 221 at the upper surface of the P– well region 213. An N– base region 222 is formed into the P– well region 213 through opening 221. A P+ type emitter region 223 is later formed into the upper portion of N– base region 222 through the same opening 221. N– base region 222 may, for example, be an implanted region which is implanted during the N– blanket ion implant step shown in FIGS. 13A and 13B. The P+ emitter region may, for example, be formed in the P+ implant step shown in FIGS. 16A and 16B.

An N type implant region 224 and 225 under oxide 219 and 220 forms a lateral contact between N– base region 222 and a laterally disposed N+ base contact region 226. The N type implant region 224 and 225 may, for example, be implanted at the same time that N type field implant region 214 and 215 is implanted. N+ base contact region 226 may, for example, be implanted through an opening 227 in the field oxide in the N+ implant step shown in FIGS. 15A and 15B. A laterally disposed P+ collector contact region 228 is formed into the P– well region 213 so that P– well region 213 serves as a collector of the bipolar transistor and so that collector contact region 228 serves as a collector contact for the bipolar transistor. P+ collector contact region 228 may, for example, be formed in the same processing step that P+ emitter region 223 is formed. Accordingly, P+ emitter region 223 and N– base region 222 are both self-aligned with opening 221 and N+ base contact region 226 is self-aligned with opening 227. The emitter, base, and collector electrodes have been omitted from the figure for clarity of the illustration.

Figure 22:
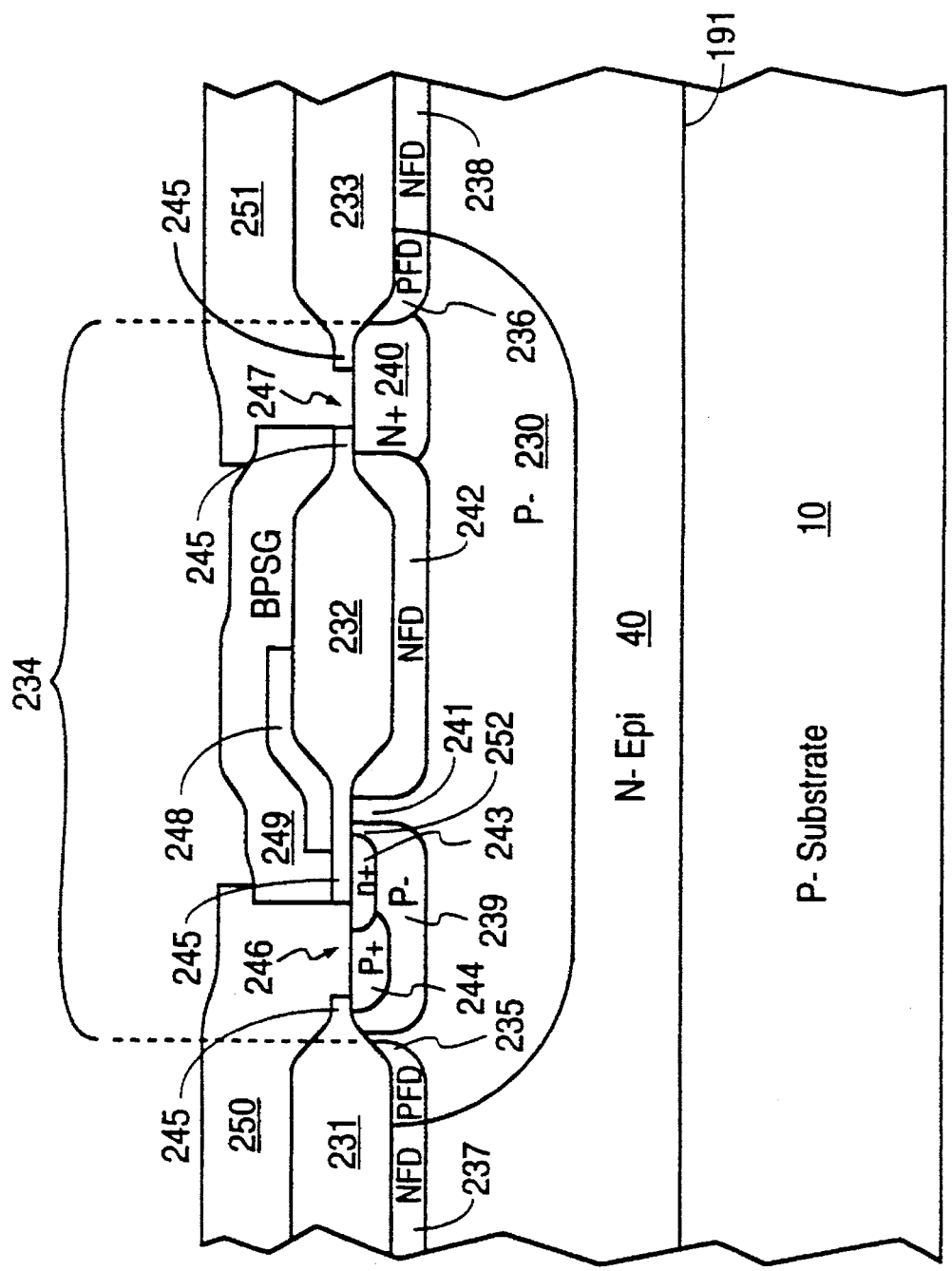
FIG. 22 is a cross-sectional view of one embodiment of a first lateral DMOS structure according to the present invention.

FIG. 22 is a cross-sectional view of a first embodiment of a lateral DMOS transistor structure. N– epitaxial layer 40 having an upper surface is disposed over substrate layer 10. A P– well region 230 extends downward into the epitaxial layer 40 from the upper surface of the epitaxial layer. A field oxide layer, comprised of field oxide portion 231 and 232, and field oxide portion 232, is disposed on the upper surface of the epitaxial layer 40. Field oxide portion 231 and 233 defines an active area 234. A P type field implant region 235 and 236 is disposed underneath field oxide portion 231 and 233 where the field oxide portion 231 and 233 overlies the P– type silicon of the well region 230. Similarly, an N type field implant region 237 and 238 is disposed underneath the field oxide portion 231 and 233 where the field oxide portion 231 and 233 overlies the N– type silicon of the epitaxial layer.

A body region 239, here a P– body region, extends downward into the well region 230 from the upper surface of the epitaxial layer within the active area. A drain contact region 240, here a N+ drain contact region, also extends downward into the well region 230 from the upper surface of the epitaxial layer within the active area. Body region 239 is disposed in the well region 230 to be laterally spaced from the drain contact region 240. A drift region portion 241 of the well region 230 is disposed between the body region 239 and a lightly doped drain implant region 242. The lightly doped drain implant region 242 is disposed between the drift region 241 and the drain contact region 240 so that the lightly doped drain implant region 242 contacts the drain contact region 240. The lightly doped drain implant region 242, here an N type implant region, is disposed underneath field oxide portion 232 in the active area.

A source region 243, here an N+ source region, is disposed within the body region 239 so that the source region 243 extends into the body region 239 from the upper surface of the epitaxial layer. A channel portion 252 of the body region 239 separates the source region 243 from the drift region 241. A source contact region 244, here a P+ source contact region, extends into the body region 239 from the upper surface of the epitaxial layer so that the source contact region 244 contacts the source region 243.

A gate oxide layer 245 is disposed on the upper surface of the epitaxial layer 40 in the active area 234 where field oxide layer 232 is not located. Two openings 246 and 247 are formed in gate oxide layer 245. Opening 246 is located over at least a part of source contact region 244 and over at least a part of source region 243. Opening 247 is located over at least a part of drain contact region 240. A polysilicon gate layer 248 is disposed over the gate oxide layer 245 and the field oxide portion 232 to extend from a location over the source region 243, over a channel portion 252 of the body region 239, over the drift region 241, and up and over a part of field oxide portion 232. An insulating layer 249 made of an insulating material such as Boron Phosphorous Silicon Glass (BPSG) is disposed over the polysilicon gate layer 248 to extend from over the opening 246 in the gate oxide layer 245, over the gate oxide layer 245 over the source region 243, up and over the polysilicon gate layer 248, over the field oxide portion 232, and to opening 247. A source electrode 250 made of a conductive material such as aluminum makes contact with the source contact region 244 and the source region 243 at opening 246. A drain electrode 251 made of this conductive material makes contact with the drain contact region 240 at opening 247. A gate electrode may be connected to polysilicon gate layer 248. Such an electrode is not shown in the plane of the cross-sectional view of FIG. 22.

In operation, a voltage on polysilicon gate layer 248 causes a channel to form in the channel region 252 of the body region 239 between the source region 243 and the drift region 241. Current therefore can flow from the source electrode 250, through source region 243, through the channel in the channel region 252, through the drift region 241, through the field implant region 242, through the drain contact region 240, and to the drain electrode 251. Current may also flow in the opposite direction from the drain electrode to the source electrode.

The structure of FIG. 22 therefore uses a field implant region 242 disposed underneath field oxide portion 232 as a lightly doped drain region. Lightly doped field implant region 242 may be formed when N type field implant region 238 is formed. N type field implant regions may, for example, be formed at the same time that the N type field implant regions are formed as shown in FIGS. 8A and 8B. Body region 239 may, for example, be formed at the same time that region 122 is formed as shown in FIGS. 12A and 12B. Regions 243 and 240 may, for example, be formed at the same time that the N type regions are formed as shown in FIGS. 13A and 13B and FIGS. 15A and 15B. Source contact region 244 may, for example, be formed at the same time that P+ regions are formed as shown in FIGS. 16A and 16B. Although the structure of FIG. 22 may be fabricated using the above-described BiCMOS process, other wafer fabrication processes may also be used to make the structure. An N channel lateral DMOS transistor is shown in FIG. 22, however, a P channel lateral DMOS transistor may also be realized by changing all N type regions to P type regions and visa versa.

Figure 23:
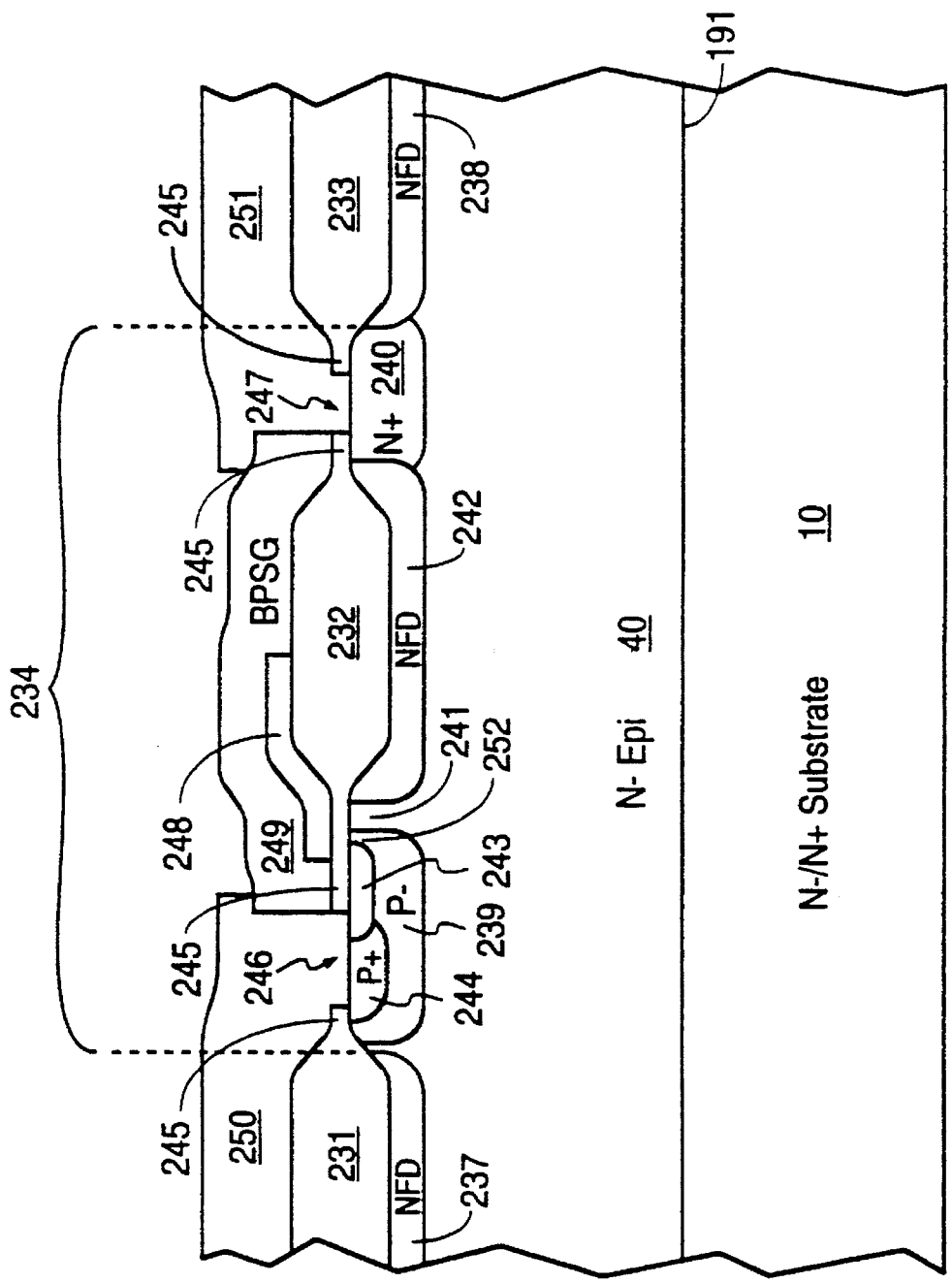
FIG. 23 is a cross-sectional view of one embodiment of a second lateral DMOS structure according to the present invention.

FIG. 23 is a cross-sectional view of a second embodiment of a lateral DMOS transistor structure. In the embodiment of FIG. 23, no P well region 230 is provided. An N type substrate layer is used rather than the P– type substrate shown in FIG. 22. As indicated in FIG. 23, this N type substrate may either be a relatively lightly N– doped substrate or a relatively heavily N+ doped substrate.

Figure 24:
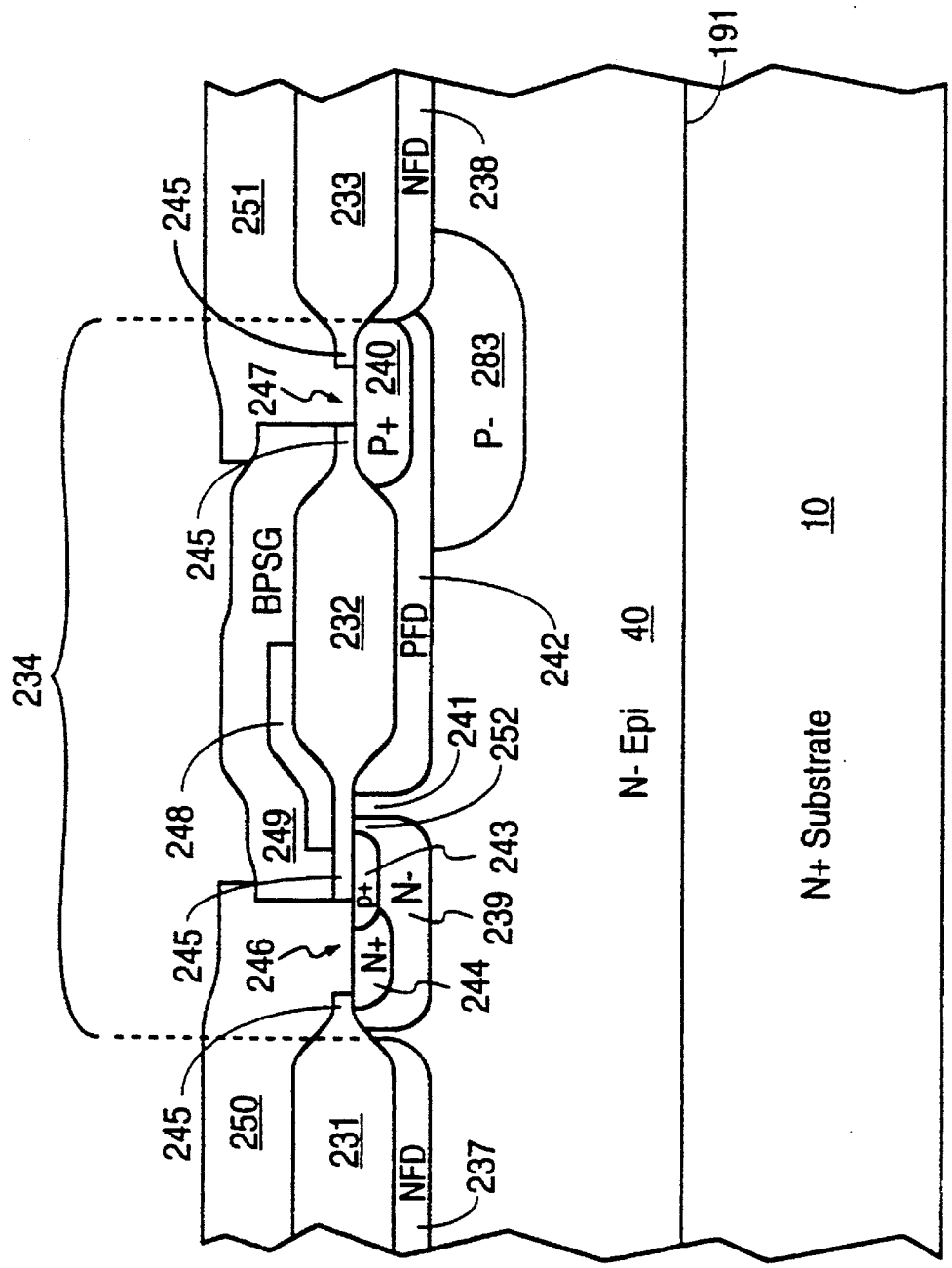
FIG. 24 is a cross-sectional view of one embodiment of a third lateral DMOS structure according to the present invention.

FIG. 24 is a cross-sectional view of a third embodiment of a lateral DMOS transistor structure. In the embodiment of FIG. 24, a P channel lateral DMOS transistor is shown. An N– type epitaxial layer is disposed over a N+ type substrate layer. The source contact region is of N+ type silicon, the source region is of P+ type silicon, the body region is of N– type silicon, the drift region is of the N– type silicon of the epitaxial layer, and lightly doped drain implant region 242 is a P type field implant. In the embodiment of FIG. 24, P+ drain contact region 240 does not extend downward so far that it exceeds the depth of the P type field implant 242. P+ drain contact region 240 does not contact the underlying N– type epitaxial layer 40. A P– region 283 may also be disposed underneath the P+ drain contact region 240 to extend from a bottom surface of the lightly doped P type field implant region 242 downward into the N– type epitaxial layer 40.

P– region may 283, for example, be formed at the same time that P well regions 51E, 51D and 51B are formed as shown in FIGS. 5A and 5B. P type lightly doped drain implant region 242 may, for example, be formed at the same time that other P type field implants are performed as shown in FIGS. 9A and 9B. N– body region 239 may, for example, be formed at the same time that region 103 is formed as shown in FIG. 10A and 10B. N+ source contact region 244 may, for example, be formed at the same time that the N+ implant step is performed as shown in FIGS. 15A and 15B. P+ source region 243 and P+ drain contact region 240 may, for example, be formed at the same time that P+ implantation is performed at shown in FIGS. 16A and 16B. Although a P channel lateral DMOS transistor is shown in FIG. 24, an N channel lateral DMOS transistor may also be realized by changing all P type regions to N type regions and visa versa. Although the above-described structures may be fabricated using the above-described BiCMOS process, other wafer fabrication processes may also be used to make these structures.

Figure 25:
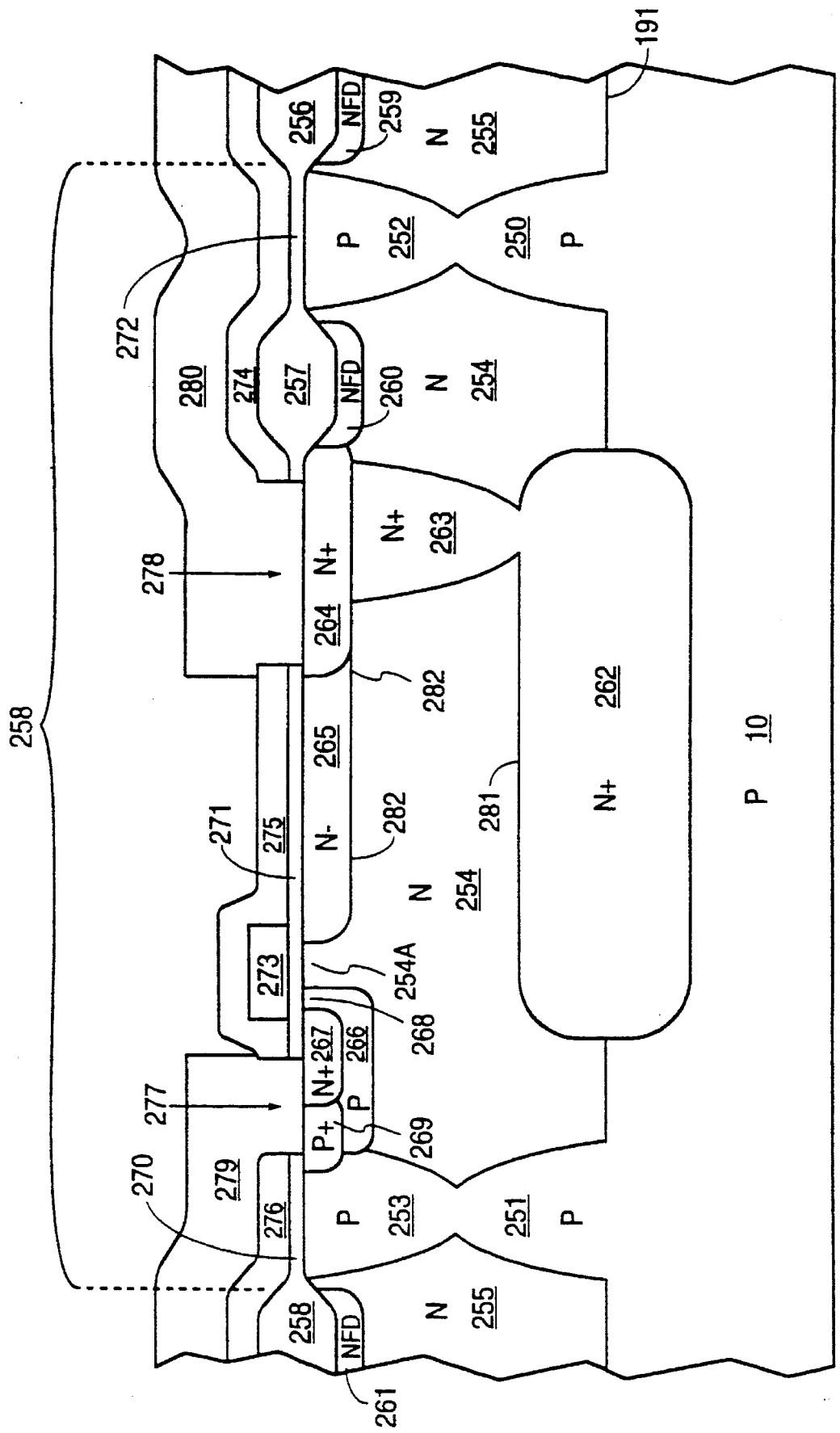
FIG. 25 is a cross-sectional view of one embodiment of a fourth lateral DMOS structure according to the present invention.

FIG. 25 is a cross-sectional view of one embodiment of a lateral DMOS transistor structure. An epitaxial layer, here an N– epitaxial layer, is disposed over a substrate layer 10. A P type buried layer 250 and 251 extend upwardly from the substrate layer/epitaxial layer boundary 191. A P type isolation sinker region 252 and 253 extends downward from the upper surface of the epitaxial layer to contact the P buried layer 250 and 251 so that the combined isolation sinker/P type buried layer structure extends around an isolated region 254 of the epitaxial layer from other portions 255 of the epitaxial layer. A field oxide layer 256, 257 and 258 is disposed over the upper surface of the epitaxial layer. In FIG. 25, the field oxide layer forms two portions: portion 256 and 258 which extends around the outer boundary of P sinker region 252 and 253 to define an active area 258, and portion 257 disposed within the active area 258. An N type field implant region 259 and 261 is disposed underneath the field oxide portion 256 and 258 where the field oxide portion 256 and 258 overlies N silicon of the epitaxial layer. Similarly, an N type field implant region 260 is disposed underneath the field oxide portion 257 where the field oxide portion 257 overlies N type silicon of the isolated region 254 in the active area.

An N+ type buried layer 262 similar to buried layer region 21C and an N+ sinker region 263 similar to sinker region 61C are disposed in isolated region 254. An N+ drain contact region 264 is disposed into the upper surface of the isolated region 254 over the N+ sinker region 263 and a lightly doped drain region 265 is also disposed into the upper surface of the isolated region 254, the lightly doped drain region being disposed between a drift region 254A and the drain contact region 264. A P type silicon body region 266 is disposed in the isolated region 254 so that it extends downward from the upper surface of the isolated region 254 into the isolated region 254. An N+ source region 267 extends from the upper surface of P body region 266 downward into P body region 266 so that a channel region 268 of the P body region 266 separates the source region 267 from the drift region 254A. A body contact region 269 is also disposed at least partly within the P body region 266 so that body contact region 269 extends downward into the body region 266 from the upper surface of the body region 266 and so that P+ body contact region 269 contacts the N+ source region 267. In the embodiment shown in FIG. 25, P+ body contact region 269 extends from P body region 269 and into P sinker region 253. Similarly, P body region 266 contacts P sinker region 253.

A thin gate oxide layer, comprised of portions 270 and 272 and portion 271, is disposed over the upper surface of the epitaxial layer in the active area 258. Gate oxide portion 270 and 272 is disposed over the upper surface of P sinker region 252 and 253. Portion 271 extends from a location over N+ source region 267, over channel region 268 of P body region 266, over drift region 254A, over lightly doped drain region 265, and over a part of drain contact region 264. A polysilicon gate layer 273 is disposed over the gate oxide portion 271 so that the polysilicon gate layer 273 extends from a location over N+ source region 267, over channel region 268, over drift region 254A, and to a location over N– lightly doped drain region 265. A first portion 274 and 276 of a thick insulating layer of an insulating material such as BPSG extends over field oxide portion 256 and 258, over the gate oxide over sinker region 252 and 253, and the over field oxide. A second portion 275 of the insulating material extends over the polysilicon gate layer 273 and over gate oxide portion 271. As a result, two openings 277 and 278 are formed in the gate oxide and thick oxide layers, opening 277 being formed over the P+ body contact region 269 and the N+ source region 267, opening 278 being formed over the N+ drain contact region 264.

A source electrode 279 which is made of a conductive material such as aluminum extends over thick insulating layer portion 276 to make contact with the P+ source contact region 269 and the N+ source region 267 through opening 277. Similarly, a drain electrode 280 of the conductive material extends over thick insulative layer portion 274 to make contact with the N+ drain contact region 264 through opening 278. A gate electrode may be connected to polysilicon gate layer 273 but such a gate electrode is not present in the plane shown in FIG. 25.

In operation, the lateral DMOS structure of FIG. 25 operates by controlling current flow between source region 267 and drain contact region 264. A voltage on the polysilicon gate layer 273 may cause a channel to form in the channel region 268 of the P body region 266. Current may then flow from source electrode 279, through N+ source region 267, through the channel in the channel region 268 of the P body region 266, through the drift region 254A, through the lightly doped drain region 265, through the N+ drain contact region 264, and to the drain electrode 280. Current may also flow in the opposite direction from the drain electrode 280 to the source electrode 279. The N+ buried layer 262, which extends so that an upper surface 281 of the N+ buried layer 262 extends substantially parallel to a bottom surface 282 of the lightly doped drain region 265 and the drain contact region 264 for a substantial lateral distance, serves to reduce the source to the drain resistance when the transistor is turned on and is conducting. In the structure of FIG. 25, P+ body contact region 269 serves to connect electrically the source region 267 to the substrate layer 10 via the sinker region 253 and the buried layer region 251. As a consequence, source electrode 279 and opening 277 may, in some embodiments, not be provided. In these embodiments, the voltage on the N+ source region is maintained substantially at the voltage of the substrate layer.

Figure 26:
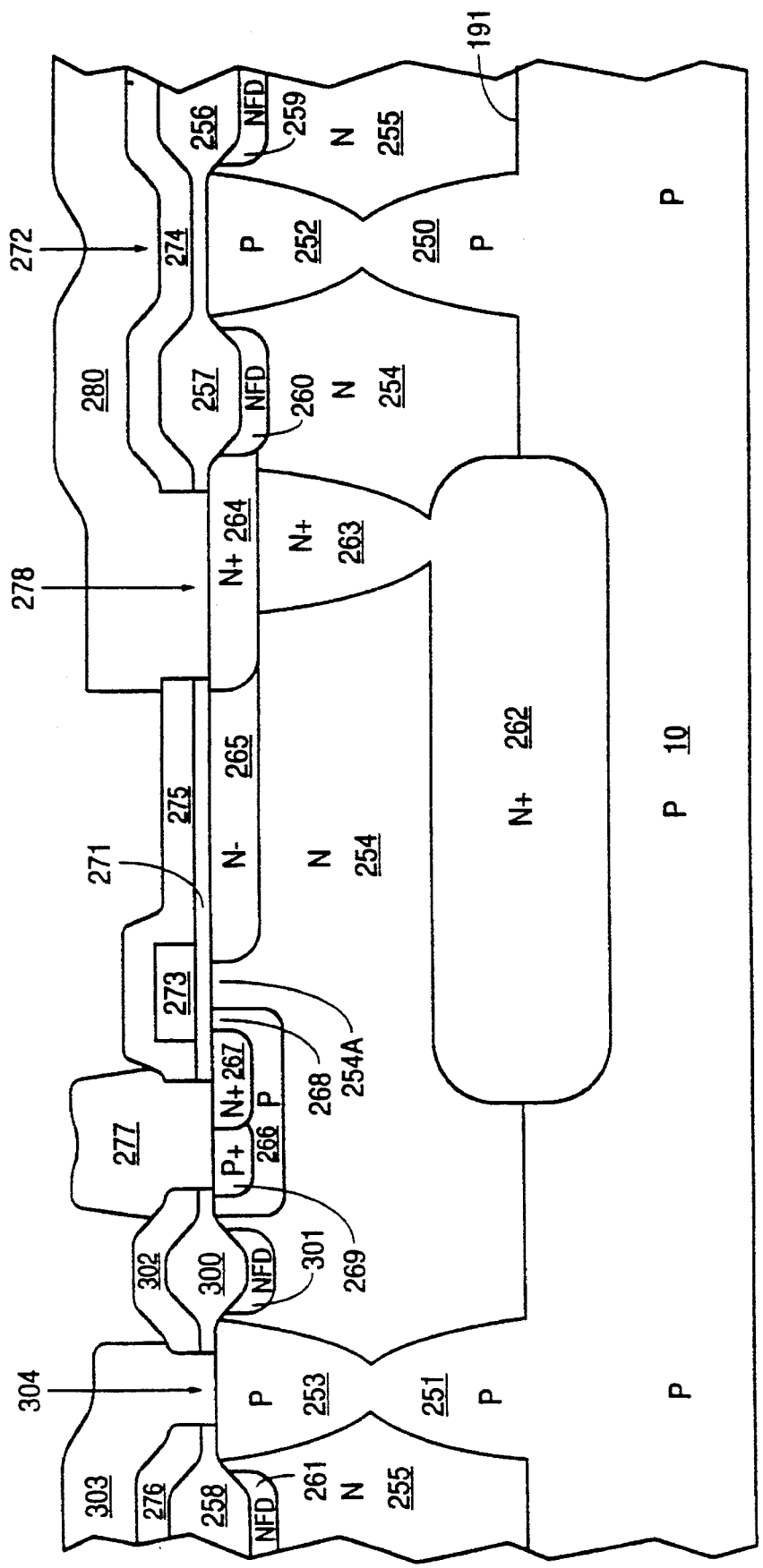
FIG. 26 is a cross-sectional view of one embodiment of a fifth lateral DMOS structure according to the present invention.

FIG. 26 is a cross-sectional view of a second embodiment of a lateral DMOS transistor structure. Although the structure of FIG. 26 is similar to the structure of FIG. 25, the P+ body contact region 269 does not extend out of P body region 266 and does not contact sinker region 253. P+ body contact region 269 does contact N+ source region 267, but P+ body contact region 269 is contained entirely within P body region 266. In some embodiments, a region 300 of a layer of field oxide is disposed on the upper surface of the isolated region 254 between the sinker region 253 and the P body region 266. An N type field implant region 301 may be disposed underneath the field oxide region 300 and a layer 302 of a thick insulating material such as BPSG may be disposed over the top of field oxide region 300. Source electrode 277 therefore is not connected to the P substrate 10 via the P+ body contact region 269, the sinker region 253, and the P buried layer 251. The substrate layer 10 and the source electrode 277 may therefore be maintained at different voltages. In some embodiments, electrical access may be provided to the sinker region 253. In these embodiments, a substrate electrode 303 may extend over BPSG layer 276 and make contact with the upper surface of the sinker region 253 through opening 304 in the gate oxide layer and the BPSG layer between field oxide portion 258 and field oxide portion 300.

The structures of FIGS. 25 and 26 may, for example, be fabricated with the above described BiCDMOS process. Sinker region 252 and 253 may, for example, be formed at the same time that well region 51B is formed as shown in FIGS. 5A and 5B; P buried layer region 250 and 251 may, for example, be formed at the same time that region 44B is formed as shown in FIGS. 4A and 4B; N+ buried layer 262 may, for example, be formed at the same time that region 21C is formed as shown in FIGS. 4A and 4B; N+ region 263 may, for example, be formed at the same time that region 61C is formed as shown in FIGS. 6A and 6B; field oxide layer 256, 257 and 258 may, for example, be formed at the same time that field oxide layer 100D/B, 100B and 100B/C are formed as shown in FIGS. 10A and 10B; N type field implant region 259, 260 and 261 may, for example, be implanted at the same time that the N type field regions are formed as shown in FIGS. 8A and 8B; polysilicon gate layer 273 may, for example, be formed at the same time that polysilicon layer 100A is formed as shown in FIGS. 11A and 11B; P body region 266 may, for example, be formed at the same time that region 122 is formed as shown in FIGS. 12A and 12B; N-lightly doped drain region 265, may for example, be formed at the same time that region 154 is formed as shown in FIGS. 13A and 13B; N+ regions 264 and 267 may, for example, be formed at the same time that region 155 is formed as shown in FIG. 14A and 14B; and P+ body contact region 269 may, for example, be formed at same time that region 162 is formed in FIGS. 16A and 16B. Although N channel lateral DMOS transistor structures are shown in FIGS. 25 and 26, P channel lateral DMOS transistors structures may also be made by changing P type structures to N type and visa versa.

Additional structures which may be formed using the general methods previously described are shown with respect to FIGS. 27–35.

Figure 27:
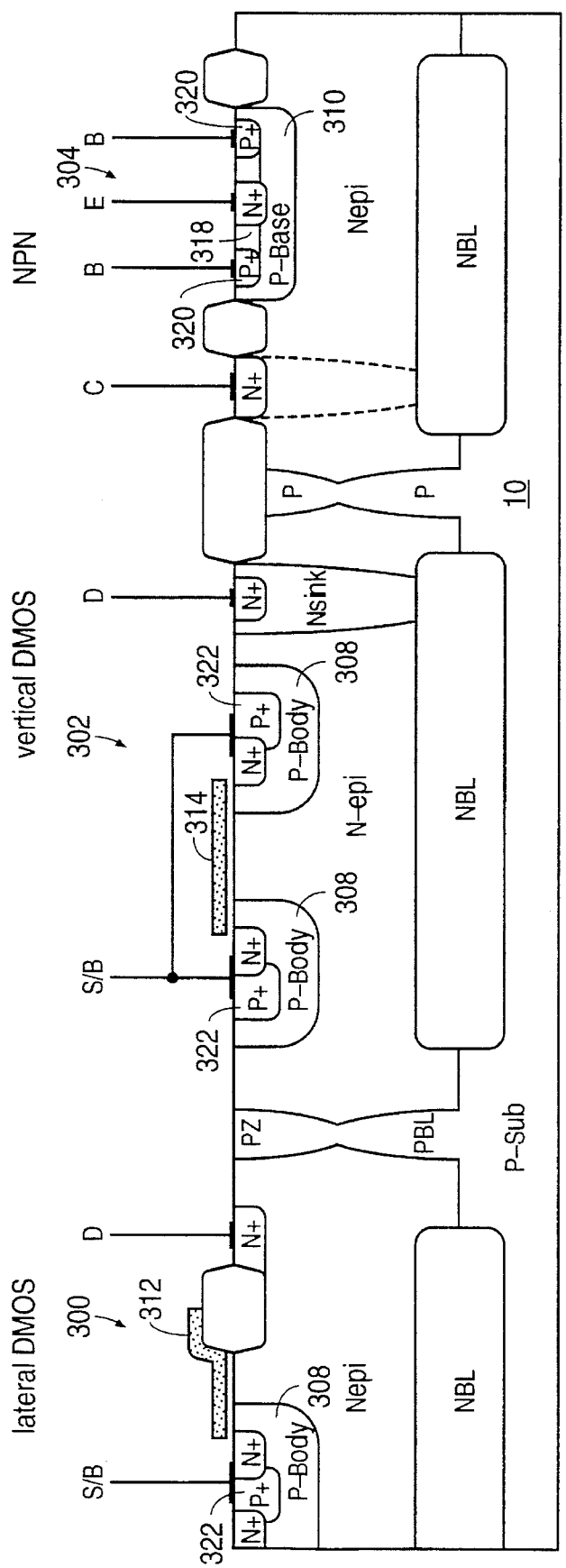
FIG. 27 is a cross-sectional view of a wafer illustrating the formation of a body for a DMOS transistor and a base for a bipolar transistor with the body and base formed independent of one another.

FIG. 27 is a cross-section of a portion of a wafer illustrating the construction of a lateral DMOS transistor 300, a vertical DMOS transistor 302 and a vertical NPN transistor 304. The structure of FIG. 27 is intended to illustrate the differences between the P-body 308 implant for the DMOS transistors 300 and 302 and the P-base 310 implant for the NPN transistor 304. In the preferred embodiment of FIG. 27, the P-body 308 implant is self-aligned with gates 312 and 314. To form P-body 308, boron ions are implanted with an implant energy of about 60 KeV and with a dosage of 0.5–1.5 E14 cm², as previously described.

After these boron dopants are diffused to form P-body 308 having the desired physical and electrical characteristics, a masking and doping process, similar to that previously described with respect to FIG. 14B, is then used to expose and dope a surface portion of epitaxial layer 42 to form P-base 310. For a high frequency NPN transistor (e.g., between 100 MHz and 3 GHz), the P-base 310 should be shallower and less resistive than P-body 308. The junction depth of P-body 308, in one embodiment, is approximately 1.5–2 microns. To form the P-base 310, a first implant of boron at an energy of approximately 100–150 KeV and with a dosage of 5–9E12 cm² is conducted. A second boron implant provides the surface doping of the P-base 310. In this second implant, boron is implanted at an energy of approximately 40 KeV and with a dosage of 0.5–5E14 cm². The resulting surface doping is shown as P+ base 318.

In the preferred embodiment, the implant parameters and thermal diffusion cycling for P-body 308 are incompatible with those of the two implants for the P-base 310. By having a two-step process for forming the P-base 310/318 following (and virtually independent of) the process for forming the P-body 308, one can integrate both a high performance NPN and a DMOS transistor 300/302 having a low threshold voltage all in one process.

P+ base contact region 320 and P+ body contact region 322 are later formed, as described with respect to FIGS. 16A and 16B, at an implant energy of, for example, 60 KeV with a dose of approximately 3E15 cm² to provide the desired ohmic contact between an aluminum metal layer and the P-base 310 and body 308.

The formation of the various oxide regions, source regions, drain regions, emitters, collectors, sinkers, buried layers, and gates shown in FIG. 27 may be formed using the associated processes previously described. The high frequency NPN transistor 304 and the robust high speed DMOS transistors 300/302 are suitable for use in switching power supplies, where the low on-resistance DMOS transistor is suitable for use as a power switch while the NPN transistor 304 is suitable for use in a comparator and error amplifier. In a high performance switching power supply, the unity gain frequency of the NPN transistor 304 may be on the order of 3 GHz by selection of the proper P-base 310 characteristics.

The same concepts as described with respect to FIG. 27 may also be used to form a P-channel DMOS transistor (having an N-body) and a PNP vertical transistor in the same substrate, where the N-body and N-base are independently optimized to achieve the desired performance of the respective transistors.

Figure 28:
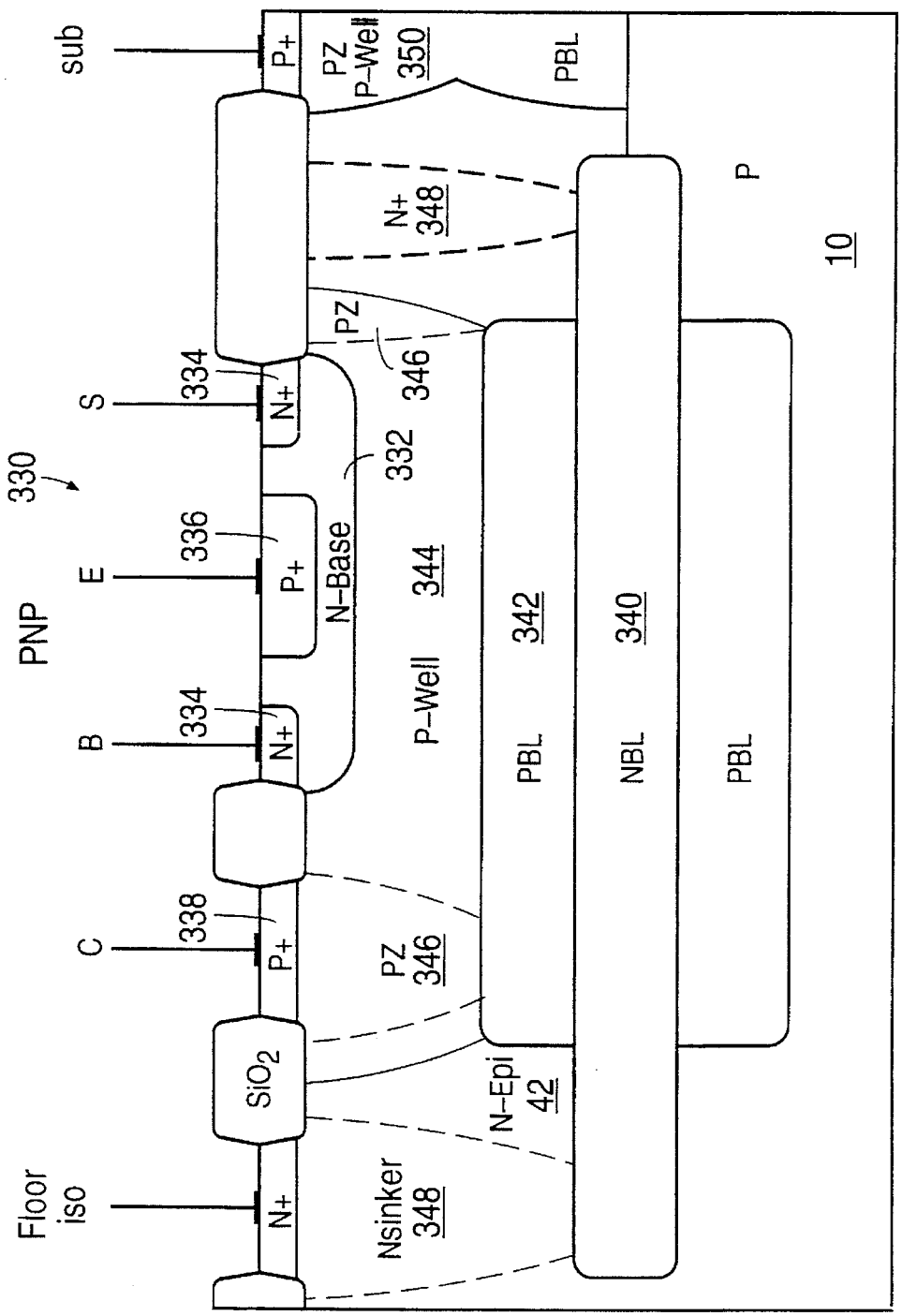
FIG. 28 is a cross-sectional view of a wafer illustrating an improved isolation structure for greatly reducing parasitic bipolar transistor action.

FIG. 28 is a cross-section of a wafer portion incorporating a vertical PNP transistor 330 for illustrating a novel isolation technique which greatly reduces any parasitic bipolar transistor action. The N-base 332, N+ base contact 334, P+ emitter 336, P+ collector 338, N buried layer 340, P buried layer 342, and P-well 344 may be formed using those techniques previously described with respect to FIGS. 16B, 19, and 21. In the embodiment of FIG. 28, highly doped sinkers 346 are formed extending down to the P buried layer 342 to greatly lower the gain of the parasitic NPN transistor (having P-well 344 as a base) and reduce the collector resistance. P+ sinkers 346 surround the PNP transistor 330. The steps used to form P+ sinkers 346 may also be used to form zener diodes elsewhere on the wafer. Due to the large required diffusion time, these P+ sinkers 346 should be formed relatively early in the wafer fabrication process, such as prior to or immediately after the N doping implants of FIGS. 6A and 6B.

To additionally reduce any effects of the parasitic PNP transistor (having N-epi 42 as a base), N+ sinkers 348 are formed extending down from the surface of the wafer to the N buried layer 340. Such N+ sinkers 348 may be formed using processes previously described with respect to FIGS. 6A and 6B. The N+ sinker 348 surround the P-well 344. The N-sinker 348 also aids in the removal of electrons injected into the P-well 344 if the transistor is operated in saturation. This increases the switching speed of PNP transistor 330. N-sinker 348 also helps to suppress the parasitic PNP transistor action when electrons are injected into P-well 344 and into N-epi 42 if that junction were ever to become forward biased.

An isolated N-epi tub is obtained by extending P+ sinkers 350 from the surface of the wafer down to the P-type substrate 10 to surround the PNP transistor 330.

The PNP transistor 330 structure of FIG. 28 may also be formed as an NPN transistor by reversing the conductivities of the various regions.

The structure of FIG. 28 may be formed in the same wafer as the structures shown in FIGS. 16A–27. The PNP transistor 330 may be formed instead of the NPN transistor 304 in FIG. 27 or in conjunction with the NPN transistor 304 in FIG. 27.

In the preferred embodiment of FIG. 28, the N-base 332 is formed prior to the formation of any P-body 308 (FIG. 27) or any P-base 310 (FIG. 27), since a narrow N-type base can be formed using slow-diffusing arsenic or antimony dopants even when subjected to the diffusion steps used to form P-body 308 and P-base 310.

Figure 29A:
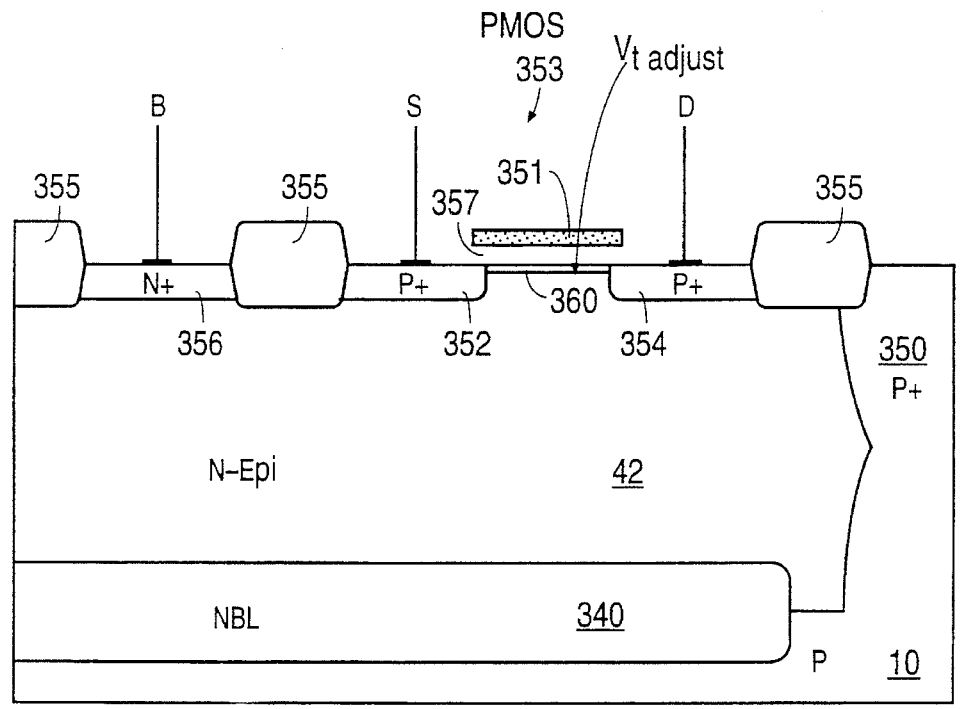
FIGS. 29A, 29B, and 29C are cross-sectional views of a wafer illustrating a structure and method for adjusting a threshold voltage of a MOSFET which may be conducted relatively late in a wafer fabrication process.
Figure 29B:
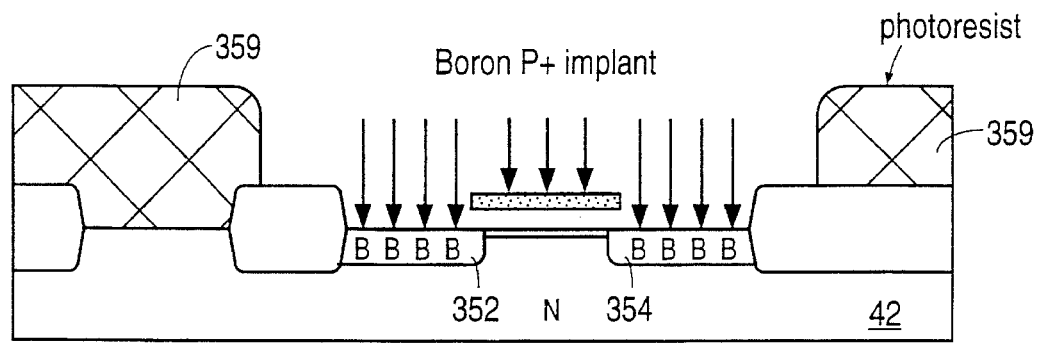
Figure 29C:
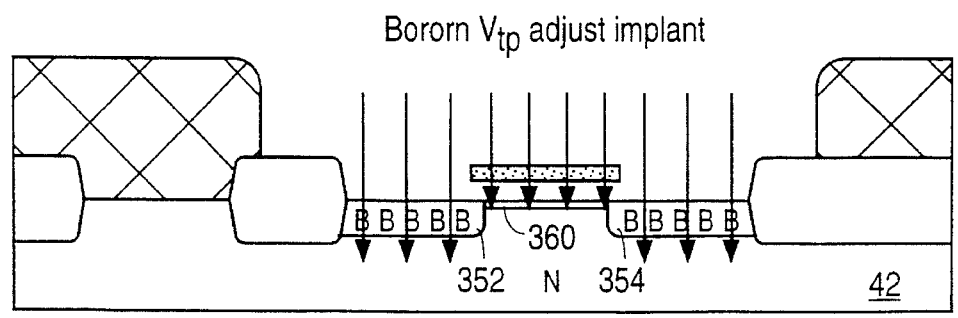

FIGS. 29A, 29B, and 29C show a cross-section of a portion of a wafer illustrating a method for adjusting the threshold voltage of a PMOS transistor 353 without this threshold voltage being affected by the various heating/diffusion steps used to form doped based and body regions on the same wafer. It is conventional to adjust the threshold voltage of a MOSFET by implanting dopants into the channel region prior to the formation of a gate. However, those dopants become diffused during subsequent drive-in steps used to form base regions, body regions, or any other regions doped after the formation of gates. Thus, in conventional threshold adjustment methods, the ultimate threshold adjustment is difficult to control.

In FIG. 29A, a polysilicon gate 351 is formed over a layer of gate oxide 357 using conventional techniques. Field oxide portions 355 are then grown using conventional techniques. As shown in FIG. 29B, a photoresist layer 360 is patterned to expose gate 351 and the area surrounding gate 351. Boron ions are then implanted using conventional techniques to form highly doped, self-aligned source 352 and drain 354. The boron may be implanted, for example, at an energy of between 20–60 KeV and with a dose of approximately 3E15 $cm^2$. The implant energy is low enough so that the boron does not penetrate the polysilicon gate 351. This boron implant to form shallow source 352 and drain 354 is, in the preferred embodiment, conducted after any implant and diffusion steps used to form any body or base regions for DMOS and bipolar transistors.

Preferably, immediately before or immediately after this boron doping step, a high energy implant performed at an energy of approximately between 80–200 KeV (depending upon the thickness of the gate oxide and gate) is conducted such that the desired dose of boron ions implants into the surface portion of the channel region 360 in FIGS. 29A and 29C. FIG. 29C shows this high-energy implant process. The dosage in this step should only be on the order of a few E12 $cm^2$ in order to produce a desired threshold shift for lowering the threshold of the PMOS transistor 353. Even though the high energy implant may implant boron ions through the source 352 and drain 354, the low dosage does not significantly affect the electrical characteristics of the source 352 or drain 353.

Since this high-energy implant can be conducted anytime after the formation of gate 351, dopant drive-in steps to form self-aligned body regions or base regions can be conducted prior to this high energy implant. Hence, these prior drive-in steps do not affect the threshold adjustment of the PMOS transistor 353.

This high-energy implant should use such a low dosage that no additional masking steps need be used to mask any P or N type regions of other transistors from the boron implant. Preferably, this low-dosage boron implant does not significantly affect the characteristics of these other regions. Thus, this threshold adjustment step may be formed without any additional masking steps and may be formed without adversely affecting the characteristics of any DMOS, PNP or NPN transistors formed in the same wafer as the PMOS transistor 353. No special diffusion step is required for diffusing the ions implanted under the gate 351, since any subsequent heating steps used to complete fabrication of the wafer will cause sufficient diffusion of the ions under gate 351.

The N+ body contact 356, N buried layer 340, and P+ sinker 350 are formed as previously described. This threshold adjustment method can also be used to adjust the threshold of an NMOS transistor by implanting arsenic or antimony ions through a gate.

Figure 30A:
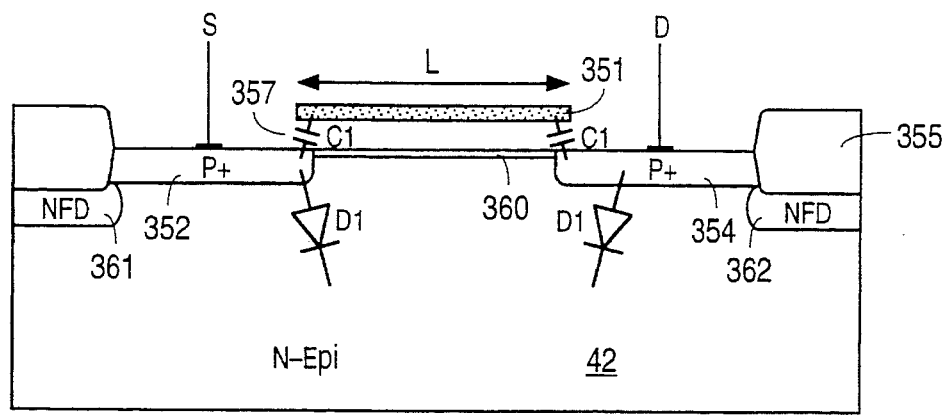
FIG. 30A is a cross-sectional view of a MOSFET illustrating how gate length may be adjusted to obtain a desired breakdown voltage of the MOSFET.
Figure 30B:
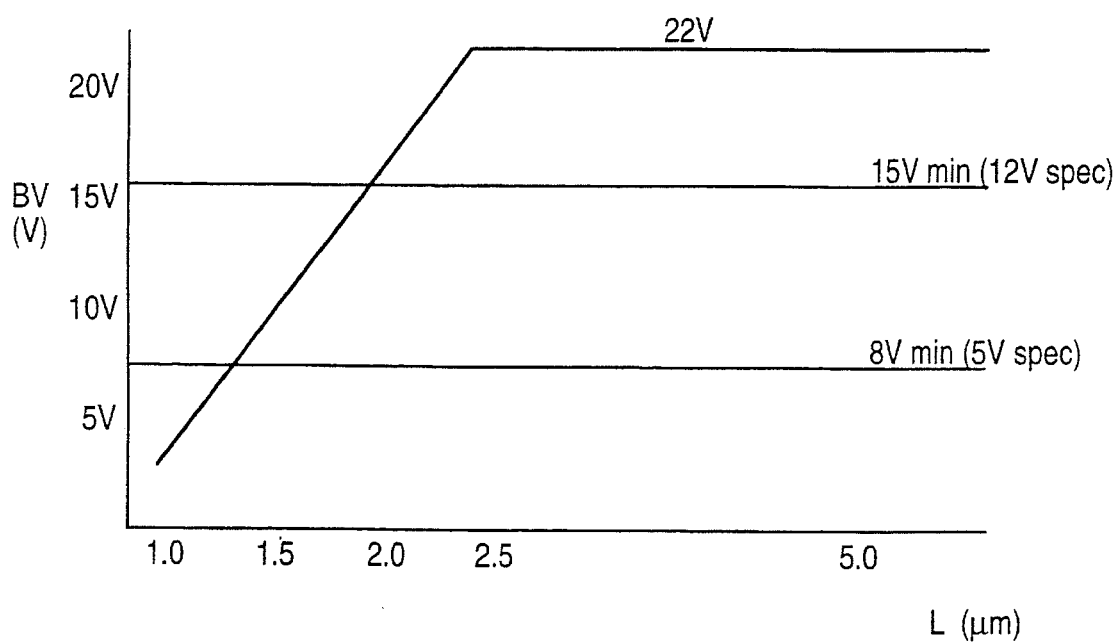
FIG. 30B is a graph illustrating channel length versus breakdown voltage, assuming a typical epitaxial layer dopant concentration.

FIGS. 30A and 30B illustrate a method and structure which allows the fabrication of a high performance 5 volt PMOS transistor and a high performance 12–15 volt PMOS transistor with a minimum differentiation between these two devices. The elements in FIG. 30A identified using the same numerals as those elements in FIG. 29A may be formed using the methods previously described. N field doped regions 361 and 362 are formed using the process described with respect to FIGS. 8A and 8B. The channel length L must be sufficient to separate the source 352 and drain 354 such that there is no breakdown of the device when operated at the intended operating voltage of, for example, 5–8 volts or 12–15 volts.

FIG. 30B is a graph showing the correspondence between gate length L and breakdown voltage, asusming a typical doping of N-epi 42. At around 2.5 microns, the graph shows that there is no significant channel length dependence on the breakdown voltage. The breakdown voltage is assumed to not be limited by the breakdown of diode D1 formed between the source 352 and N-epi 42 or between drain 354 and N-epi 42. Also, the gate oxide formed between the gate 351 and N-epi 42 is assumed to be thick enough (e.g., 400 Angstroms) to support the operating voltage.

In conventional devices, the gate length L is made a minimum necessary to the operating voltage to support to provide a low threshold and low on-resistance PMOS or NMOS transistor. By making the gate length L the minimum necessary, the product yield is reduced due to process variations which cause the breakdown voltage of the MOSFETs to sometimes be below the minimum required. However, using the technique shown with respect to FIGS. 29A–29C, the threshold voltage (and, indirectly, the on-resistance) of the PMOS transistor shown in FIG. 30A may be made independent of the gate length L. Hence, the channel length of the PMOS transistor can be made on the order of approximately 2.5 microns to ensure a 15 volt (min.) breakdown voltage without concern over typical process variations, while also achieving any desired threshold voltage (and lowering of on-resistance) using the method shown in FIGS. 29A–29C.

For a 5 volt PMOS device, the preferred embodiment channel length is approximately 2 microns. This channel length provides a large margin for manufacturing variations and is independent of the resulting threshold voltage of the PMOS transistor due to the high-energy boron implant. In one embodiment, the threshold voltage of the 2.0 micron and 2.5 micron transistors is approximately 0.8 volts.

In the preferred embodiment, the threshold adjustment implant shown in FIG. 29C is the same for both the 5 volt and 12 volt PMOS devices and, although both devices have the same threshold adjustment, the slightly narrower channel length for the 5 volt PMOS device improves its on-resistance by approximately 30 to 40 percent compared with the on-resistance of the 12 volt device. This method for achieving greater breakdown voltages with little effect on a resulting threshold voltage or on-resistance replaces conventional techniques employing deeper junctions or a lightly doped drain extension to increase breakdown voltages. Thus, both a low threshold voltage 12 volt PMOS transistor and low threshold voltage 5 volt PMOS transistor may be formed using the same process steps.

Figure 31:
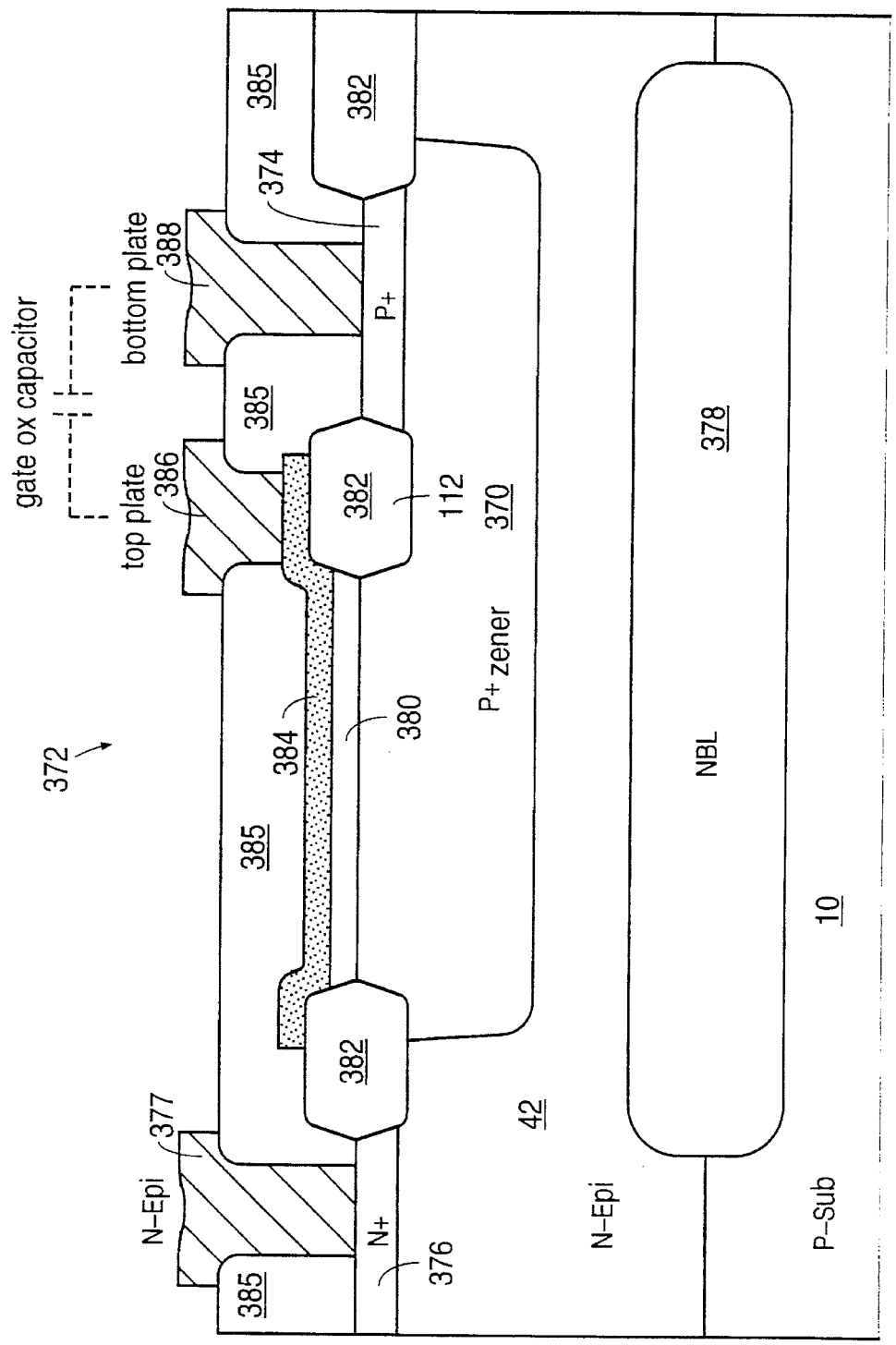
FIG. 31 is a cross-sectional view of a zener diode and a capacitor using a zener region as a bottom plate of the capacitor.

FIG. 31 is a cross-section of a portion of a wafer which includes a zener diode formed by the highly doped P+ zener region 370 and the N-epi 42. The structure of FIG. 31 also illustrates the P+ zener region 370 being used as the bottom plate of a capacitor 372. The P+ zener region 370 may be formed using the same steps used to form the P+ buried zener anode region 71F shown in FIG. 7A. The P+ zener region 370 is formed with a boron implant at an energy of approximately 80 KeV with a dose of approximately 0.5–3E15 $cm^2$. The boron ions are then driven in as previously described with respect to FIG. 7A to provide a zener PN junction breakdown voltage of approximately 6–9 volts. A suitable P+ contact region 374 is then made to the P+ zener region 370 using, for example, the same implantation step used to form P-type emitter regions, such as emitter 168 in FIG. 16B. An N+ contact 376 is then formed to contact the N-epi 42, which in this case acts as a cathode for the zener diode. The N+ contact 376 may be formed during the same implantation step used to form N-type emitter regions, such as emitter 170 in FIG. 15B. Metal electrode 377 contacts N+ contact 376. The zener diode exhibits a desired reverse breakdown voltage which may be utilized in any well known manner.

The formation of the capacitor structure of FIG. 31 will now be described in greater detail. Capacitor 372 includes P-substrate 10, N buried layer 378, N-epi layer 42, deep P+ zener region 370, gate oxide 380, field oxide 382, conductive polysilicon layer 384, oxide layer 385, P+ contact region 374, top plate connector 386, and bottom plate connector 388. N buried layer 378 is created at the same time that buried layers 21A–21C are created (FIGS. 3A, 3B, 4A, 4B). The deep P+ zener implant described with respect to FIGS. 7A and 7B is used to form P+ zener region 370. The P+ implant described with respect to FIGS. 16A and 16B is used to form P+ contact region 374. P+ zener region 370 is used as a bottom plate of MOS capacitor 372. Polysilicon layer 384 (shown deposited and formed in FIGS. 11A–11B) forms the top plate of MOS capacitor 372. Polysilicon layer 384 is separated from deep P+ zener region 370 by gate oxide 380 formed during the epitaxial surface oxidation step described with respect to FIGS. 8A and 8B.

Because gate oxide 380 is formed on deep P+ zener region 370, enhanced oxidation (which normally occurs when oxide is grown on a heavily doped N region) does not occur. The oxide grown over a heavily doped N region is typically 60 percent thicker than the oxide grown over deep P+ zener region 370, given the same oxidation cycle. The slower oxidation of deep P+ zener region 370 results in a thinner gate oxide 380, and a thinner gate oxide 380 results in an increased capacitance of MOS capacitor 372, given a fixed capacitor area. In one embodiment, gate oxide 380 is approximately 400 Å thick between P+ zener region 370 and polysilicon layer 384.

A capacitor using even a moderately heavily doped silicon region as a plate has a high voltage coefficient due to the variation in the depth of any depletion region created in the diffused plate. Therefore, when using a lightly doped or moderately doped silicon layer as a plate of an MOS capacitor, the capacitance per unit area varies as the voltage applied to the capacitor varies. This characteristic makes such an MOS capacitor very difficult to use in an analog circuit.

Because the deep P+ zener region 370 is very heavily doped, the voltage coefficient of the capacitor 372 utilizing deep P+ zener region 370 as a bottom plate is very small. Therefore, the voltage applied to terminals 386 and 388 of MOS capacitor 372 is dropped almost entirely across the thickness of gate oxide 380. Therefore, MOS capacitor 372 has a high capacitance per unit area, and this capacitance is relatively insensitive to the voltage across capacitor 372.

The safe electric field which can be applied across gate oxide 380 is limited to approximately 4 megavolts per centimeter for silicon dioxide. Thus, when gate oxide 372 is silicon dioxide having a thickness of 400 Å, the resulting MOS capacitor 372 has a capacity of approximately 16 volts. Thus, the voltage rating of MOS capacitor 372 is the same as the voltage rating of the gate oxide of the MOSFETs fabricated in the same substrate as capacitor 372. These MOSFETs include those shown in FIGS. 16A and 16B. For these reasons, MOS capacitor 372 is a useful component in analog circuits incorporating other MOSFETs formed on the same substrate. MOS capacitor 372 can be used in charge pumps and other circuits that would be needed in power integrated circuits.

In the preferred embodiment, the P+ zener implant used to form zener region 370 is also used to more heavily dope the P+ sinker regions, such as sinkers 350 and 252 in FIGS. 29A, 25, and 26. This reduces any parasitic NPN action between two adjacent N-epi tubs.

FIGS. 32, 33, 34, and 35 relate to methods and structures for improving the breakdown voltage of an NPN or PNP transistor. This method of improving the breakdown voltage may be utilized without any additional process steps previously described with respect to FIGS. 1A–16B.

Figure 32:
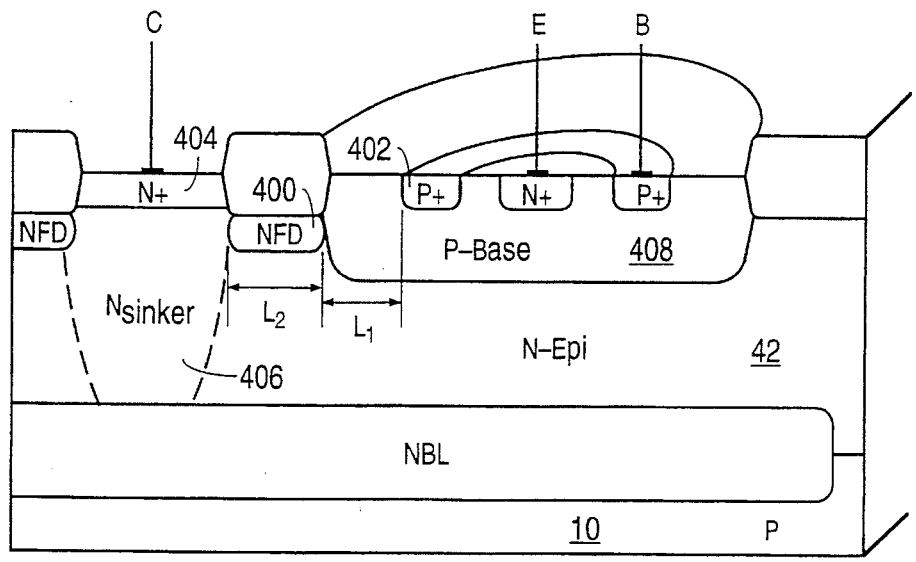
FIGS. 32 and 33 are cross-sectional views of NPN transistors illustrating the spacing of the base contact region from the collector to increase breakdown voltage.

Referring to FIG. 16B, the P+ base contact 169 of the NPN transistor is located relatively close to the N-type field dopant (formed as shown in FIG. 8B) under the field oxide 100B/C shown in FIG. 14B. This N-type field dopant is shown as region 400 in FIG. 32. The proximate location of the P+ base contact 169 to the N-type field dopant in FIG. 16B raises the electric field between these two regions and thus raises the likelihood of a breakdown occurring between these two regions. Hence, this tends to lower the $BV_{CES}$ (i.e. breakdown between collector to emitter with the base shorted to the emitter). The structure of FIG. 32 improves the previous structures by forming the annular P+ base contact 402 a greater distance $L_1$ from the N-type field dopant 400. This distance $L_1$ ensures that the breakdown voltage between the base contact 402 and the collector 404 (or any N sinker 406 connected to the collector) or between the base contact 402 and the field doping 400 is greater than a predetermined distance necessary to avoid breakdown at the operating voltage. In the structure of FIG. 32, the field doping 400 is made a length $L_2$ sufficient to allow depletion spreading between the P+ base contact 402 and the N sinker 406 or collector 404 without resulting in breakdown at the operating voltage. The combination of distances $L_1$ and $L_2$ results in a high voltage bipolar transistor with no adverse effects on operation.

Figure 33:
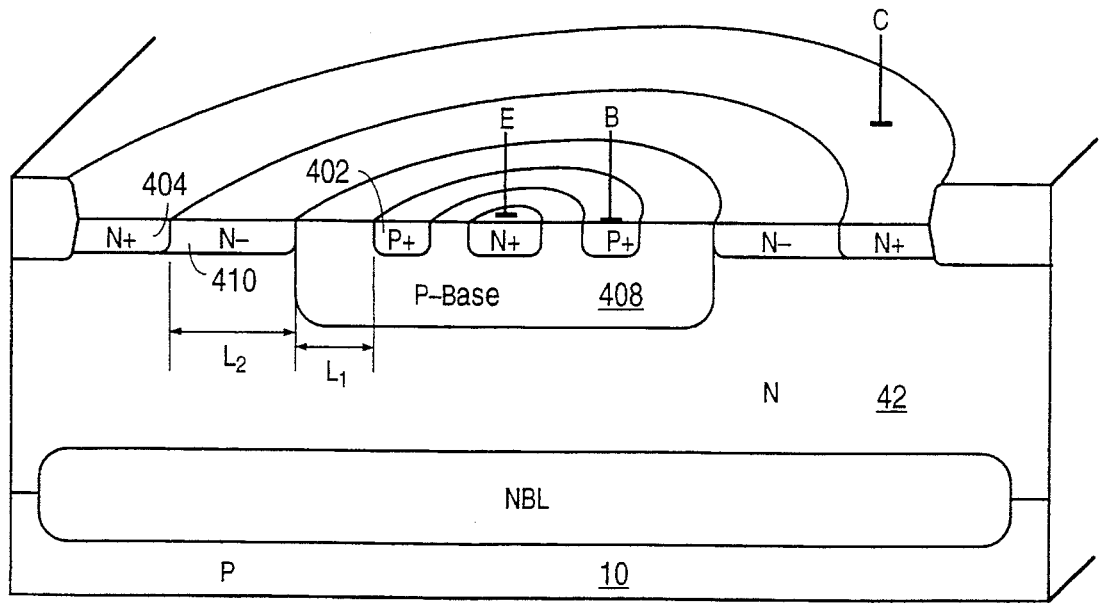

FIG. 33 shows a modification of FIG. 32 where the N field doping 400 is replaced by an N-drift region 410 (formed as shown in FIG. 13A). The N-drift implant may also be used to form the lightly doped drain in a high voltage NMOS transistor. One skilled in the art would understand how to form the drift region 410 in FIG. 33 by using the N-blanket implant shown in FIGS. 13A and 13B, previously described. In the devices of FIGS. 32 and 33, the length $L_2$ of the field dopant 400 or the N-drift region 410 may be varied to obtain the desired breakdown voltage without significantly affecting the operation of the NPN transistor. By providing a distance $L_1$ or $L_2$ of 1–2 microns, an increase in breakdown voltage of 16–20 volts or more may be obtained.

The structures of FIGS. 32 and 33 are completely compatible with the processes previously described with respect to FIGS. 1A–16B and may be formed without any additional masking or processing steps. Hence, these structures may be formed in conjunction with the various MOSFETs and bipolar transistors previously described.

Figure 34:
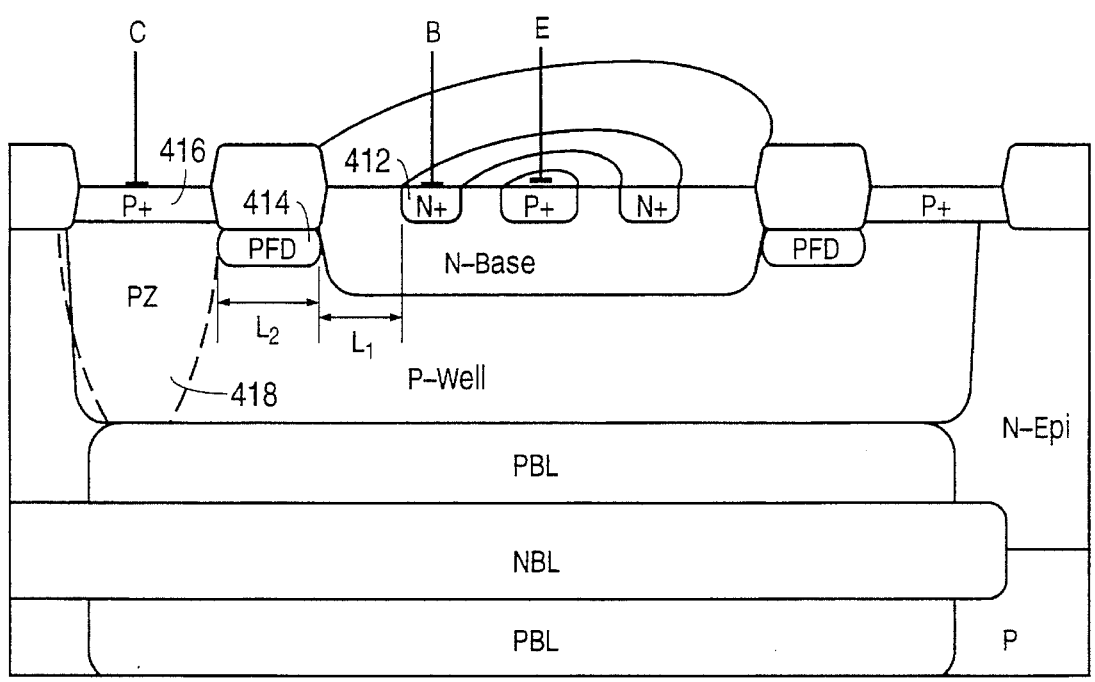
FIGS. 34 and 35 are cross-sectional views of PNP transistors illustrating the separation of the base contact region from the collector to increase the breakdown voltage.
Figure 35:
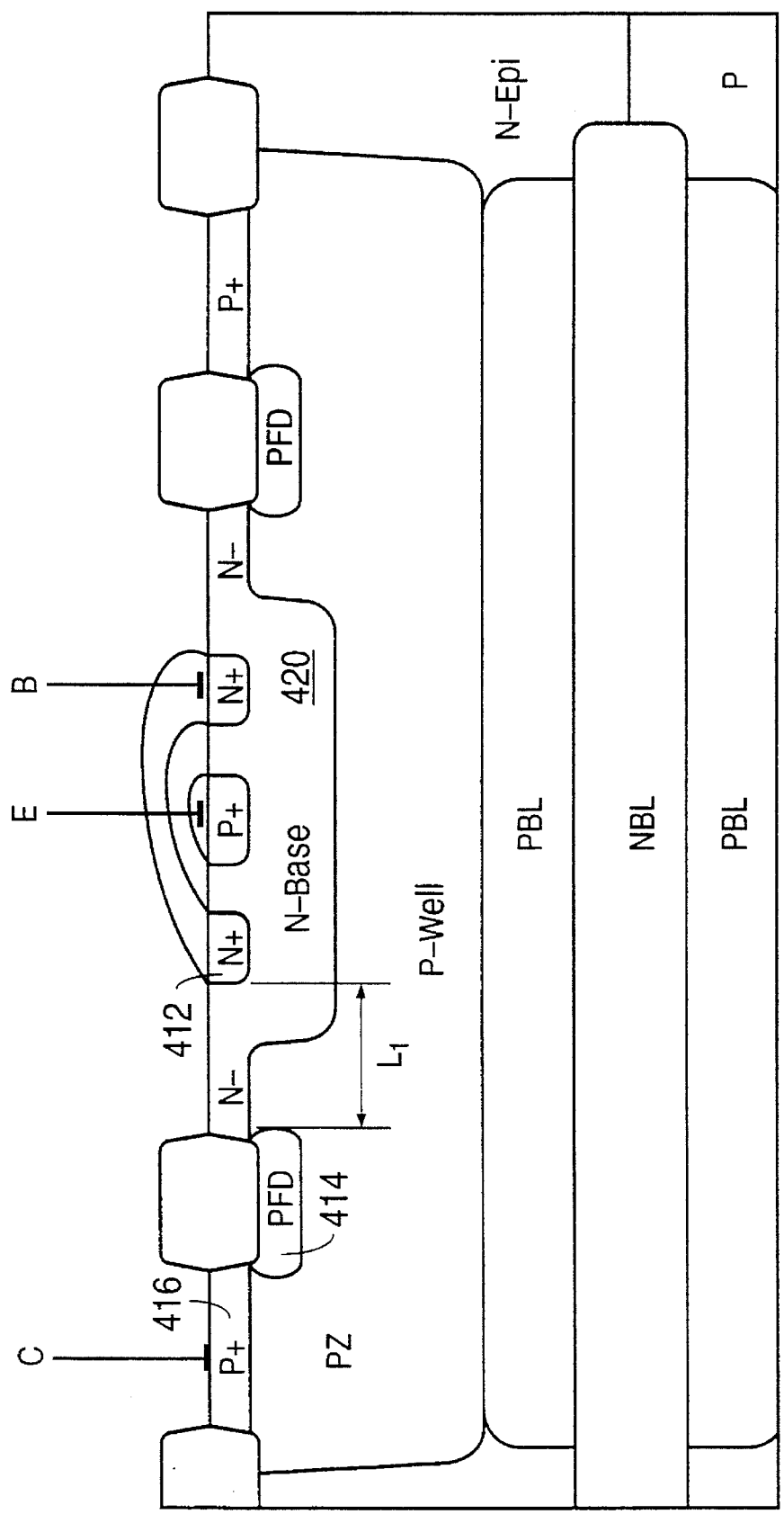

The PNP transistor structures of FIGS. 34 and 35 illustrate the same principles as described with respect to FIGS. 32 and 33, respectively. In FIG. 34, the N+ base contact 412 of the PNP transistor is spaced a selected distance $L_1$ away from the P field doping 414 (formed in the steps shown with respect to FIGS. 9A and 9B) to increase the breakdown voltage. The distance $L_2$ is selected to provide a desired breakdown voltage between the N+ base contact 412 and the P+ collector 416 or the P+ sinker 418.

In FIG. 35, the N– drift implant discussed with respect to N– drift region 410 may also be used to extend the N-base 420 of the PNP transistor so as to further separate the N+ base region 412 from the collector 416 and field doping 414 for enhanced breakdown voltage. The structures of FIGS. 34 and 35 may be formed along with any of the other structures described with respect to FIGS. 1A–16B and the remaining structures described in the specification. By utilizing the structures of FIGS. 32–35 to increase the breakdown voltages of the devices, the devices which previously had a 16 volt breakdown rating may now be increased to over a 20 volt breakdown rating without any significant detriment in the performance characteristic of the devices.

It is to be noted that the P field doping 414 is more heavily doped than the N field doping 400 shown in FIG. 32. Accordingly, there is little voltage drop absorbed by the P field doping 414 in the device of FIGS. 33 and 35.

The breakdown voltages of the transistors of FIGS. 33 and 35 may easily be made equal to the breakdown voltage of the 16 volt NMOS transistor shown in Section E in FIG. 16A since all these devices use the same N– drift implant, which could be made the same length. For example, the N– drift regions for the various transistors may have a length of 2–3 microns to achieve a breakdown voltage well in excess of 12 volts.

While our invention has been described with respect to the embodiments of the BiCDMOS process and various structures set forth above, our invention is not to be considered limited thereto. The above-described N type silicon regions may be converted to P type silicon regions and visa versa. Furthermore, no particular fabrication processing equipment type is critical in the practice of the above processes or in the fabrication of the disclosed structures. The ranges given for the various process parameters are illustrative. Various ones of the processing steps may be omitted or combined with other semiconductor processing steps without departing from the spirit and scope of this invention. Accordingly, other embodiments, variations and improvements not described in the specification but encompassed by the appended claims are to be considered within the scope of the invention.

We claim:

1. A method for forming an MOS transistor in conjunction with transistors of a different type in the same substrate comprising the steps of:

forming a gate of said MOS transistor overlying and isolated from a channel region of a semiconductor material of a first conductivity type;

forming a source region of a second conductivity type;

lowering a threshold voltage of said MOS transistor by implanting dopants of said second conductivity type into said channel region in said semiconductor material at an implant energy such that said dopants of said second conductivity type penetrate said gate to implant into said channel region underlying said gate, said dopants being sufficient to lower a threshold voltage of said MOS transistor to achieve a desired threshold so that said MOS transistor is capable of being selectively controlled to change between a conductive state and a nonconductive state, said step of lowering a threshold voltage of said MOS transistor occurring after a diffusion step for forming a diffused body or base region of another transistor in said same substrate to prevent said dopants of said second conductivity in said channel region from being subjected to said diffusion step, wherein said step of forming said source region comprises patterning a photoresist masking layer overlying said semiconductor material and depositing dopants of said second conductivity type into exposed portions of said semiconductor material, and wherein said step of lowering a threshold voltage is conducted while said photoresist masking layer remains overlying said semiconductor material so that said step of lowering said threshold voltage does not require another masking step.

2. The method of claim 1 wherein said photoresist masking layer and said step of depositing dopants of said second conductivity type are used to form regions of said second conductivity type in devices other than said MOS transistor, such that said step of lowering said threshold voltage also implants dopants of said second conductivity type into exposed regions of said second conductivity type in said devices other than said MOS transistor.

\* \* \* \* \*